(12) United States Patent
Purayath et al.

(10) Patent No.: US 8,383,479 B2
(45) Date of Patent: Feb. 26, 2013

(54) INTEGRATED NANOSTRUCTURE-BASED NON-VOLATILE MEMORY FABRICATION

(75) Inventors: Vinod Robert Purayath, Santa Clara, CA (US); James K. Kai, Santa Clara, CA (US); Masaaki Higashitani, Cupertino, CA (US); Takashi Orimoto, Sunnyvale, CA (US); George Matamis, San Jose, CA (US); Henry Chien, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 200 days.

(21) Appl. No.: 12/840,081

(22) Filed: Jul. 20, 2010

(65) Prior Publication Data

US 2011/0020992 A1    Jan. 27, 2011

Related U.S. Application Data

(60) Provisional application No. 61/227,403, filed on Jul. 21, 2009, provisional application No. 61/235,994, filed on Aug. 21, 2009.

(51) Int. Cl.
*H01L 21/8247* (2006.01)

(52) U.S. Cl. . 438/258; 438/266; 438/594; 257/E21.691; 977/936

(58) Field of Classification Search .......... 438/962
See application file for complete search history.

(56) References Cited

U.S. PATENT DOCUMENTS

| | | |
|---|---|---|
| 5,714,766 A | 2/1998 | Chen et al. |
| 5,937,295 A | 8/1999 | Chen et al. |
| 6,586,785 B2 | 7/2003 | Flagan et al. |
| 6,645,444 B2 | 11/2003 | Goldstein |
| 6,646,302 B2 | 11/2003 | Kan et al. |
| 6,656,792 B2 | 12/2003 | Choi et al. |
| 6,723,606 B2 | 4/2004 | Flagan et al. |
| 6,859,397 B2 | 2/2005 | Lutze et al. |
| 6,913,984 B2 | 7/2005 | Kim et al. |
| 6,917,542 B2 | 7/2005 | Chen et al. |
| 6,927,136 B2 | 8/2005 | Lung et al. |

(Continued)

FOREIGN PATENT DOCUMENTS

| | | |
|---|---|---|
| CN | 101420012 A | 4/2009 |
| WO | WO2005/089165 A2 | 9/2005 |

(Continued)

OTHER PUBLICATIONS

K.W. Guarini, et al., "Low voltage, scalable nanocrystal FLASH memory fabricated by templated self assembly," IEEE Int. Electron Devices Meeting Tech. Digest, vol. 22, issue 2, pp. 1-4, Dec. 2003.

(Continued)

*Primary Examiner* — Stephen W Smoot
(74) *Attorney, Agent, or Firm* — Vierra Magens Marcus & DeNiro LLP

(57) ABSTRACT

Nanostructure-based charge storage regions are included in non-volatile memory devices and integrated with the fabrication of select gates and peripheral circuitry. One or more nanostructure coatings are applied over a substrate at a memory array area and a peripheral circuitry area. Various processes for removing the nanostructure coating from undesired areas of the substrate, such as target areas for select gates and peripheral transistors, are provided. One or more nanostructure coatings are formed using self-assembly based processes to selectively form nanostructures over active areas of the substrate in one example. Self-assembly permits the formation of discrete lines of nanostructures that are electrically isolated from one another without requiring patterning or etching of the nanostructure coating.

47 Claims, 46 Drawing Sheets

U.S. PATENT DOCUMENTS

| | | | |
|---|---|---|---|
| 6,991,984 B2 * | 1/2006 | Ingersoll et al. | 438/257 |
| 7,045,851 B2 | 5/2006 | Black et al. | |
| 7,091,089 B2 * | 8/2006 | Steimle | 438/258 |
| 7,092,287 B2 | 8/2006 | Beulens et al. | |
| 7,119,395 B2 | 10/2006 | Gutsche et al. | |
| 7,138,680 B2 | 11/2006 | Lee et al. | |
| 7,173,304 B2 | 2/2007 | Weimer et al. | |
| 7,183,159 B2 * | 2/2007 | Rao et al. | 438/258 |
| 7,259,984 B2 | 8/2007 | Kan et al. | |
| 7,267,875 B2 | 9/2007 | Whiteford et al. | |
| 7,382,017 B2 | 6/2008 | Duan et al. | |
| 7,501,315 B2 | 3/2009 | Heald et al. | |
| 7,582,529 B2 | 9/2009 | Matamis et al. | |
| 7,585,564 B2 | 9/2009 | Whiteford et al. | |
| 7,592,223 B2 | 9/2009 | Pham et al. | |
| 7,595,528 B2 | 9/2009 | Duan et al. | |
| 7,615,447 B2 | 11/2009 | Purayath et al. | |
| 7,723,186 B2 | 5/2010 | Purayath et al. | |
| 2004/0130941 A1 | 7/2004 | Kan et al. | |
| 2005/0112820 A1 | 5/2005 | Chen et al. | |
| 2005/0122775 A1 | 6/2005 | Koyanagi et al. | |
| 2005/0191808 A1 | 9/2005 | Steimle et al. | |
| 2005/0202615 A1 | 9/2005 | Duan et al. | |
| 2005/0258470 A1 | 11/2005 | Lojek et al. | |
| 2005/0287717 A1 | 12/2005 | Heald et al. | |
| 2006/0014329 A1 | 1/2006 | Park et al. | |
| 2006/0040103 A1 | 2/2006 | Whiteford et al. | |
| 2006/0284241 A1 | 12/2006 | Kim | |
| 2007/0029600 A1 | 2/2007 | Cohen | |
| 2007/0032091 A1 | 2/2007 | Heald et al. | |
| 2007/0034933 A1 | 2/2007 | Kim et al. | |
| 2007/0105316 A1 | 5/2007 | Jeng | |
| 2007/0218631 A1 * | 9/2007 | Prinz et al. | 438/258 |
| 2007/0224813 A1 | 9/2007 | Shen et al. | |
| 2007/0247904 A1 | 10/2007 | Duan et al. | |
| 2008/0026532 A1 | 1/2008 | Duan et al. | |
| 2008/0118755 A1 | 5/2008 | Whiteford et al. | |
| 2008/0150003 A1 | 6/2008 | Chen et al. | |
| 2008/0150004 A1 | 6/2008 | Chen et al. | |
| 2008/0150009 A1 | 6/2008 | Chen et al. | |
| 2008/0290394 A1 | 11/2008 | Duan et al. | |
| 2008/0308860 A1 | 12/2008 | Kang et al. | |
| 2009/0027944 A1 | 1/2009 | Ufert | |
| 2009/0065764 A1 | 3/2009 | Heald et al. | |
| 2009/0101965 A1 | 4/2009 | Chen et al. | |
| 2009/0212351 A1 | 8/2009 | Chen | |
| 2010/0051904 A1 | 3/2010 | Xiao et al. | |
| 2010/0155786 A1 | 6/2010 | Heald et al. | |

FOREIGN PATENT DOCUMENTS

| | | |
|---|---|---|
| WO | WO2005/122235 A2 | 12/2005 |
| WO | WO2005/123373 A2 | 12/2005 |
| WO | WO2006/112793 A1 | 10/2006 |
| WO | WO2007/024697 A2 | 3/2007 |
| WO | WO2008/013959 A2 | 1/2008 |
| WO | WO2008/079684 A2 | 7/2008 |
| WO | WO2008/147710 A1 | 12/2008 |

OTHER PUBLICATIONS

H. Komatsu, et al., "Applying Nanotechnology to Electronics-Recent Progress in Si-LSIs to Extend Nano-Scale," Science and Technology Trends—Quarterly Review, 10 pages, Jul. 2005.

IBM Research: Press Resources, "IBM demos new nanotechnology method to build chip components," 3 pages, Dec. 8, 2003.

U.S. Appl. No. 10/962,972, filed Oct. 12, 2004, entitled, "Nano-Enabled Memory Devices and Anisotropic Charge Carrying Arrays," 66 pages.

International Search Report and the Written Opinion of the International Searching Authority dated Sep. 22, 2010, Patent Cooperation Treaty, PCT Application No. PCT/US2010/042766, filed Jul. 21, 2010.

English Abstract of Chinese Publication No. CN101420012 published Apr. 29, 2009, entitled "Non-volatile Resistor Transition Type Memory Embedded into Nano-crystalline Granule", [www.esp@ce.net].

Response to the Written Opinion dated Sep. 17, 2012, European Patent Application No. 10738085.9.

* cited by examiner

FIG. 1
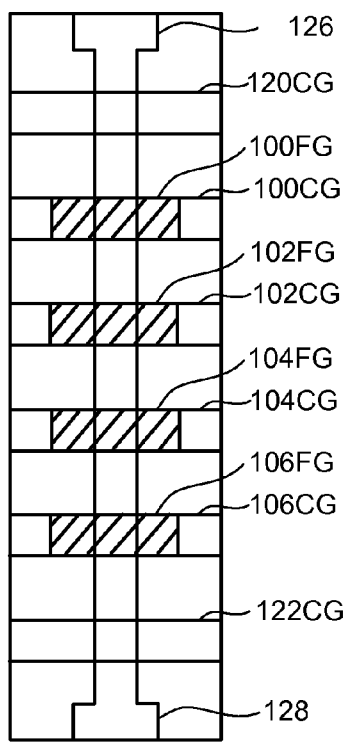
FIG. 2
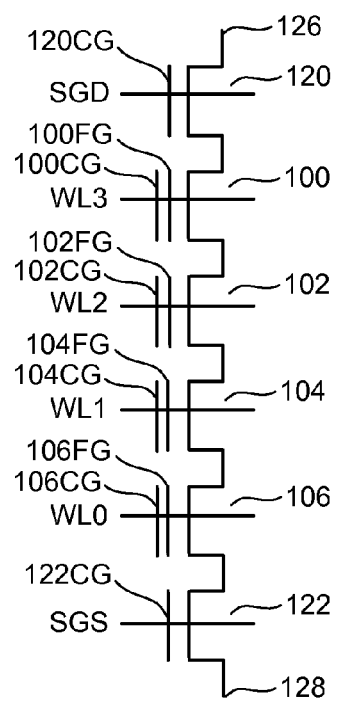
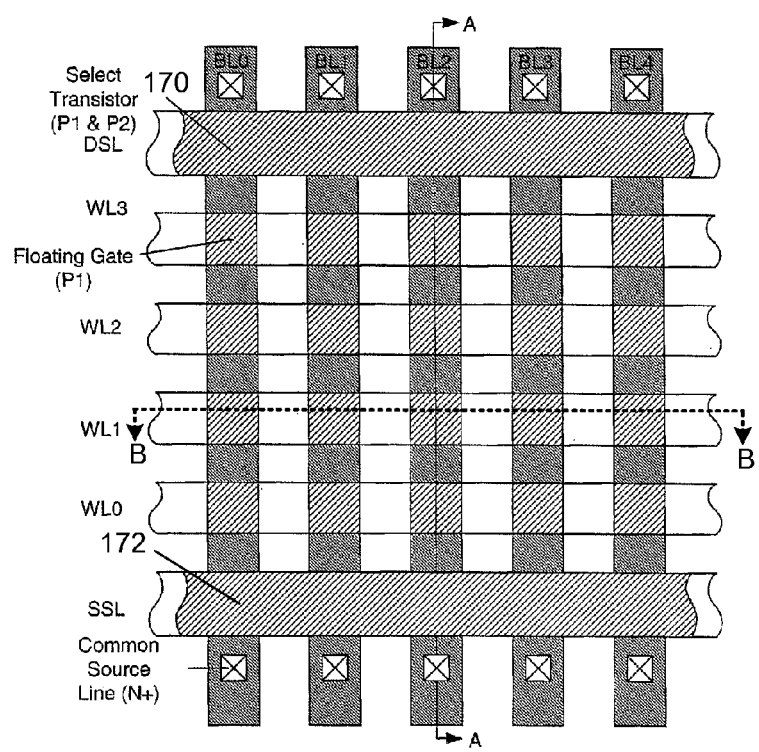
FIG. 3

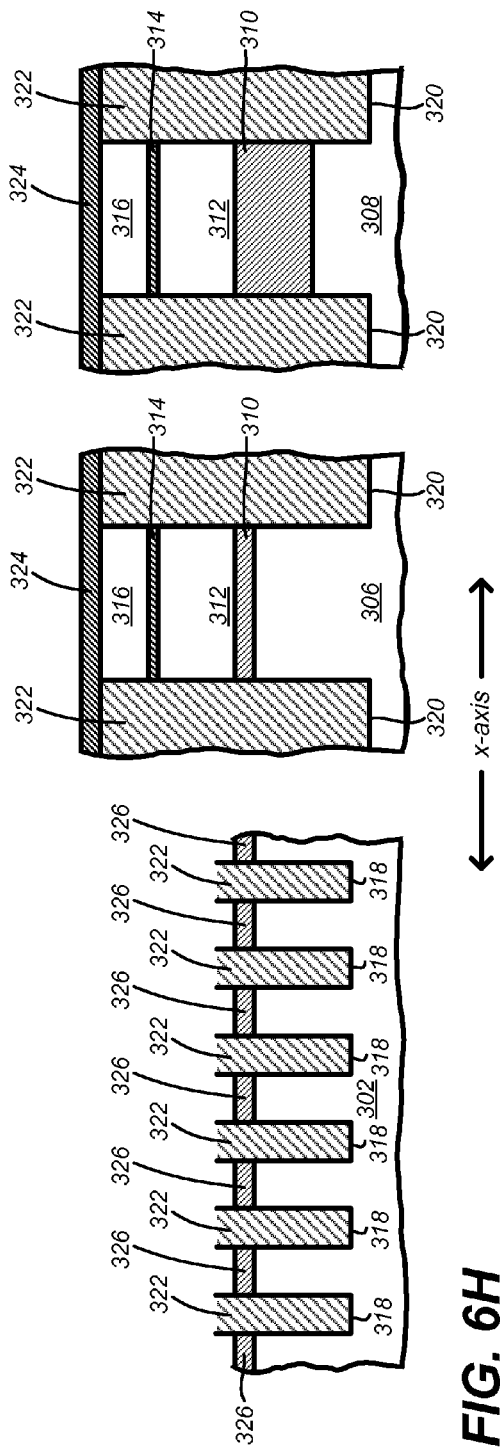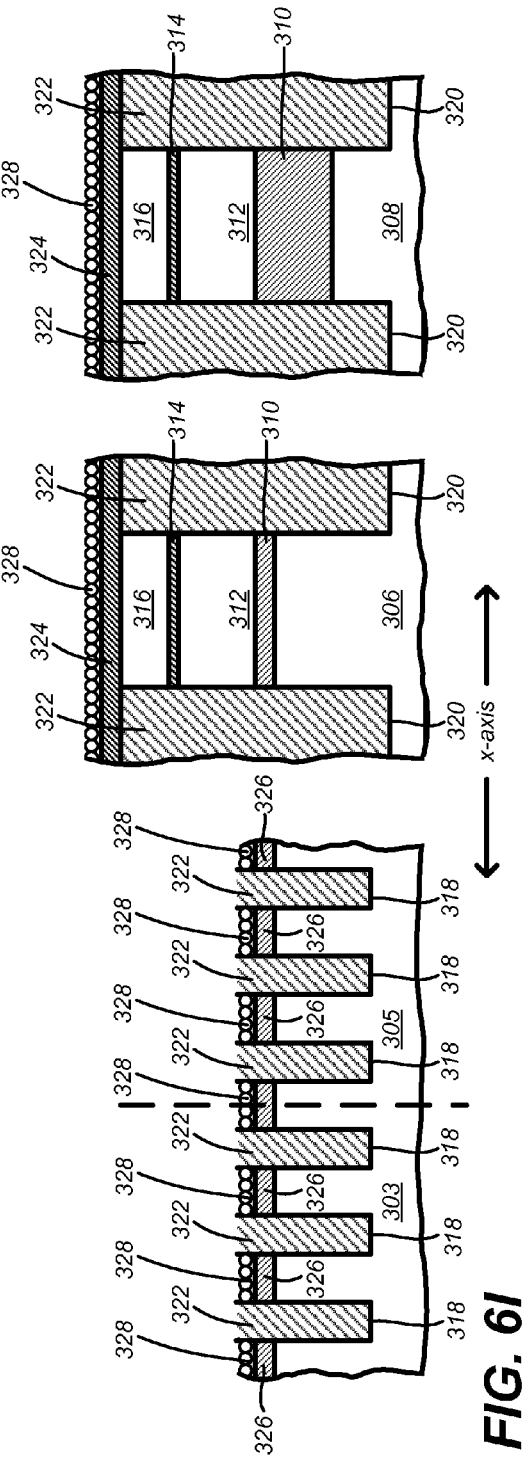
FIG. 6H
FIG. 6I

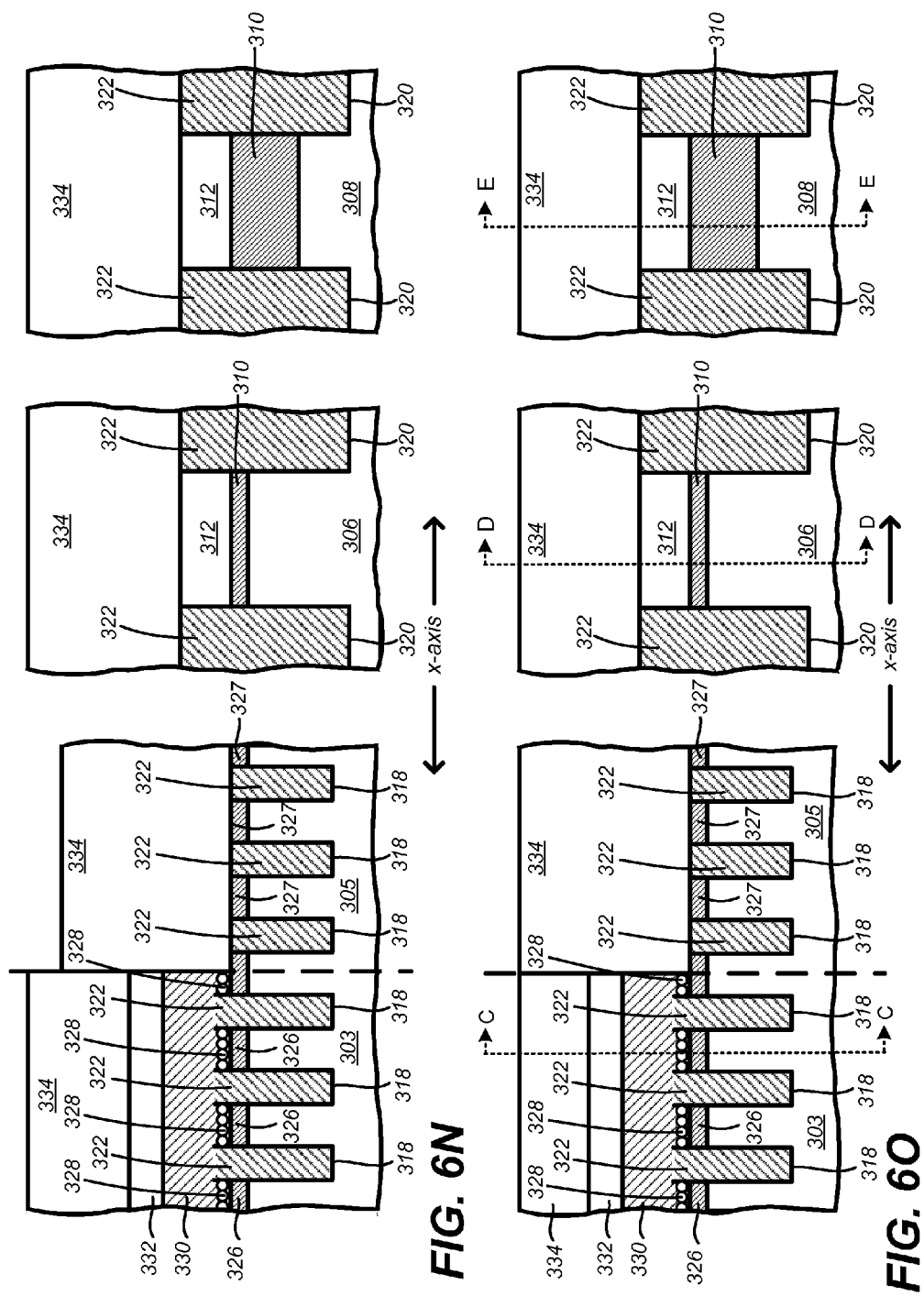

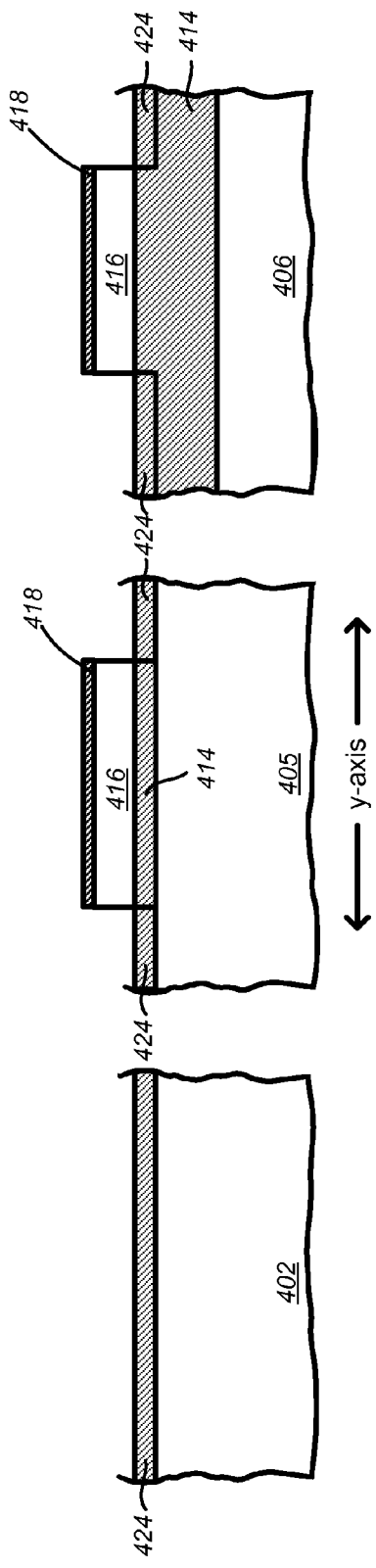
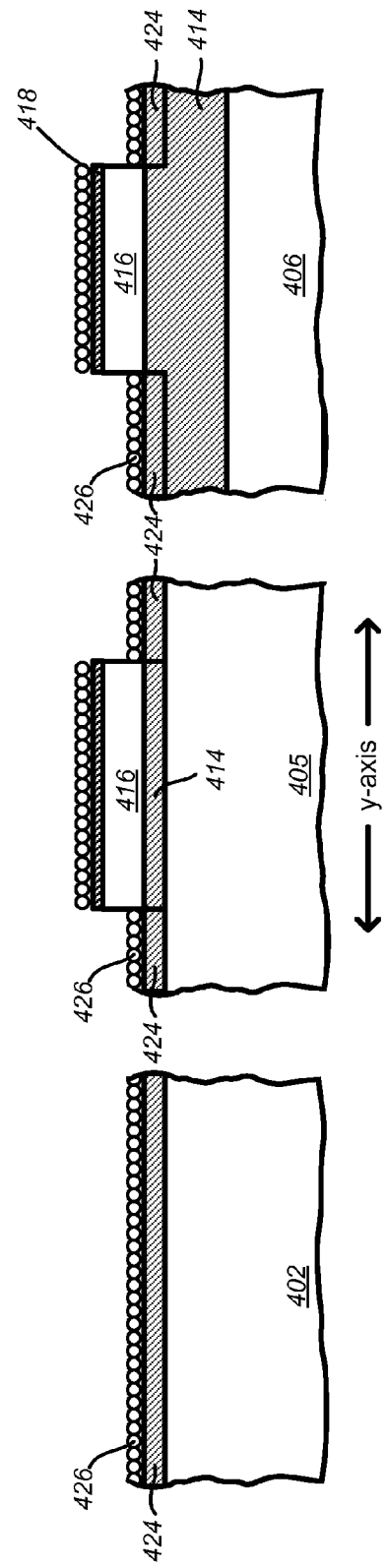
FIG. 8F
FIG. 8G

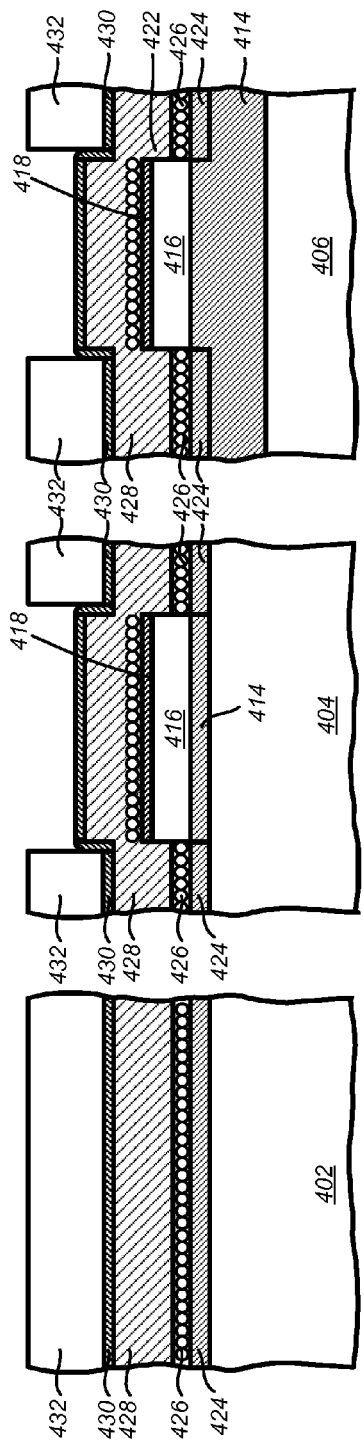
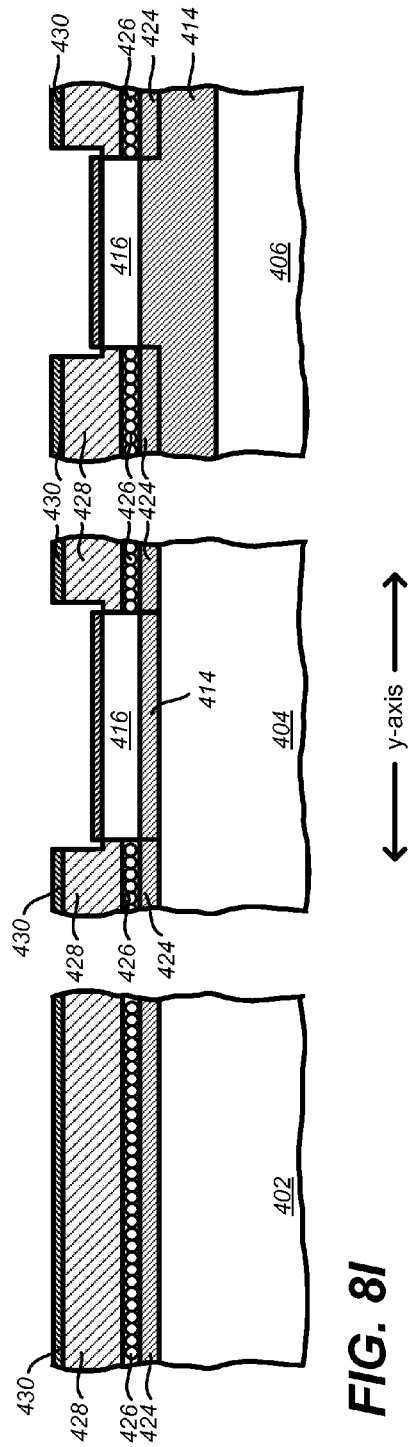
FIG. 8H
FIG. 8I

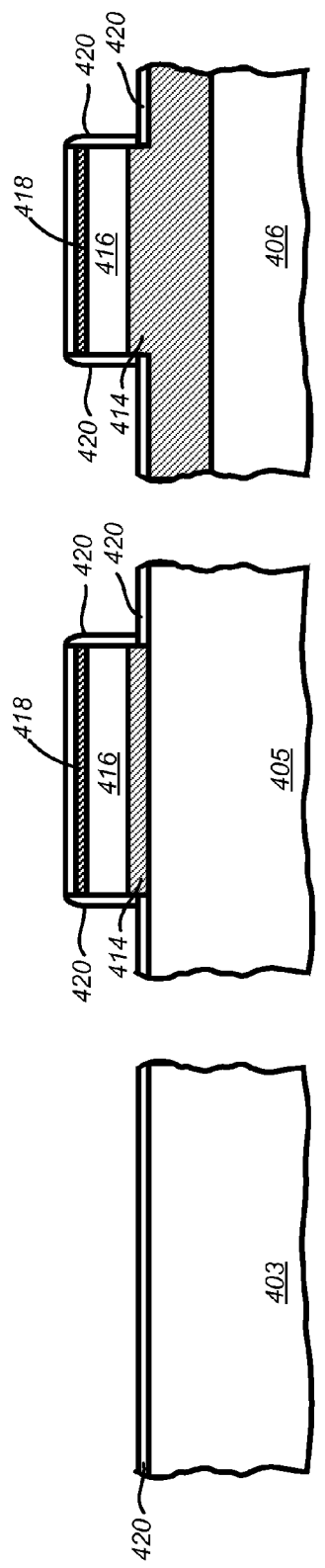
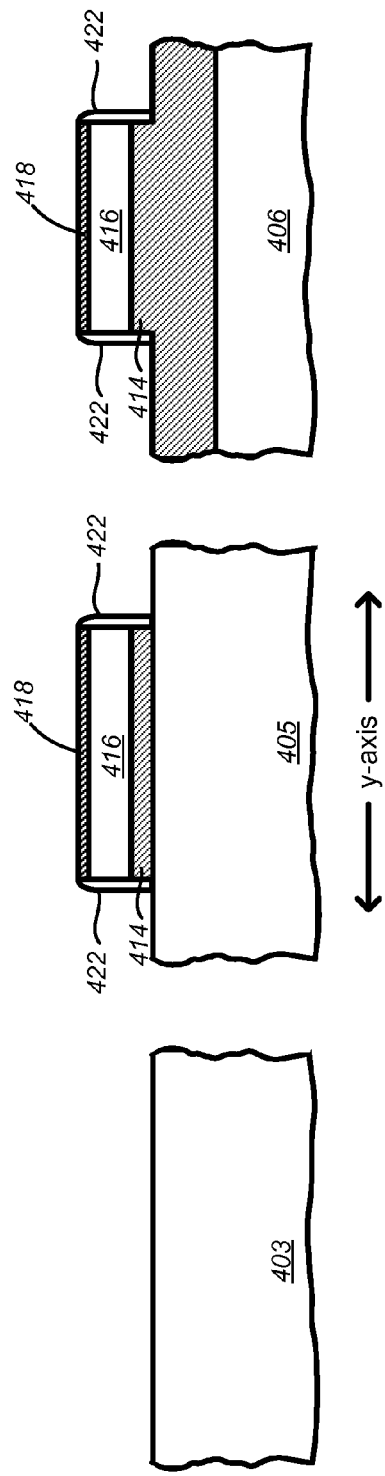
FIG. 9A
FIG. 9B

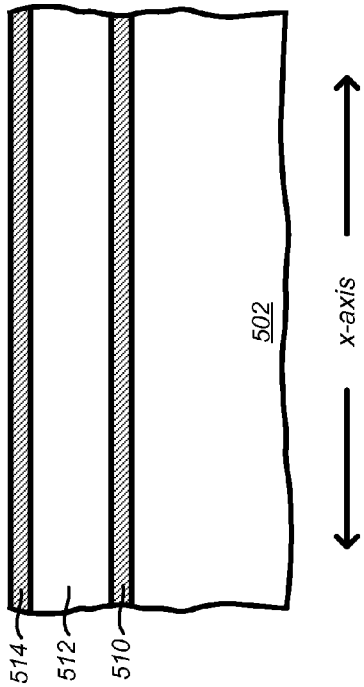
FIG. 10A
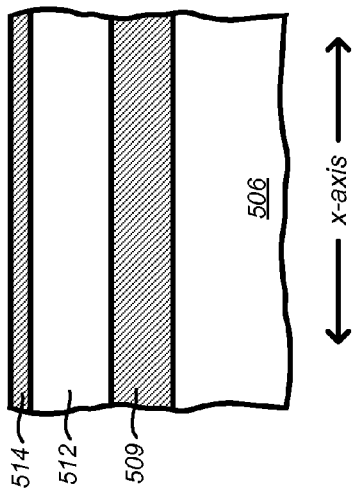
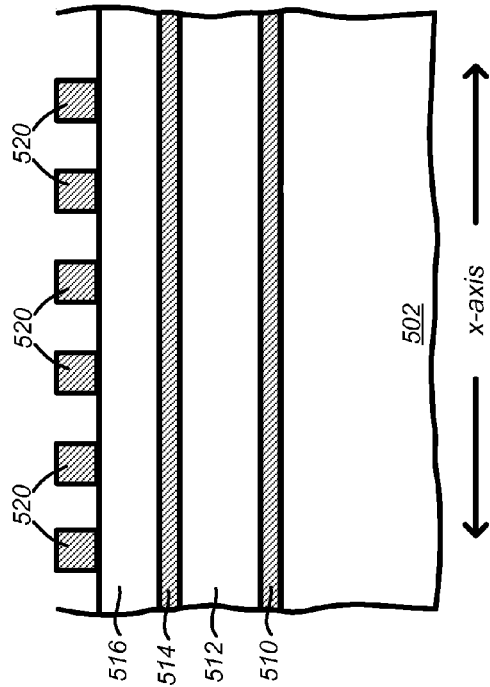
FIG. 10B
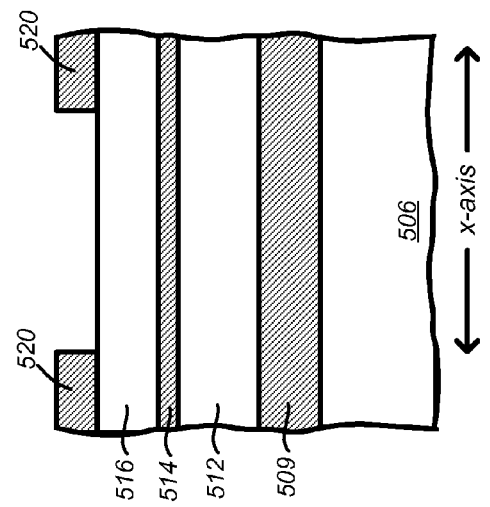

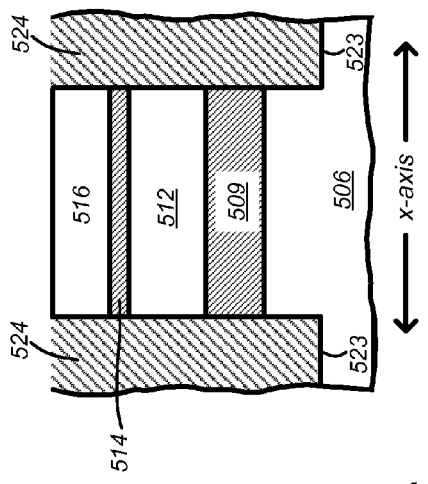
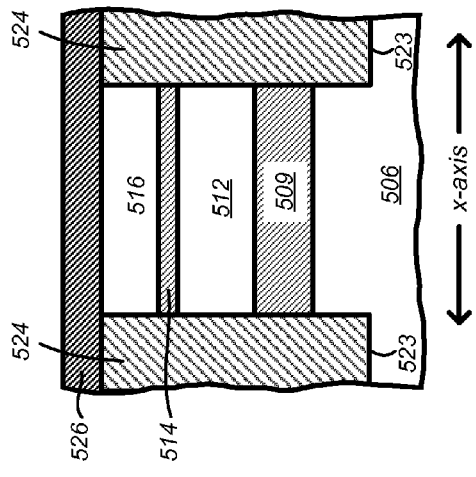
FIG. 10C
FIG. 10D
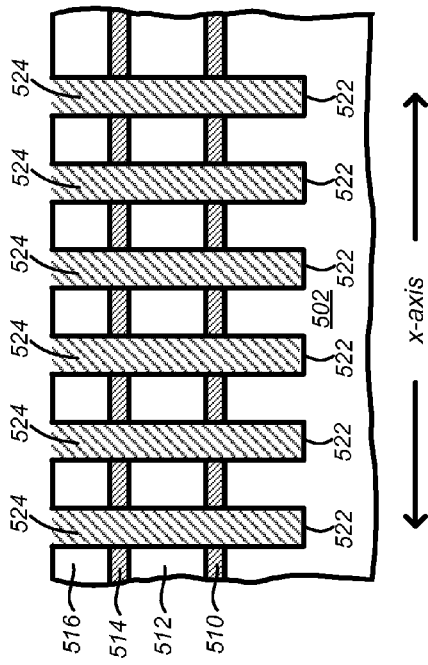
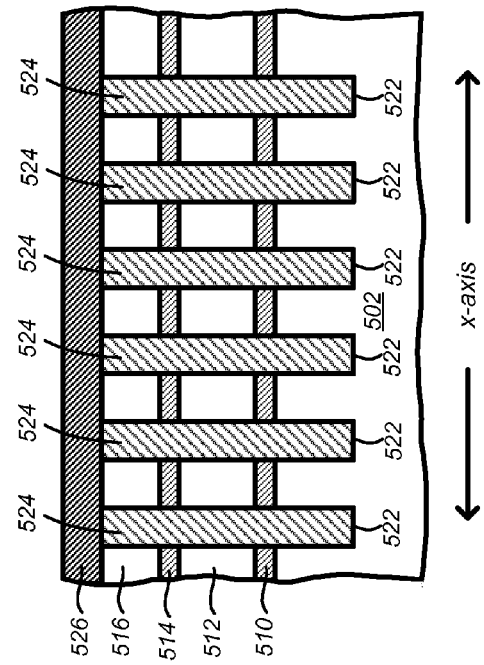

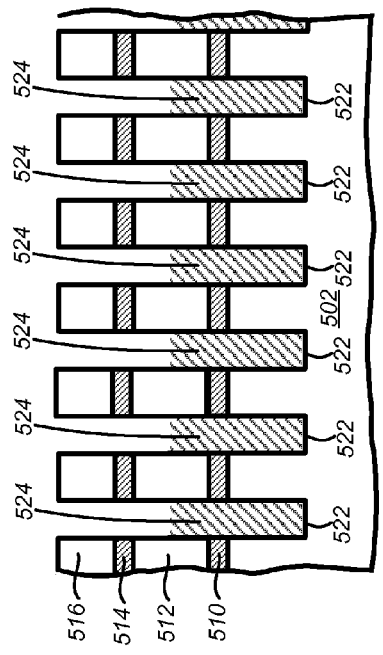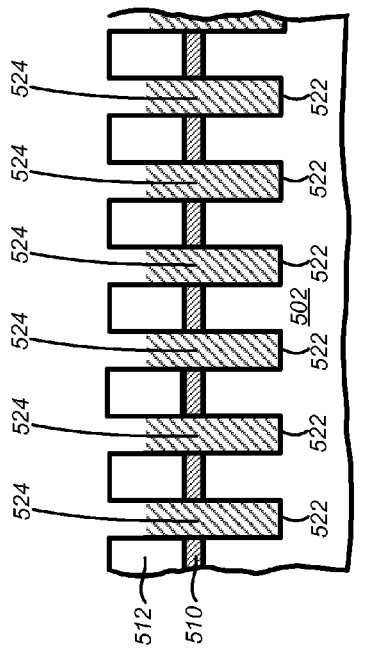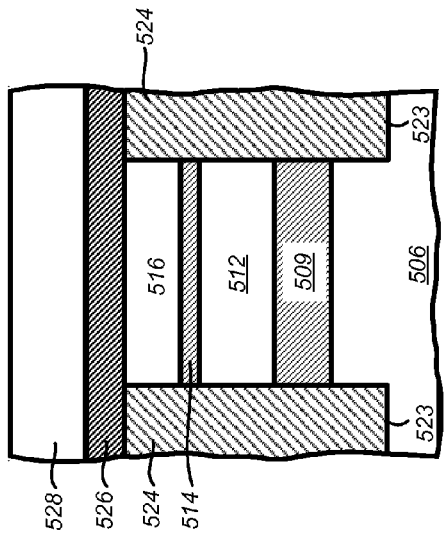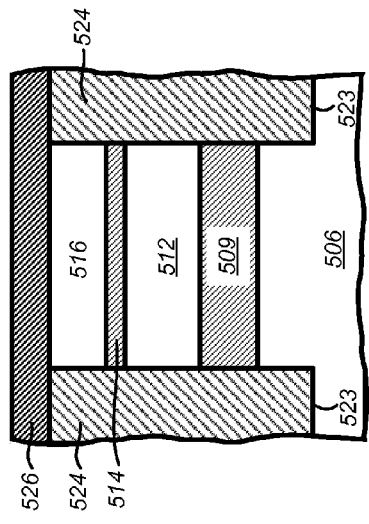
FIG. 10E
FIG. 10F

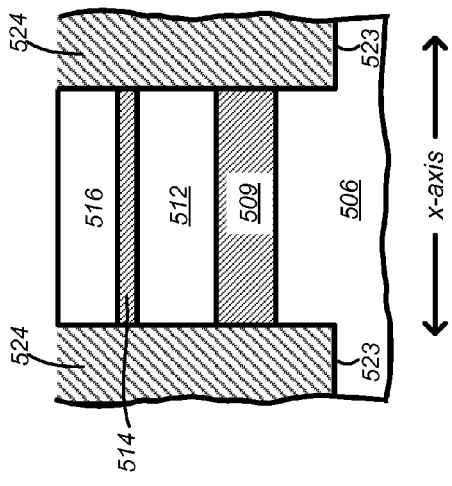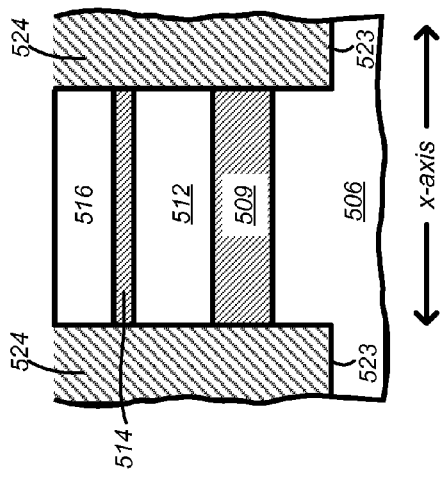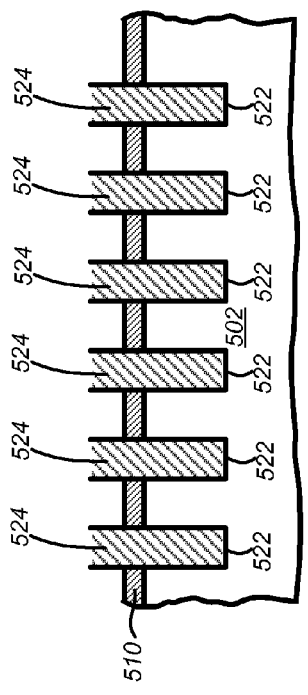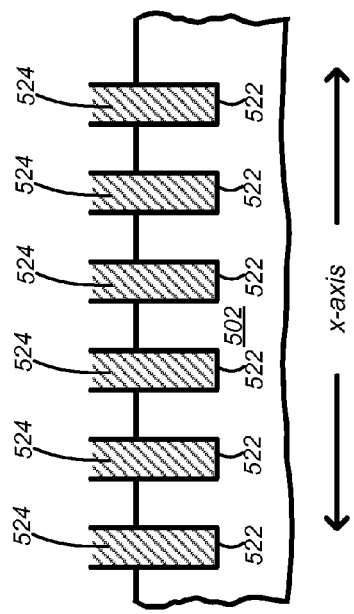
FIG. 10G
FIG. 10H

INTEGRATED NANOSTRUCTURE-BASED NON-VOLATILE MEMORY FABRICATION

PRIORITY CLAIM

The present application claims priority from: U.S. Provisional Patent Application No. 61/227,403, entitled "METHOD OF FORMING MEMORY WITH NANODOT CHARGE STORAGE REGIONS," by Purayath, et al., filed Jul. 21, 2009; and U.S. Provisional Application No. 61/235,994, entitled, "METHOD OF FORMING MEMORY WITH NANODOT CHARGE STORAGE REGIONS," by Purayath, et al., filed Aug. 21, 2009, both of which are incorporated by reference herein in their entirety.

BACKGROUND OF THE INVENTION

1. Field of the Invention

Embodiments of the present disclosure are directed to high density semiconductor devices, such as non-volatile memory, and methods of forming the same.

2. Description of the Related Art

In most integrated circuit applications, the substrate area allocated to implement the various integrated circuit functions continues to decrease. Semiconductor memory devices, for example, and their fabrication processes are continuously evolving to meet demands for increases in the amount of data that can be stored in a given area of the silicon substrate. These demands seek to increase the storage capacity of a given size of memory card or other type of package and/or decrease their size.

Electrical Erasable Programmable Read Only Memory (EEPROM), including flash EEPROM, and Electronically Programmable Read Only Memory (EPROM) are among the most popular non-volatile semiconductor memories. One popular flash EEPROM architecture utilizes a NAND array having a large number of strings of memory cells connected through one or more select transistors between individual bit lines and common source lines. FIG. 1 is a top view showing a single NAND string and FIG. 2 is an equivalent circuit thereof. The NAND string depicted in FIGS. 1 and 2 includes four transistors 100, 102, 104 and 106 in series between a first select gate 120 and a second select gate 122. Select gate 120 connects the NAND string to a bit line via bit line contact 126. Select gate 122 connects the NAND string to a common source line via source line contact 128. Each of the transistors 100, 102, 104 and 106 is an individual storage element and includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four transistors is only provided as an example. A NAND string can have less than four memory cells or more than four memory cells. For example, some NAND strings will include eight memory cells, 16 memory cells, 32 memory cells, or more.

The charge storage elements of current flash EEPROM arrays are most commonly electrically conductive floating gates, typically formed from a doped polysilicon material. Another type of memory cell useful in flash EEPROM systems utilizes a non-conductive dielectric material in place of a conductive floating gate to form a charge storage element capable of storing charge in a non-volatile manner. Such a cell is described in an article by Chan et al., "A True Single-Transistor Oxide-Nitride-Oxide EEPROM Device," IEEE Electron Device Letters, Vol. EDL-8, No. 3, March 1987, pp. 93-95. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. See also Nozaki et al., "A 1-Mb EEPROM with MONOS Memory Cell for Semiconductor Disk Application," EEE Journal of Solid-State Circuits, Vol. 26, No. 4, April 1991, pp. 497-501, which describes a similar cell in a split-gate configuration where a doped polysilicon gate extends over a portion of the memory cell channel to form a separate select transistor.

More recently, nanostructure-based charge storage regions have been used to form the charge storage element such as a floating gate in non-volatile memory devices. Metal, semiconductor and dielectric based nanostructures may be used for charge storage. Nanostructures are capable of very small feature sizes, making them attractive as device dimensions continue to scale. Existing fabrication techniques, however, may not be sufficient to fabricate integrated devices with nanostructure-based charge storage regions.

BRIEF DESCRIPTION OF THE DRAWINGS

FIG. 1 is a top view of a NAND string.

FIG. 2 is an equivalent circuit diagram of the NAND string depicted in FIG. 1.

FIG. 3 is a plan view of a portion of a NAND flash memory array.

FIGS. 8A-8L are cross-sectional views through a portion of a non-volatile memory array depicting a fabrication process in accordance with one embodiment.

FIGS. 9A-9H are cross-sectional views through a portion of a non-volatile memory array depicting a fabrication process in accordance with one embodiment.

DETAILED DESCRIPTION

Figure 4:
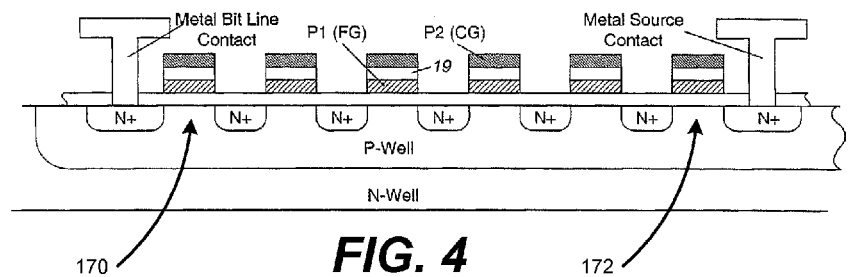
FIG. 4 is an orthogonal cross-sectional view taken along line A-A of the portion of the flash memory array depicted in FIG. 3.

Non-volatile memory devices having nanostructure-based charge storage regions and fabrication processes for such devices are provided.

Nanostructure-based charge storage regions are included in non-volatile memory devices and integrated with the fabrication of select gates and peripheral circuitry. One or more nanostructure coatings are applied over a substrate at a memory array area and a peripheral circuitry area. Various processes for removing the nanostructure coating from undesired areas of the substrate, such as target areas for select gates and peripheral transistors, are provided.

In one embodiment, selective curing of a nanostructure coating is performed, thus enabling a wash or rinse to remove the nanostructures from a select gate region of the substrate. In such an embodiment, etching can be used to remove the nanostructure coating from other undesired areas, such as the peripheral circuitry area. Etching at the peripheral circuitry area can be performed after rinsing at the select gate region.

In another embodiment, a nanostructure coating is removed from a select gate region of the substrate by etching. The coating is removed from the select gate area by etching prior to removing the coating from the peripheral circuitry area in one example. In another example, the coating is removed from the select gate area at the same time that the coating is removed from the peripheral circuitry area.

In one embodiment, one or more nanostructure coatings are formed using self-assembly based processes to selectively form nanostructures over active areas of the substrate. Self-assembly permits the formation of discrete lines of nanostructures that are electrically isolated from one another without requiring patterning or etching of the nanostructure coating.

In one example, isolation trenches are formed in a substrate to define active areas of the substrate between adjacent isolation trenches. The isolation trenches are filled with an insulating material, such as an isolating dielectric material. The insulating material extends above a surface of the substrate at positions over the isolation trenches. The insulating material thus forms protrusions above the substrate surface, with open lines or "grooves" between adjacent protrusions. A tunnel dielectric layer is formed over the active areas of the substrate between the protrusions of insulating material. The tunnel dielectric layer may be formed before or after the isolation trenches. An upper surface of the insulating material is a larger distance from the substrate surface than an upper surface of the tunnel dielectric layer.

A nanostructure coating is applied over the substrate, covering the insulating material and filling at least a portion of the open lines or grooves therebetween. In the open lines, the nanostructure coating overlies the tunnel dielectric layer. Through self-assembly of the nanostructure coating, the nanostructures in the coating move from higher positions above the substrate surface to lower positions above the substrate surface, where possible. Accordingly, the nanostructures overlying the higher upper surface of the insulating material move to lower positions overlying the active areas of the substrate. The nanostructures move from the upper surface of the insulating material to the upper surface of the tunnel dielectric layer. In this manner, discrete lines of nanostructures are formed between adjacent protrusions of the insulating material. After forming an intermediate dielectric layer and control gate layer, etching is performed orthogonally to the direction of the isolation trenches. The etching forms word lines from the control gate layer. The lines of nanostructures are etched into individual charge storage regions. Each line of the nanostructure coating is formed into a column of charge storage regions.

A method of fabricating non-volatile memory in one example includes forming a plurality of isolation trenches in a substrate that are elongated in a first direction (e.g., column) with a spacing between isolation trenches adjacent in a second direction (e.g., row) perpendicular to the first direction. The isolation trenches are filled with an isolating material that extends above a surface of the substrate. A tunnel dielectric layer is formed over a surface of the substrate. A nanostructure coating is self-aligned over a surface of the substrate between adjacent isolation trenches such that the nanostructure coating forms a plurality of lines with each line being between adjacent isolation trenches. An intermediate dielectric layer is formed over the nanostructure coating, followed by forming a control gate layer over the intermediate dielectric layer. A pattern is then formed, including strips elongated in the second direction with spacing therebetween in the first direction. Using the pattern, the control gate layer, the intermediate dielectric layer, and the plurality of lines of the nanostructure coating are etched. Etching the control gate layer forms a plurality of word lines elongated in the second direction and etching each line of the nanostructure coating forms a column of charge storage regions. The direction of etching to form the isolation trenches is orthogonal to the direction of etching the control gate layer and each line of the nanostructure coating.

Continuing with the above example, one embodiment includes forming the nanostructure coating at a cell region of the substrate and a select gate region of the substrate. The method further includes covering the select gate area of the substrate after forming the nanostructure coating, curing the nanostructure coating at the cell area while the select gate region is covered, uncovering the select gate region after curing and rinsing the nanostructure coating from the select gate region after uncovering the select gate region.

Another embodiment includes forming the nanostructure coating at a memory array area of the substrate and a peripheral circuitry area of the substrate. The method further includes covering at least a portion of the memory array area after forming the intermediate dielectric layer and etching to remove the intermediate dielectric layer and the nanostructure coating from a target area of the substrate for a gate region of a transistor in the peripheral circuitry area.

A further embodiment as just described in one example includes forming a first pattern before etching at the peripheral circuitry area. The first pattern exposes the target area for a gate region of a select gate at a select gate region of the memory array area. The first pattern covers the target area for the gate region of the transistor in the peripheral circuitry area. Etching is performed according to the first pattern to remove the intermediate dielectric layer and the nanostructure coating at the target area for the gate region of the select gate. After etching to remove the intermediate dielectric layer and the nanostructure coating at the select gate region, a second pattern is formed that exposes the target area for the gate region of the transistor in the peripheral circuitry area and covers the target area for the gate region of the select gate. Etching according to the second pattern is then performed to remove the intermediate dielectric layer and the nanostructure coating at the peripheral circuitry area. Etching according to the second pattern and etching according to the first pattern are performed in the same direction.

A portion of a traditional NAND memory array is shown in plan view in FIG. 3. BL0-BL4 represent bit line connections to global vertical metal bit lines (not shown). Four floating gate memory cells are shown in each string by way of example. Typically, the individual strings include 16, 32 or more memory cells, forming a column of memory cells. Control gate (word) lines labeled WL0-WL3 extend across multiple strings over rows of floating gates, often in polysilicon. FIG. 4 is a cross-sectional view taken along line A-A of FIG. 3, depicting polysilicon layer P2 from which the control gate lines are formed. The control gate lines are typically formed over the floating gates as a self-aligned stack, and are capacitively coupled to the floating gates through an intermediate dielectric layer 162. The top and bottom of the string connect to a bit line and a common source line through select transistors (gates) 170 and 172, respectively. Gate 170 is controlled by selection line DSL and gate 172 is controlled by selection line SSL. In traditional devices, the floating gate material (P1) can be shorted to the control gate for the select transistors to be used as the active gate. Capacitive coupling between the floating gate and the control gate allows the voltage of the floating gate to be raised by increasing the voltage on the control gate. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, in order to read charge level states along a row of floating gates in parallel. Examples of NAND memory cell array architectures and their operation as part of a memory system are found in U.S. Pat. Nos. 5,570,315, 5,774,397 and 6,046,935.

Figure 5:
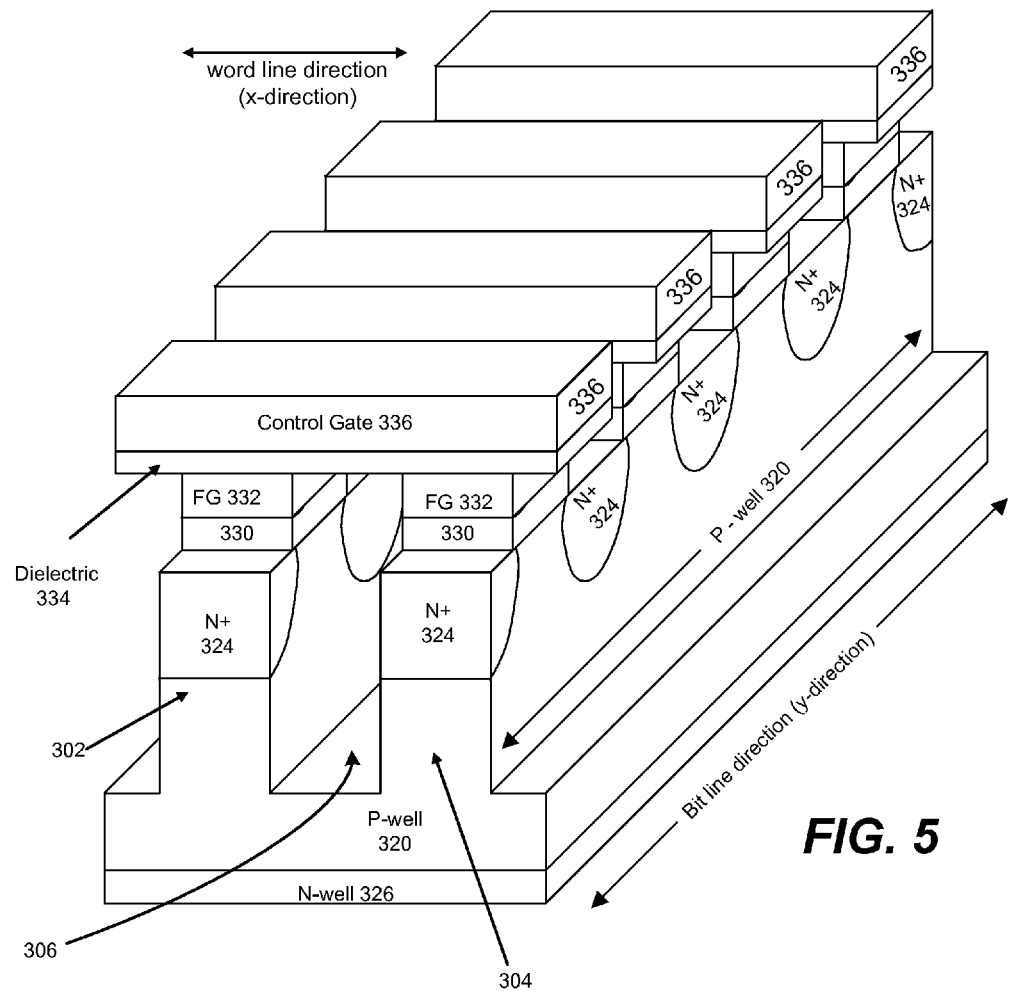
FIG. 5 is a three-dimensional drawing of a pair of four word line long portions of two NAND strings.

FIG. 5 is a three-dimensional block diagram of two exemplary NAND strings 302 and 304 that may be fabricated as part of a larger flash memory array. FIG. 5 depicts four memory cells on strings 302 and 304 as an example. FIG. 5 depicts N-well 326 below P-well 320. The bit line or y-direction runs along the NAND strings, and the word line or x-direction runs perpendicular to the NAND string or the bit line direction. The word line direction may also be referred to as the row direction and the bit line direction referred to as the column direction. The P-type substrate below N-well 336 is not shown in FIG. 5. In one embodiment, the control gates form the word lines. A continuous layer of conductive layer 336 can be formed which is consistent across a row in order to provide a common word line or control gate for each device on that word line. In such a case, this layer can be considered to form a control gate for each memory cell at the point where the layer overlaps a corresponding floating gate layer 332. In other embodiments, individual control gates can be formed and then interconnected by a separately formed word line.

When fabricating a NAND-type non-volatile memory system, including NAND strings as depicted in FIG. 5, electrical isolation is provided in the word line direction between adjacent strings. In the embodiment depicted in FIG. 5, NAND string 302 is separated from NAND string 304 by an open area or void 306. Typically, an insulating material or dielectric is formed between adjacent NAND strings in this open area.

Nanostructures are small particles that can be formed with charge-storing capabilities. The small size of nanostructures makes them attractive for forming charge storage regions, such as the floating gates for non-volatile memory cells, as device dimensions continue to be scaled-down. In a storage element, nanostructures can be used to store charge (e.g., electrons). The use of nanostructures as charge-storing particles in memory such as non-volatile memory provides many advantages, including allowing reduced programming voltages, resulting in reduced power/current consumption in the memory device, and scaling to ever smaller dimensions in future generation memory devices.

Nanostructures typically have at least one characteristic dimension that is less than about 500 nm along the smallest axis of the structure. Nanostructures may have characteristic dimensions that are less than 500 nm, for example, less than 10 nm, or even less than 1 nm. In some nanostructures, each of its dimensions may be less than 10 nm, or even 1 nm. By way of non-limiting example, nanostructures include nanowires, nanorods, nanotubes, bridge nanostructures, nanotetrapods, tripods, bipods, nanocrystals, nanodots, quantum dots, nanoparticles. Nano structures can be, for example, substantially crystalline, substantially mono-crystalline, poly-crystalline, amorphous or a combination thereof.

A nanostructure in one example is comprised of substantially spherical nanostructures or nanodots. Nanostructures can include essentially any material. Charge storing nanostructures may include conductors, non-conductors, and semiconductors. Nanostructures with high work functions (e.g., 4 eV or higher) are useful in memory devices to adequately trap and store electrons in the nanostructures without leakage across a tunnel dielectric layer. By way of non-limiting example, charge storing nanostructures may include materials such as silicon nitride (SiN), silicon (Si), Cobalt (Co), gold (Au), iridium (Ir), iron platinum alloys (FePt), nickel (Ni), palladium (Pd), platinum (Pt), ruthenium (Ru), tellurium (Te), tungsten (W), and the like. An array of nanostructures may be pre-formed or synthesized prior to incorporation into the memory structure. For example, nanostructures may be coil structures. Some nanostructures may include a coating having a ligand associated with a surface of the nanostructure, for example, a silsesquioxane ligand. Nanostructures may also be coated with insulating shells such as oxides or nitrides.

The integration of nanostructure memory cell technology to a full memory device poses a number of design challenges. For example, memory devices include non-floating gate structures such as select gates and peripheral circuitry transistors. As earlier described, the different polysilicon layers P1 and P2 may be shorted together in traditional devices to form a select gate or peripheral transistor. With nanostructures, however, it may be necessary to not include the nanostructure layer at the select gate and peripheral transistor areas. This may require the selective formation or removal of nanostructures at a memory cell area without formation at areas of the substrate comprising these non-floating gate transistors. Such fabrications may be accomplished by removing nanostructures from target regions of the substrate for select gate and peripheral transistors.

Figure 6A:
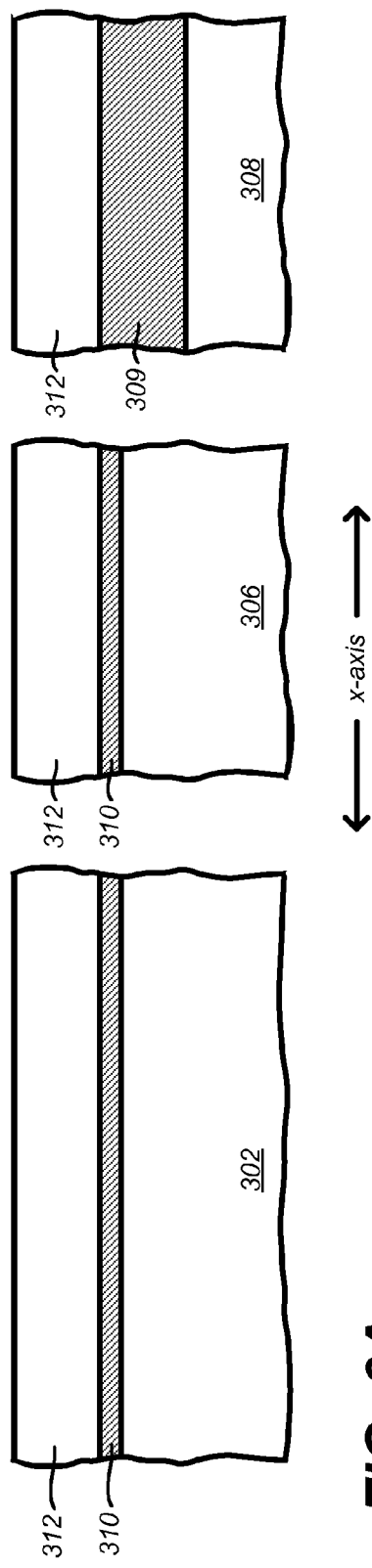
FIGS. 6A-6S are cross-sectional views through a portion of a non-volatile memory array depicting a fabrication process in accordance with one embodiment.

FIGS. 6A-6N are orthogonal cross-sectional views depicting the fabrication of a non-volatile memory array in accordance with one embodiment of the presently described technology. The described embodiment is exemplary only and should not be taken as limiting the disclosure. The exact materials, dimensions and order of processing may vary according to the requirements of individual implementations. In this example, the integrated formation of storage elements having nanostructure charge storage regions with select and peripheral circuitry is disclosed.

FIG. 6A is a cross-sectional view taken along a line in the row or x-axis direction through a portion of a memory array and peripheral circuitry, such as through line B-B depicted in FIG. 3. FIG. 6A depicts a memory array area 302 of a substrate, as well as peripheral circuitry areas 306 and 308 of the substrate. In this example, area 306 corresponds to the targeted area for one or more low-voltage peripheral transistors and area 308 corresponds to the targeted area for one or more high-voltage peripheral transistors. One or more wells (e.g., a triple well), not shown, are typically formed in the substrate prior to forming a layer stack over the substrate surface. The term substrate may include reference to these well regions. A zero layer formation may precede well formation.

After implanting an associated annealing of the well(s) to dope the substrate, a high voltage gate dielectric region 309 is formed in the substrate at the peripheral circuitry area 308. In one embodiment, a layer of silicon oxide (SiO2) is grown over the substrate, followed by removing the oxide from the low voltage peripheral circuitry area 306 and memory array area 302. A first dielectric layer 310 is then formed over the substrate. The first dielectric layer can be formed in one embodiment by growing a layer of SiO2 over the substrate. A deposition process could alternately be used. In one example, the first dielectric layer 310 can be formed to a depth of about 7 nm-8 nm at the cell area and low voltage peripheral area. The first dielectric layer can be formed at the high voltage area 308, thereby increasing the overall thickness of layer 309. In one example, the final thickness of dielectric region 309 is about 30 nm.

A first conductive layer 312 is formed over the first tunnel dielectric layer 310. The first conductive layer, as with the other conductive layers described herein, may include semiconductor materials such as doped polysilicon or conductive materials such as metals. It is noted that a layer may be said to be over another layer when one or more interleaving layers are between the two layers, as well as when the two layers are in direct contact. In one embodiment, doped polysilicon is formed by low-pressure chemical vapor deposition (LPCVD), although other processes can be used. In one example, the first conductive layer is deposited to a depth of about 30 nm. Different thicknesses of the first conductive layer can be used.

Figure 6B:
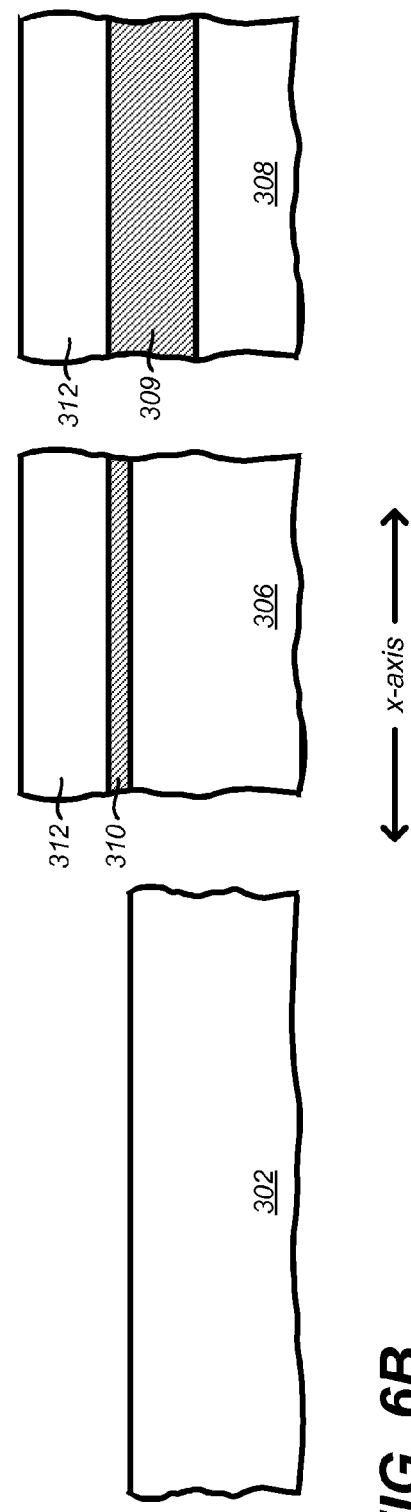
Figure 6C:
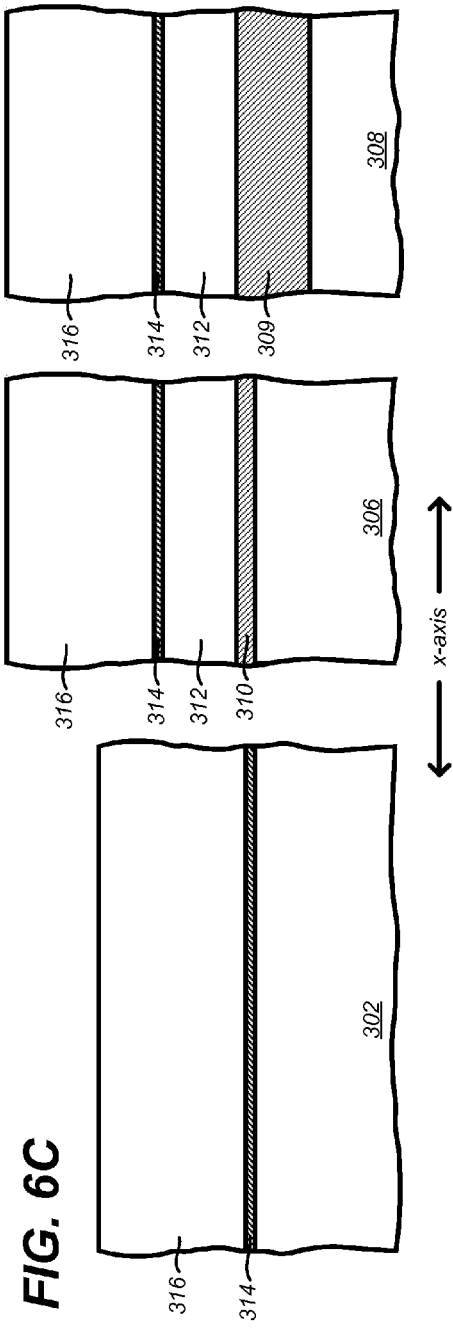

The first dielectric layer 310 and the first conductive layer 312 are then removed from the memory array area 302 as shown in FIG. 6B, while being maintained at peripheral circuitry areas 306 and 308. In one example, a photoresist mask and/or hard masking layers are formed over the peripheral circuitry areas, followed by etching to remove the conductive layer and dielectric layer from the memory array area. The photoresist is then removed, followed by forming a sacrificial layer 314 and hard mask layer 316 as shown in FIG. 6C. In one example, the sacrificial layer is a thin layer of high-temperature oxide (HTO), which can be deposited to a depth of about 4 nm, and the hard mask layer is a layer of silicon nitride (SiN), which can be deposited to a depth of about 70 nm.

Figure 6D:
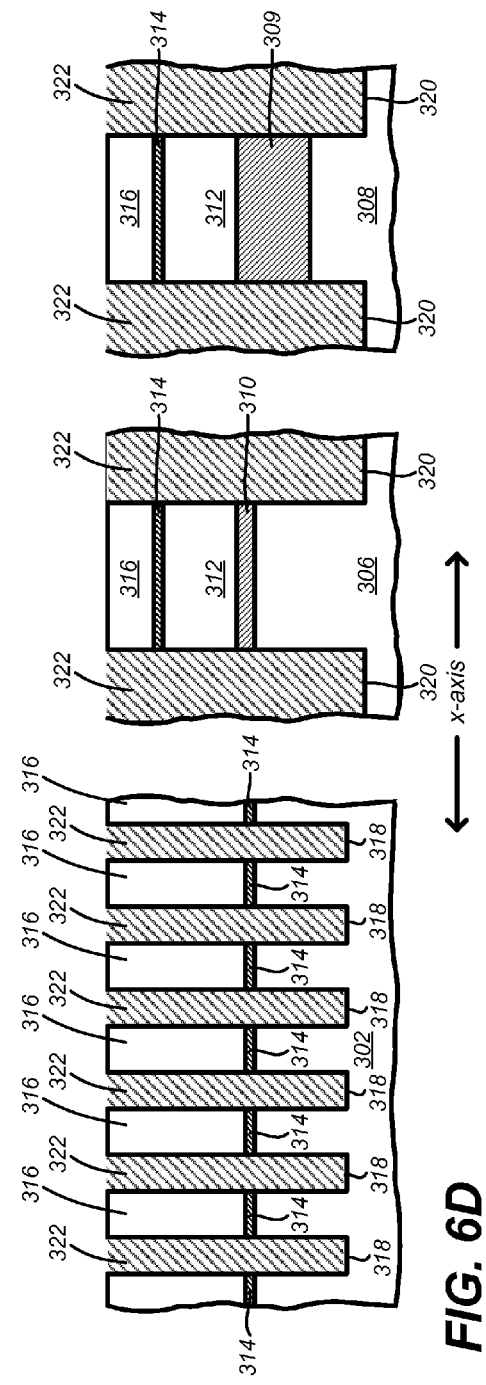

Isolation trenches 318 and 320 are etched into the substrate as shown in FIG. 6D. In one embodiment, conventional photolithography is used to pattern the hard mask layer 316 into strips elongated in the direction of the y-axis with spaces between strips adjacent in the direction of the x-axis. The hard mask layer may be patterned into a first sub-pattern at the memory array area 302 and one or more different sub-patterns at the peripheral circuitry areas 306, 308 to define active areas in the substrate with different dimensions in the direction of the x-axis. Spacer-assisted patterning, nano-imprint patterning, and other patterning techniques can also be used to form strips of the hard mask layer 316 at reduced features sizes. The pattern, repetitive in the second or row direction, defines a first direction of etching to form columns of the targeted memory array.

Using the patterned hard mask layer at the memory array area, the sacrificial layer 314 and substrate are etched to define a plurality of shallow isolation trenches 318 that divide the substrate into isolated active areas between the trenches.

At the peripheral circuitry areas, the patterned hard mask is used to etch the first conductive layer 312, first dielectric layer 310, dielectric area 309 and the substrate. A plurality of shallow isolation trenches 320 that isolate the active areas for the peripheral transistors are formed. Etching the first conductive layer 312 forms a first dimension for a plurality of peripheral transistors that will be formed from the columnar line of material 312 extending in the y-direction. The isolation trenches are gap-filled by depositing an isolation material 322, such as an insulating dielectric (e.g., SiO2). Growth processes may also be used. Chemical mechanical planarization (CMP) or etch back processes are applied to create a substantially planar upper surface of the layer stacks at the peripheral and memory array region. The layerstacks are polished using a target thickness of about 20 nm for the remaining hard mask layer at the peripheral circuitry area, but other amounts of polishing can be used, which will vary based on a particular implementation.

Figure 6E:
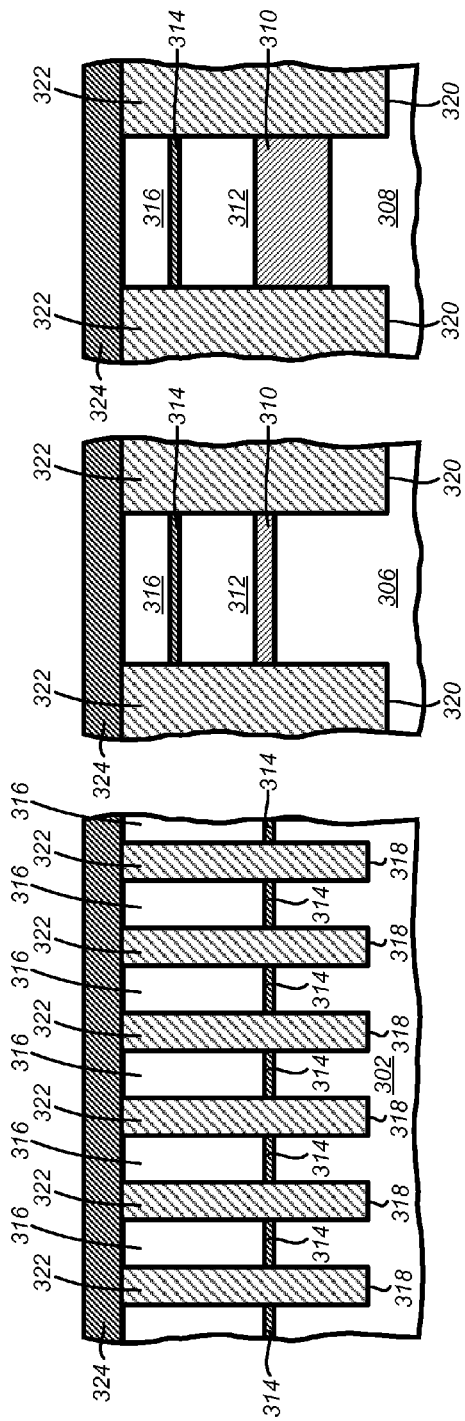

After forming the isolation regions, a series of fabrication processes are applied to remove the layerstacks at the memory array area, while leaving a portion of the gap-fill material above the substrate surface. A second sacrificial layer 324 is formed at the peripheral circuitry areas and the memory array area as shown in FIG. 6E. In one example, layer 324 is HTO deposited to a depth of about 15 nm.

Figure 6F:
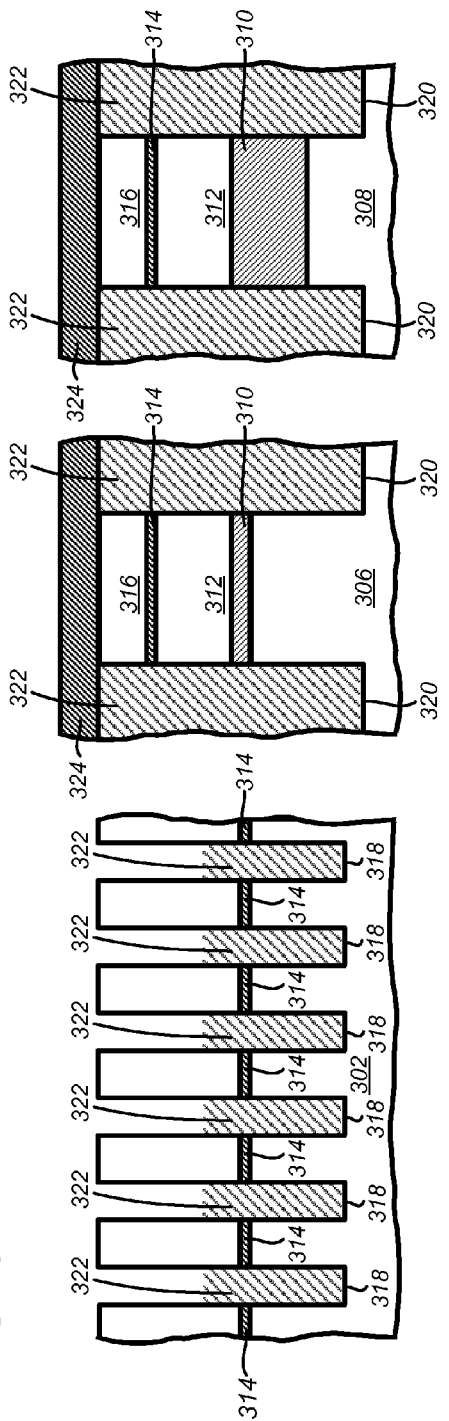

Turing to FIG. 6F, a photoresist cover (not shown) is applied at the peripheral circuitry areas, followed by removing the second sacrificial layer at the memory array area. The photoresist is removed after removing the second sacrificial layer at the memory array area. The isolation material 322 is then recessed as shown in FIG. 6F. In one example, the isolation material is targeted for a thickness of about 5 nm-10 nm remaining above the substrate surface after recessing. Other target thicknesses may be used, for example, ranging from about 1 nm-10 nm in another example. Recessing the isolation material while protective layer 316 is in place avoids overetching or sidewall etching of the isolation material, which could otherwise remove the isolation dielectric from above the substrate surface. The isolation material includes a portion extending from each trench above the surface of the substrate forming protrusions of the isolation material. As will be apparent in later processing steps, these protrusions of the isolation material are used to self-align discrete lines of a nanostructure coating above the active areas of the substrate, without the requirement of patterning and etching of the nanostructure layer.

Figure 6G:
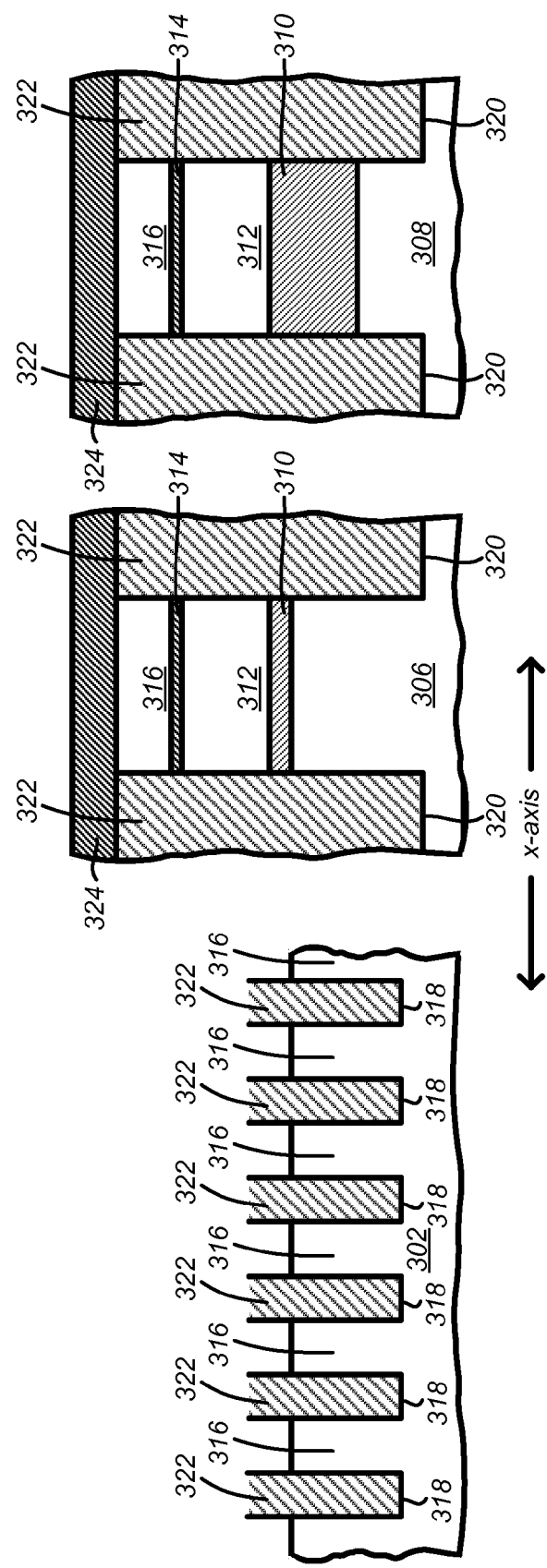

With the protective layer 324 covering the peripheral circuitry areas, the hard mask layer 316 is stripped from the memory array area using a hot phosphoric etch, for example. A pre-clean operation for a subsequent oxide growth process is then performed. The pre-clean process is applied with a target removal of 4-5 nm of the sacrificial layer 314 (e.g., oxide). The pre-clean process removes the first sacrificial layer 314 from the memory array area as shown in FIG. 6G.

A second dielectric layer 326 is formed over the active areas of the substrate at the memory array area as shown in FIG. 6H. In one example, the second dielectric layer is a layer of SiO2 grown by thermal oxidation to a thickness of about 5-8 nm. The second dielectric layer does not grow or significantly grow on the isolation dielectric regions, thus self-aligning over the active areas. The second dielectric layer forms the tunnel dielectric material for the memory cells.

After forming the second dielectric layer, a nanostructure coating 328 is applied to the layer stack surface at the memory array area 302 and the peripheral circuitry areas 306, 308 as shown in FIG. 6I. In FIG. 6I, the memory array area 302 of the substrate is shown as including cell region 303 and select gate region 305. The cell region 303 is the target location of the actual storage elements, while the select gate region 305 is the target location of the select gates (e.g., drain-side or source-side) for groupings of storage elements in the cell area.

Nanostructure coating 328 may include one or more nanostructure layers. In embodiment, the nanostructures are free of solvent in their formation, while in others the nanostructures are dispersed in one or more solvents. The nanostructures may form a disordered or ordered array such as an ordered monolayer or multilayer (e.g., spherical, polygonal). A solution of nanostructures can be formed by deposition processes, including spin coating, dip coating, spraying, soaking and other techniques.

In one embodiment, a self-assembly process is used to drive the nanostructures between the protrusions of the isolation dielectric extending above the substrate surface. Self-assembly processes are capable of generating spatially regular structures. Self-assembling materials of block copolymers and nanostructures can form periodic patterns of nanostructures without etching. The nanostructure coating in FIG. 6I is formed over the active areas of the substrate resulting from the formation of isolation trenches 318. The nanostructure coating does not overlie the isolation dielectric 322 which is formed in the trenches and protrudes from the upper surface of the substrate surface. The viscosity of the nanostructure solution causes the nanostructures to naturally flow from the upper surface of the raised isolation regions, to the upper surface of the tunnel dielectric layer 326. The upper surface of the isolating material is a greater distance above the surface of the substrate than the upper surface of the tunnel dielectric layer. The nanostructure coating 328 defines discrete lines of nanostructures between adjacent protrusions of isolation material that extend above the substrate surface. More information regarding nanostructures and their solutions can be found in U.S. application Ser. No. 11/958,875, entitled, "Method of Forming Memory with Floating Gates Including Self-Aligned Metal Nanodots Using a Polymer Solution," by Purayath, et al., filed Apr. 5, 2010 and incorporated by reference herein in its entirety.

Figure 7A:
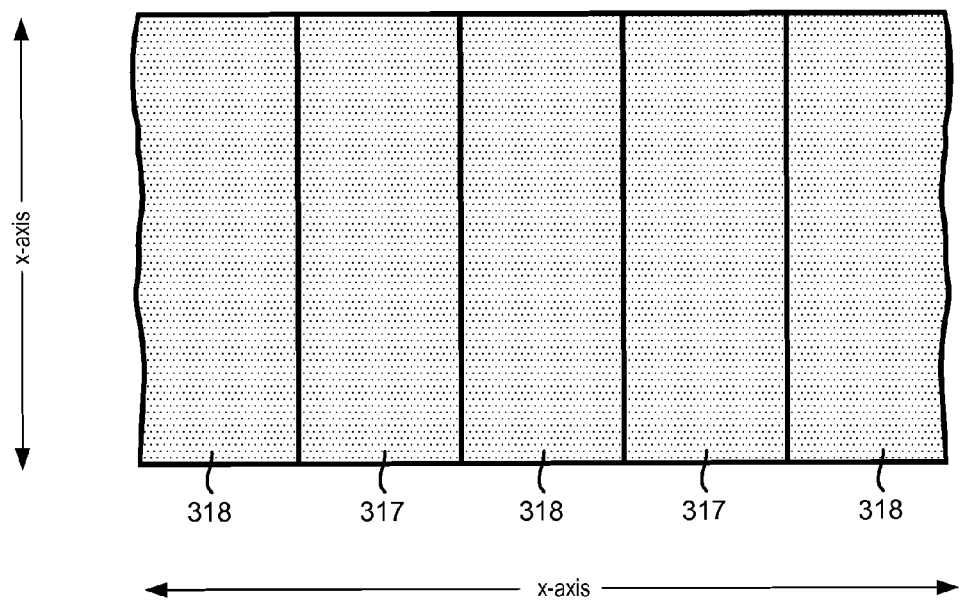
FIGS. 7A-7B are top views of a portion of a non-volatile memory array during the fabrication of FIGS. 6A-6S.
Figure 7B:
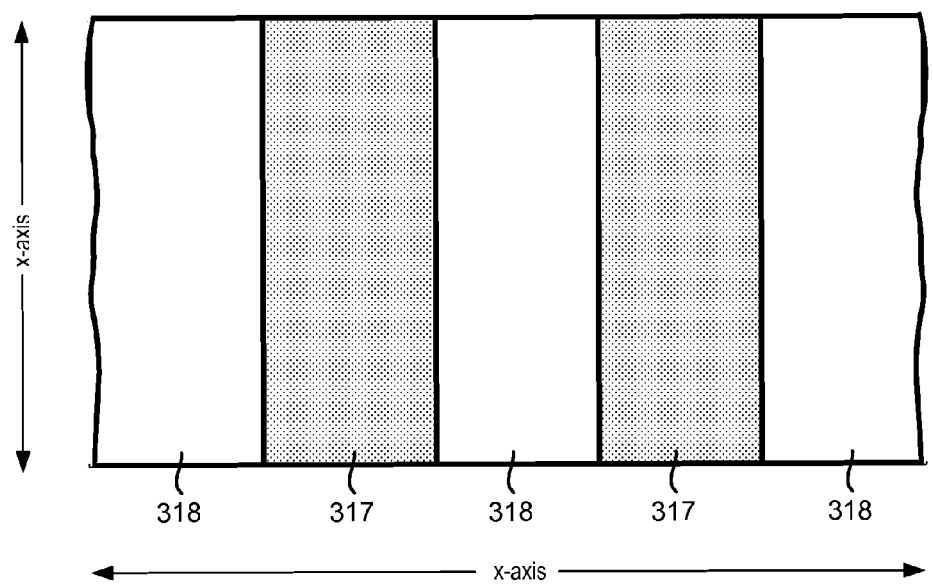

The self-assembly process of FIG. 6I drives the nanodots from the isolation areas to the active areas as further depicted in FIGS. 7A-7B. FIG. 7A is an overhead view, depicting active areas 317 of the substrate, separated by isolation trenches 318. The nanostructure coating has been applied and coats the entire surface of the substrate (or layers formed thereon). Through the self-assembly process, the nanostructures are driven from the isolation trenches to the active areas as depicted in FIG. 7B, which depicts the substrate surface after the self-assembly process.

In one example, polymer micelle technology may be employed to form nanostructures with a high degree of uniformity. Such technology can be used to fabricate self-aligned nanostructures with sizes, e.g., from a few nm to 30 nm (or more). A copolymer solution may be formed, followed by adding salt to provide metal salt ions in a core or micelle, e.g., cavity, of the copolymer, and performing a metal salt reduction to form a metal nanostructure in the core. The polymers may in powdered form, for example, and dissolved in an organic solvent. In other examples, the nanostructures are not dispersed in a solvent.

The copolymer solution with the nanostructures can be deposited onto the substrate. The size and spacing of the nanostructures can be tailored based on the molecular weight of the block copolymer and the amount of the metal salt used. The amount of charge that may be stored by a nanostructure depends on its size, which is a function of the copolymer ratio that has been used to form the micelle. After being deposited, the solution may be partially or entirely removed from the nanostructures, such as by evaporation.

In one embodiment, a coupling or association agent is used to form the nanostructure coating. A coupling layer (not shown) is disposed over oxide layer 326. The coupling layer can include a chemical group that interacts with a nanostructure and/or ligand coating of a nanostructure. The coupling layer may be an amino functional silane group. By way of example, coupling layers include thiol, amine, alcohol, phosphonyl, carboxyl, boronyl, fluorine, phosphinyl, alkyl, aryl, etc.

A nanostructure coating is then applied over the substrate. The nanostructures may be coated with a ligand to interact with the coupling layer. The nanostructures and/or ligands interact with the coupling layer, forming one or more nanostructure layers over the dielectric layer 326 at the active areas of the substrate. The substrate with the nanostructures can be dried, such as by dry nitrogen blowing with no heat. The coupling layer may be removed after forming the nanostructure coating.

Figure 6J:
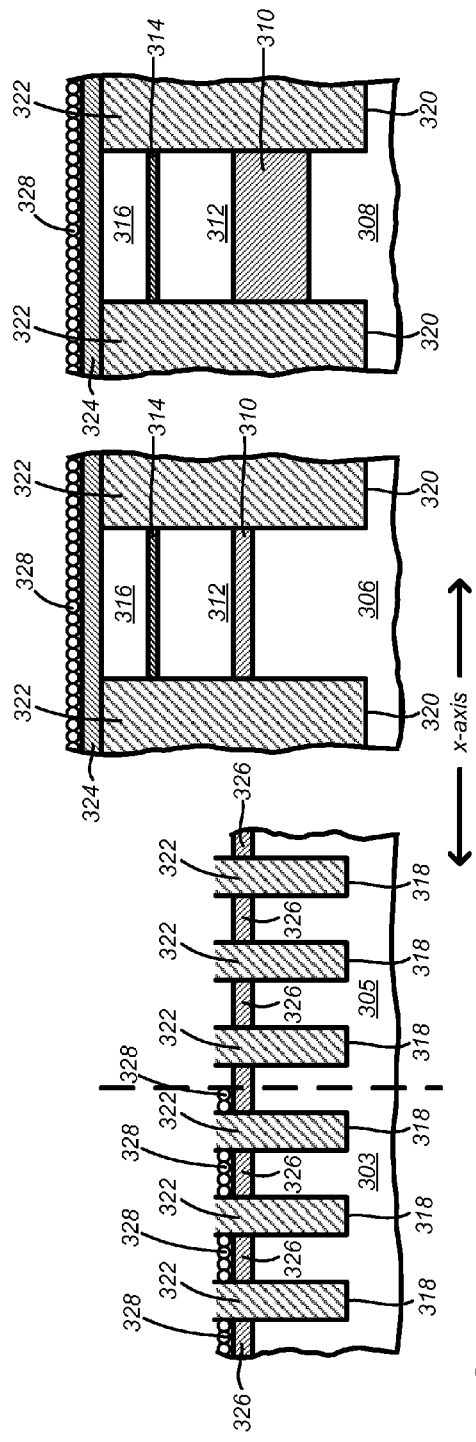

With reference now to FIG. 6J, after deposition and self-assembly, the nanostructure coating is removed from the select gate region of the memory array area. The nanostructure coating remains at the cell region and peripheral circuitry areas of the substrate. In one example, the memory cell region 303 and peripheral circuitry areas 306, 308 are subjected to ultraviolet (UV) curing, without UV curing the nanostructure layer at the select gate region 305. Photoresist or another suitable masking material can be applied over the select gate area 304 before applying UV light to the substrate surface. After selectively curing the nanostructure layer, a rinse or wash can be applied to the wafer which will remove the nanostructure layer at locations where it has not been cured. This process results in removal of the nanostructure layer at the select gate region. Other techniques can be used to remove the nanostructure layer from the select gate region.

In self-assembly processes, photoactivatable compounds may be incorporated into a nanostructure solution for selective removal of the nanostructures from the select gate area. Where a coupling layer is used, the coupling layer material composition may be photoactivatable, such that the bond between the coupling layer and ligand or nanostructure is formed only upon exposure to light. Numerous photoactivatable compounds as known in the art may be used. By way of example, such compounds may include a phenyl azide group, which when photoactivated can from a covalent bond with, e.g., a silsesquioxane ligand comprising a coating associated with a surface of the nanostructures. Other photoactivatable compounds include an aryl azide group (e.g., a phenyl azide, hydroxphenyl azide, or nitrophenyl group), a psoralen, or a diene.

Figure 6K:
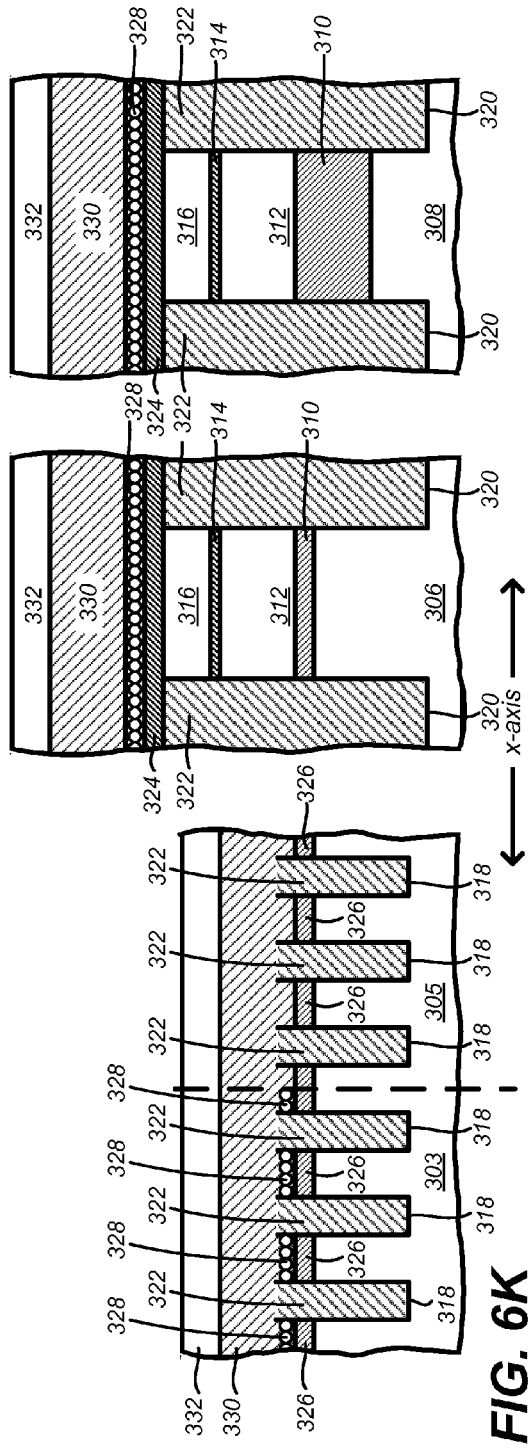

After selectively removing the nanostructure layer, a third dielectric layer 330 is formed over the wafer as shown in FIG. 6K. In one example, the third dielectric layer is an oxide (e.g., SiO2) deposited to a thickness of about 10 nm-12 nm. Other materials can be used. In one embodiment, the third dielectric layer includes a first high-K dielectric layer, followed by a triple layer of oxide-nitride-oxide and another high-K dielectric layer. A barrier metal layer 332 is formed over the third dielectric layer. The barrier metal layer may be TiSiN, TiN, TaN or other suitable barrier metals, formed to a thickness of about 10 nm for example.

Figure 6L:
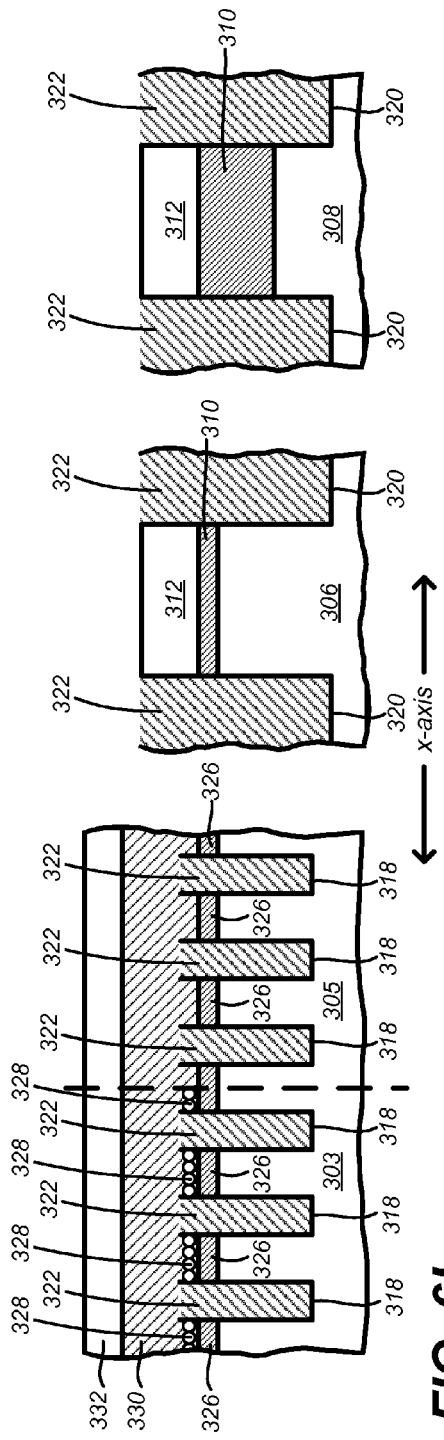
Figure 6M:
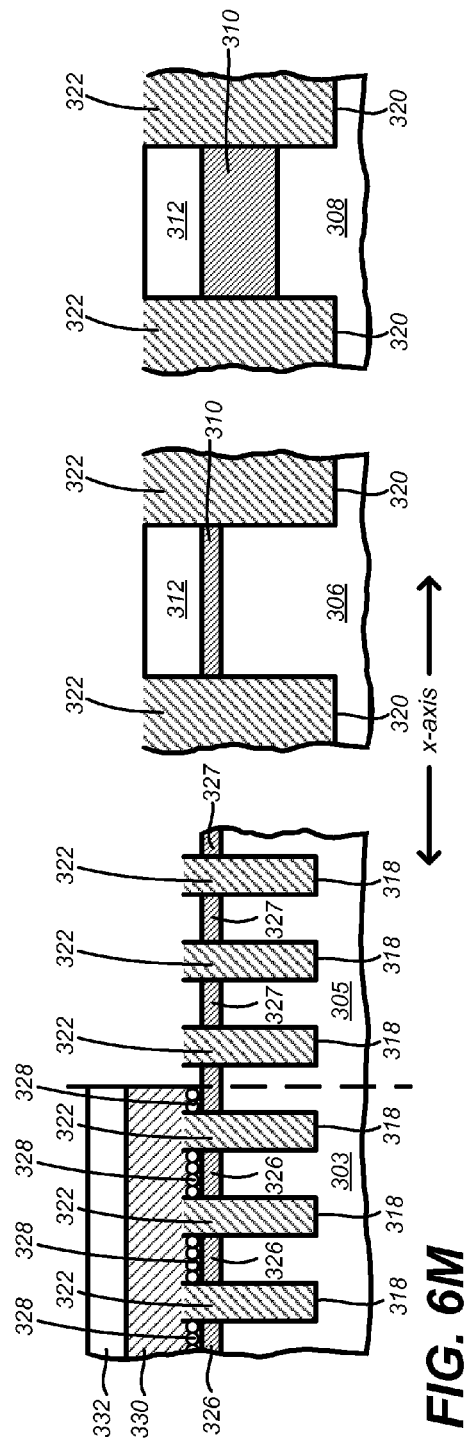

The memory array area 302 (regions 303 and 305) is then covered with photoresist and/or one or more hard mask layers (not shown), followed by etching the layer stack as shown in FIG. 6L. Etching continues until reaching the first conductive layer 312 at the peripheral circuitry area. Etching removes the barrier metal layer 332, third dielectric layer 330, nanostructure coating 328, sacrificial layer 324, hard mask layer 316 and sacrificial layer 314 at the peripheral circuitry areas. The photoresist is then removed from the memory array area 302. Photoresist (not shown) is then applied to cell area 303 and peripheral circuitry areas 306, 308, leaving select gate area 305 exposed. Etching is then performed as shown in FIG. 6M. Etching removes the barrier metal layer 332 and third dielectric layer 330 from the select gate region 305. After etching, an additional gate dielectric layer 327 can optionally be regrown at the select gate area 305 while the cell area 303 and peripheral circuitry areas 306, 308 remain covered. The additional gate dielectric layer may be useful if the second dielectric layer 326 is damaged or removed by the etch process. Rather than regrow the gate dielectric layer, a dielectric layer such as high temperature oxide formed by a deposition process can be disposed at the select gate area in another example. In an alternative embodiment, the select gate area can be covered during the etch process so that the third dielectric layer 330 and the barrier metal layer 332 remain.

After exposing the first conductive layer at the peripheral circuitry area and the second dielectric layer at the select gate area, a second conductive layer 334 is formed over the wafer as shown in FIG. 6N. The second conductive layer is a layer of doped polysilicon in one example, deposited to a thickness of about 100 nm, but other materials and dimensions can be used. FIG. 6O depicts the device after a CMP processes to planarize the upper surface of the second conductive layer.

Figure 6P:
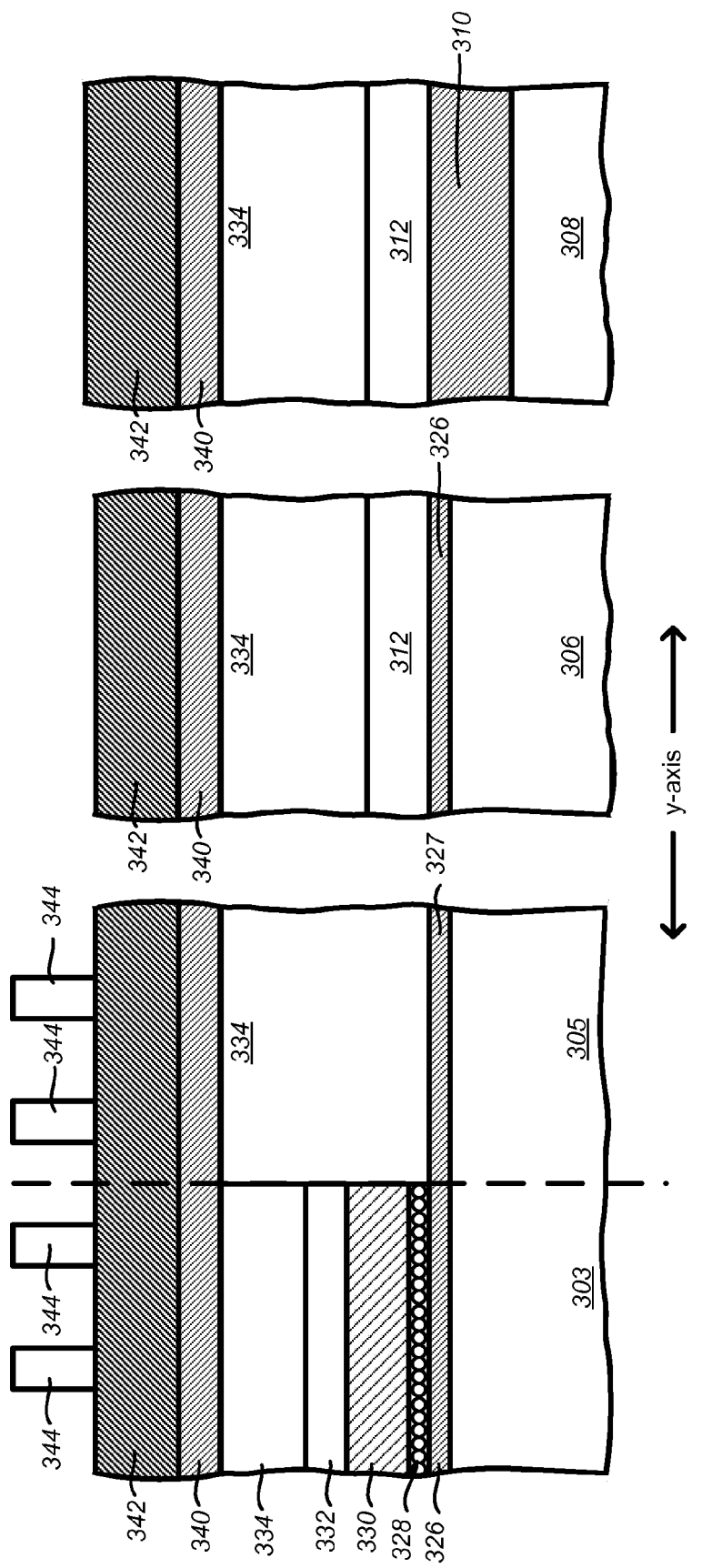

FIG. 6P depicts cross-sectional views of the device taken along lines in the direction of the y-axis (column direction) as shown in FIG. 6O. Cell area 303 is depicted with select gate region 305 in a cross-sectional view taken along line C-C, peripheral circuitry area 306 is depicted in a cross-sectional view taken along line D-D and peripheral circuitry 308 is depicted in a cross-sectional view taken along line E-E.

Figure 6Q:
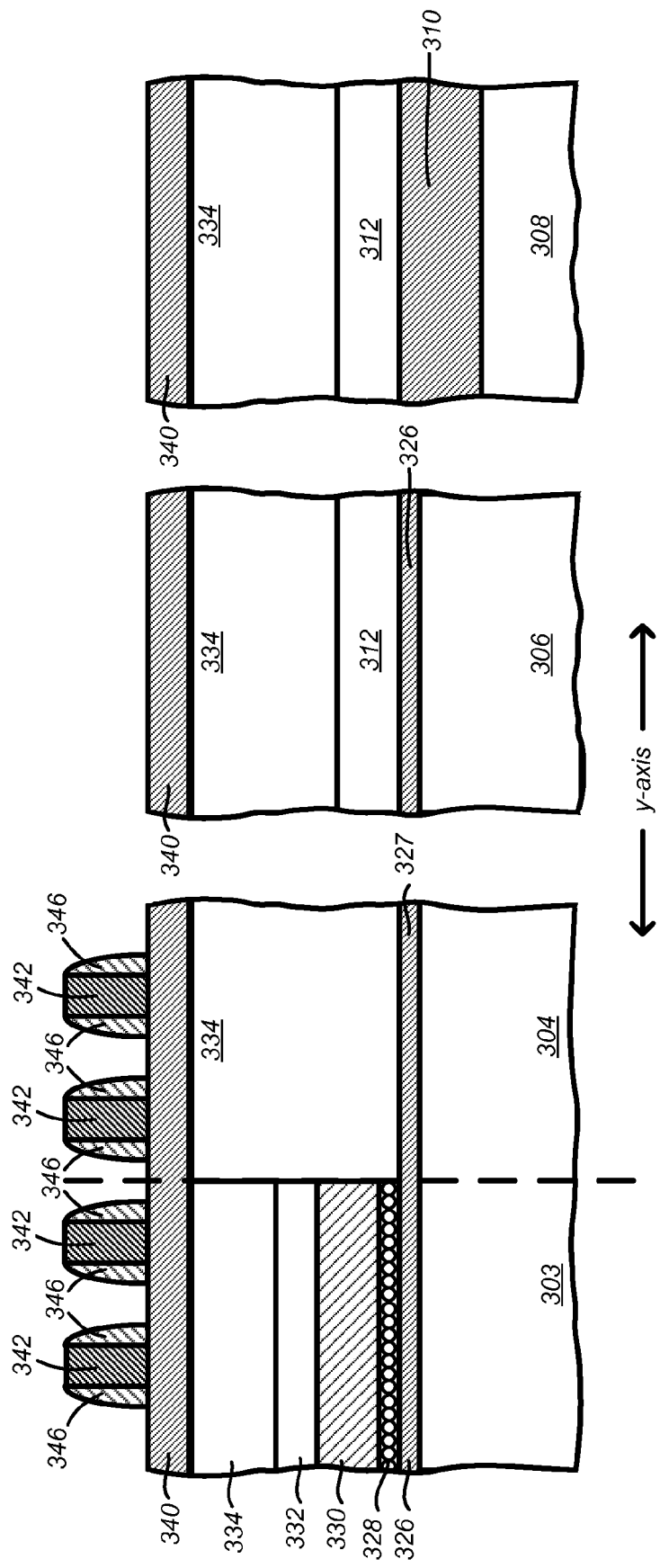

Pad layer 340 (e.g., nitride or oxide) is formed over the second conductive layer, followed by a buffer layer 342 (e.g., nitride or oxide). The buffer layer is patterned, for example, by forming strips of photoresist elongated in the direction of the x-axis with spacing therebetween in the direction of the y-axis. The pattern is applied at the cell area 303 and select gate area 305, while the peripheral circuitry areas 306 and 308 remain unpatterned. Using the pattern as a mask, the buffer layer is etched into strips elongated in the direction of the x-axis as shown in FIG. 6Q. Etching consumes the buffer layer 342 at the peripheral circuitry areas. After patterning and etching the buffer layer, spacers 346 are formed along the vertical sidewalls of the strips. A layer of spacer material (e.g., polysilicon) is conformally deposited over the substrate and then etched back to form the spacers. Etching back the spacer material removes it from the peripheral circuitry areas.

Figure 6R:
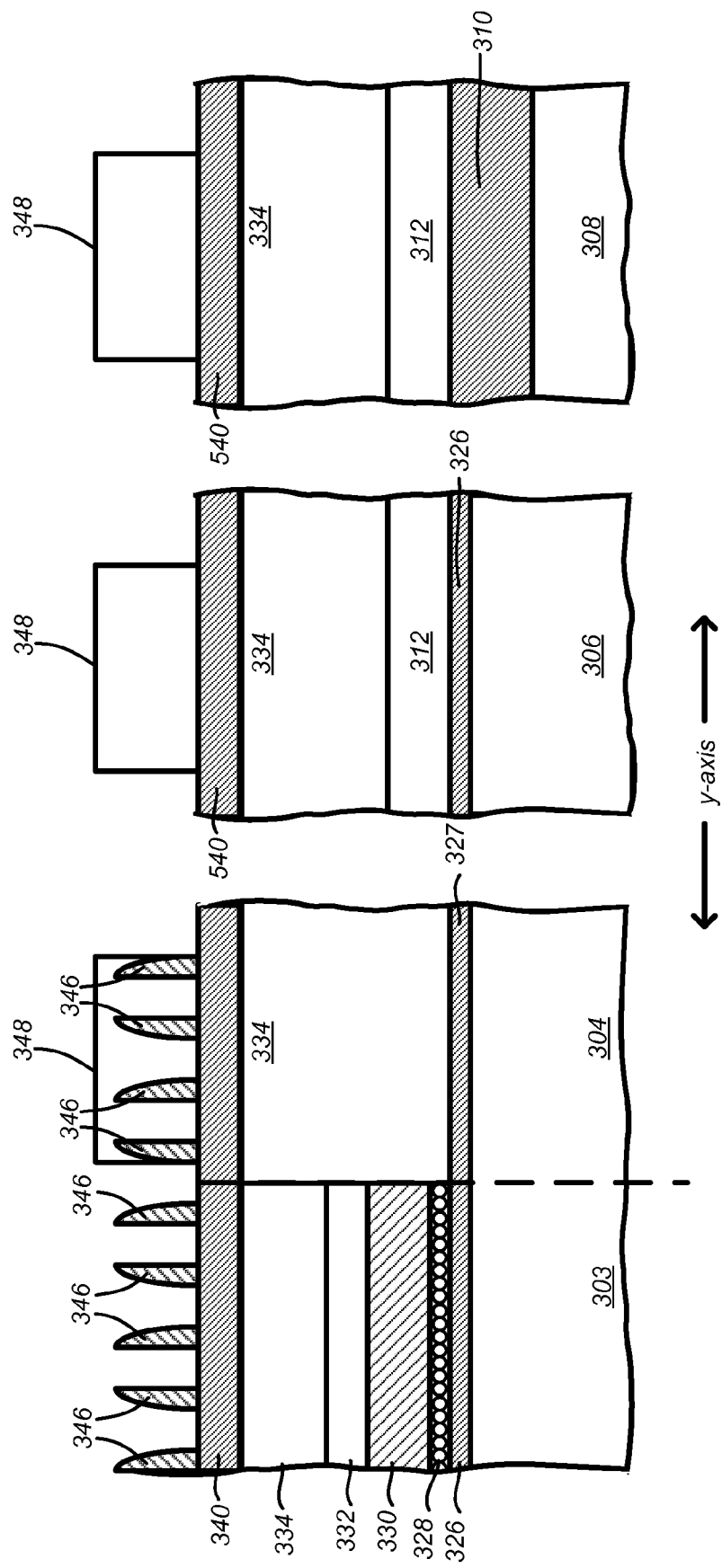

After forming the spacers, the strips of buffer layer 342 are stripped, for example by a chemical wet etch as shown in FIG. 6R. The resulting spacers 346 form a pattern, with the lines of the spacer features having a dimension in the y-axis direction corresponding to a target gate length for the nanostructure charge storage regions. The spacers define a pattern, repetitive in the first or column direction, which defines a second direction of etching to form rows of the targeted memory array.

After stripping the buffer layer, strips 348 of photoresist are applied at the select gate area and peripheral circuitry areas. The strips have a dimension in the y-axis direction corresponding to a target gate length for the peripheral transistors and select gates. The strips may have different y-axis dimensions at the select gate area and within the peripheral circuitry area.

Figure 6S:
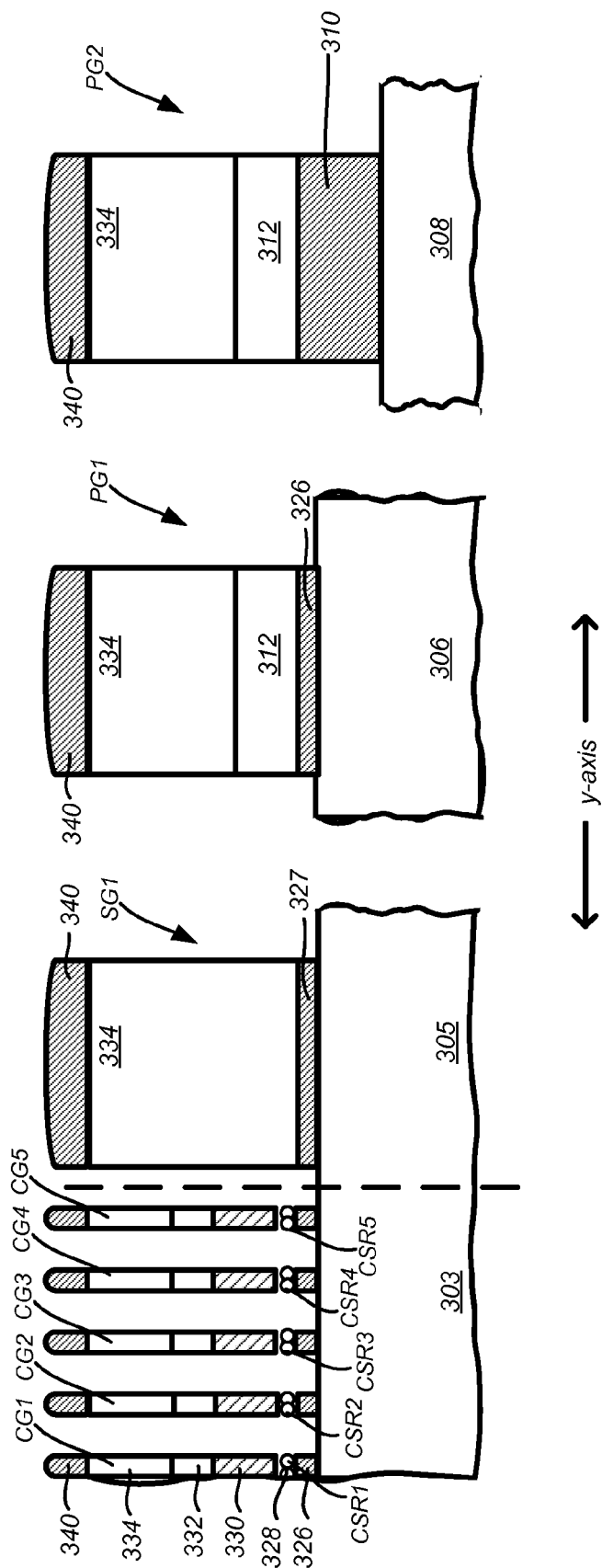

Using the strips 348 of photoresist and the spacers 346 as a pattern, the layer stack is etched as shown in FIG. 6S. Etching the second conductive layer 334 at the cell region 303 forms word lines or control gates CG1-CG5 elongated in the x-axis direction. Etching the first conductive layer 312 and the second conductive layer 334 at the select gate region 305 forms the gate of a select gate structure SG1. Etching the first conductive layer 312 and second conductive layer 334 at the peripheral areas forms gates peripheral transistors PG1 and PG2. In this example, etching forms strips of the second conductive layer that are continuous across a row of memory cells, select gates or peripheral transistors. These strips can form select gate lines and peripheral transistor select lines Each strip 328 of the nanostructure coating is etched into a plurality of individual charge storage regions CSR1-CSR5. Etching according to the spacer pattern defines a gate length of each individual charge storage region in the column or direction of the y-axis. Each charge storage region 329 includes a plurality of nanostructures forming an array within the charge storage region. The array has a dimension in the direction of the y-axis and x-axis with multiple nanostructures. Although a monolayer of nanostructures is depicted in this example, other embodiments may include multiple layers of nanostructures. Accordingly, the array of nanostructures forming a charge storage region in such an embodiment would have a dimension in a direction perpendicular to the surface of the substrate with multiple nanostructures.

Various backend processes can be performed to finalize fabrication of the array. For example, a passivation dielectric layer can be deposited, followed by forming metal conductive lines and vias to connect the lines with source and drain regions at the end of the memory cell strings, etc.

In another embodiment, nanostructure based charge stored regions are integrated with the formation of peripheral and select gate circuitry without a selective curing and removal process as depicted in FIGS. 6A-6S. FIGS. 8A-8L are cross-sectional views depicting the formation of a memory array and it's supporting peripheral circuitry in accordance with such an embodiment.

Figure 8A:
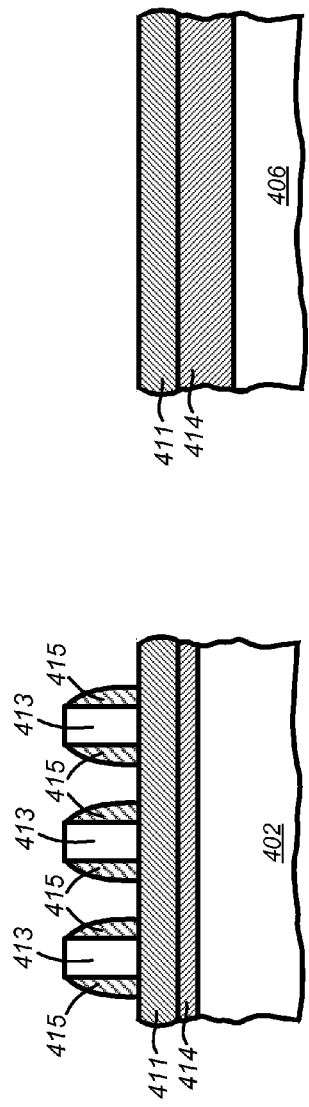

FIG. 8A is a cross-sectional view of the device in the word line direction (along the x-axis) showing a memory array area 402 and a peripheral circuitry area 406 of the substrate. A first dielectric layer 414 is formed over the substrate at the memory array area 402 and peripheral circuitry area 406. The first dielectric layer can include an oxide such as silicon dioxide or any other suitable insulating material. In one example, the first dielectric layer is deposited to a depth of about 10 nm. Over the first dielectric layer is formed one or more pad layers 411 (e.g. oxide and/or nitride), followed by strips 413 of a buffer material (e.g., oxide). The buffer material can be formed, followed by patterning and etching at the memory array area 402 to define the strips. The peripheral circuitry area 406 can remain unpatterned to remove the sacrificial material completely at that area. A layer of polysilicon or other suitable spacer material is then deposited and etched back to form spacers 415 at the memory array area. A conformal deposition process can be used to form the polysilicon along the sidewalls of the strips of buffer material and over the pad layer(s). An etch back process is applied to remove the polysilicon from the pad layer, thus forming spacers. Etching back completely removes the polysilicon from the peripheral area.

Figure 8B:
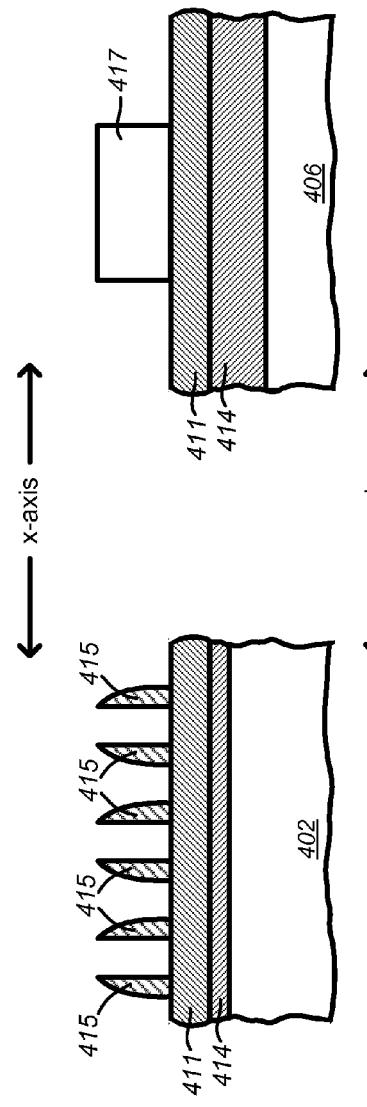
Figure 8C:
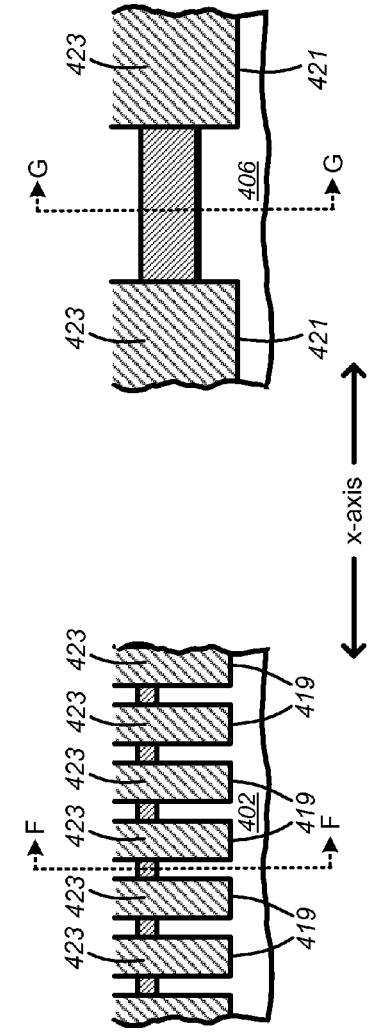

The strips of buffer material are then removed as shown in FIG. 8B, using a chemical wet etch or other suitable process to strip the oxide from the pad layers(s) 411. The remaining spacers 415 form a pattern for etching isolation trenches and defining active areas in the substrate with electrical isolation therebetween. A pattern 417 (e.g., photoresist) is then formed at the peripheral circuitry area 406. After forming pattern 417, the spacers and pattern are used as a mask to etch the underlying layerstack as shown in FIG. 8C. The spacers and pattern can be used to etch the pad layer 411, followed by using the pad layer 411 as a mask to etch the dielectric layer 414. Etching divides the dielectric layer 414 into strips elongated in the y-direction. Etching continues into the substrate, defining isolation trenches 419 at the memory array area and isolation trenches 421 at the peripheral circuitry area. After etching trenches, the isolation trenches are gap-filled with a suitable dielectric 423 such as silicon oxide. After filling the trenches, the remaining portions of the pad layer are removed. As FIG. 8C depicts, by stripping the nitride after filling the trenches, the dielectric 423 extends or has protrusions above the substrate surface. The protrusions can be used to self-align lines of a nanostructure coating above active areas of the substrate as was described in FIGS. 6A-6S.

Figure 8D:
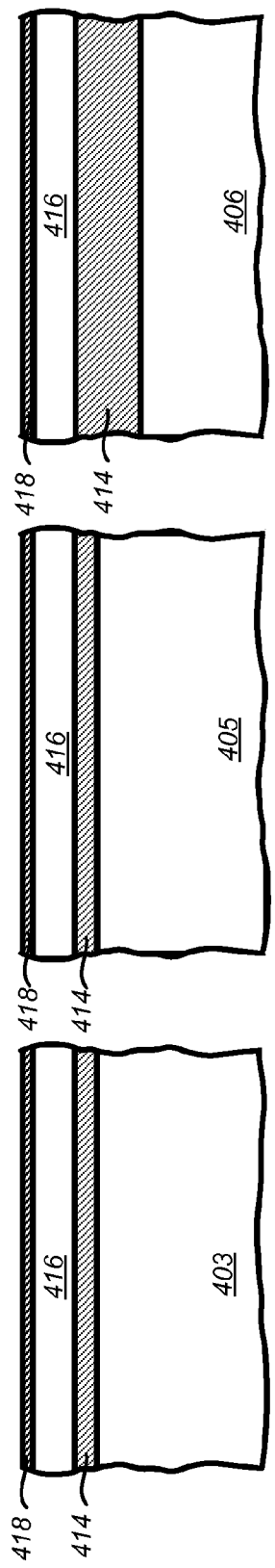

FIG. 8D is a cross-sectional view depicting the device along lines in the direction of the y-axis (column direction) as shown in FIG. 8C. Memory array area 402 is shown in two parts along line F-F, depicting a target cell region 403 and a target select gate region 405. Peripheral circuitry area 406 is depicted in a cross-sectional view taken along line G-G.

Over each area of the substrate is next formed a first conductive layer 416. The first conductive layer may include semi-conductive or conductive materials such as doped polysilicon. In one example, layer 416 is formed to a depth of about 30 nm. A sacrificial layer 418 is formed over the first conductive layer 416. In one example, the sacrificial layer is a silicon nitride cap formed using a deposition process. A pattern (not shown) is applied at the select gate region 405 and peripheral circuitry area 406, while leaving the cell region 403 exposed. In one example, the pattern includes strips of photoresist applied with conventional photolithography techniques for etching the underlying layers. In another example, one or more hard mask and sacrificial layers can be formed and patterned into strips using spacer-assisted patterning techniques for etching the underlying layers. The pattern includes strips elongated in the direction of the x-axis and having a dimension in the direction of the y-axis corresponding to a target gate size for the select gates and the peripheral circuitry transistors. The pattern may be formed with different dimensions at the select gate and peripheral circuitry areas to define different gate lengths.

Figure 8E:
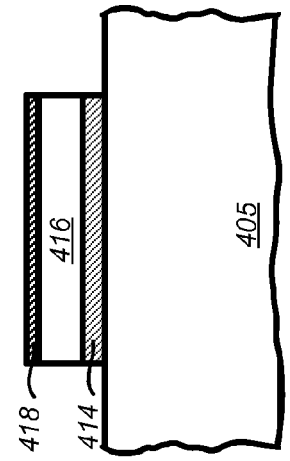
Figure 8E:
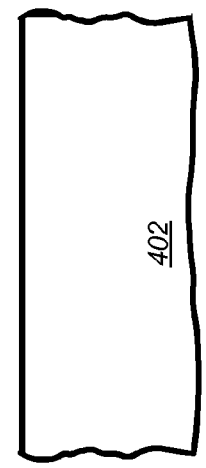

Using the pattern as a mask, the protective conductive and dielectric layers are etched as shown in FIG. 8E. Etching defines a dimension of the select gates in the y-direction and a dimension of the peripheral gates in the y-direction. Etching at the cell area 402 removes all of the first protective layer, first conductive layer and first dielectric layer. Etching at the peripheral circuitry area does not proceed all the way through the first dielectric layer.

A second dielectric layer 424 is then formed as shown in FIG. 8F. In one example, the second dielectric layer is a thermally grown oxide formed to a thickness of about 7 nm-8 nm. The oxide is only grown over the exposed areas of the substrate and the exposed first dielectric layer areas at the peripheral circuitry area 406. The oxide does not grown on or over the first sacrificial layer 418.

A nanostructure layer 426 is then formed over the entire wafer as shown in FIG. 8G. Nanostructure coating 426 can be formed as was described in FIGS. 6A-6S. The nanostructure coating will self-align between adjacent protrusions of the isolation dielectric through a self-assembly process.

After forming the nanostructure layer 426, a third dielectric layer 428 and a barrier metal layer 430 are formed over the substrate as shown in FIG. 8H. In one embodiment, the third dielectric layer is an oxide forming an intermediate dielectric layer for the device, although other materials can be used. Deposition can be used to form the third dielectric layer on all exposed horizontal surfaces. The barrier metal layer is TiN, TaN or TiSiN deposited to a thickness of about 10 nm in one embodiment, although other materials and dimensions can be used. A conformal deposition process is applied in one example such that the barrier metal layer is formed along any exposed horizontal or vertical surfaces such that the layer encapsulates the third dielectric layer at the select gate and peripheral circuitry areas.

A mask layer 432 is then formed using standard photolithographic etch processes to cover the cell area entirely and form patterned strips at the select gate and peripheral circuitry areas. The mask layer may include photoresist and/or one or more hard masking layers. At the select gate area 405 and peripheral circuitry area 407, the pattern exposes the second sacrificial layer at positions above the underlying gates formed from first conductive layer 416. The exposed areas correspond to or are larger than the dimensions of the gate areas in the direction of the y-axis. The barrier metal layer is conformally formed over the upper surface of the third dielectric layer and along the exposed sidewalls of the third dielectric layer above the gate regions from layer 416. This creates an offset from the edge of the gate region equal to the thickness of the barrier metal layer. Accordingly, the exposed areas are larger than the first dimension(s) of layer 416 by twice the thickness of the barrier metal layer.

Figure 8J:
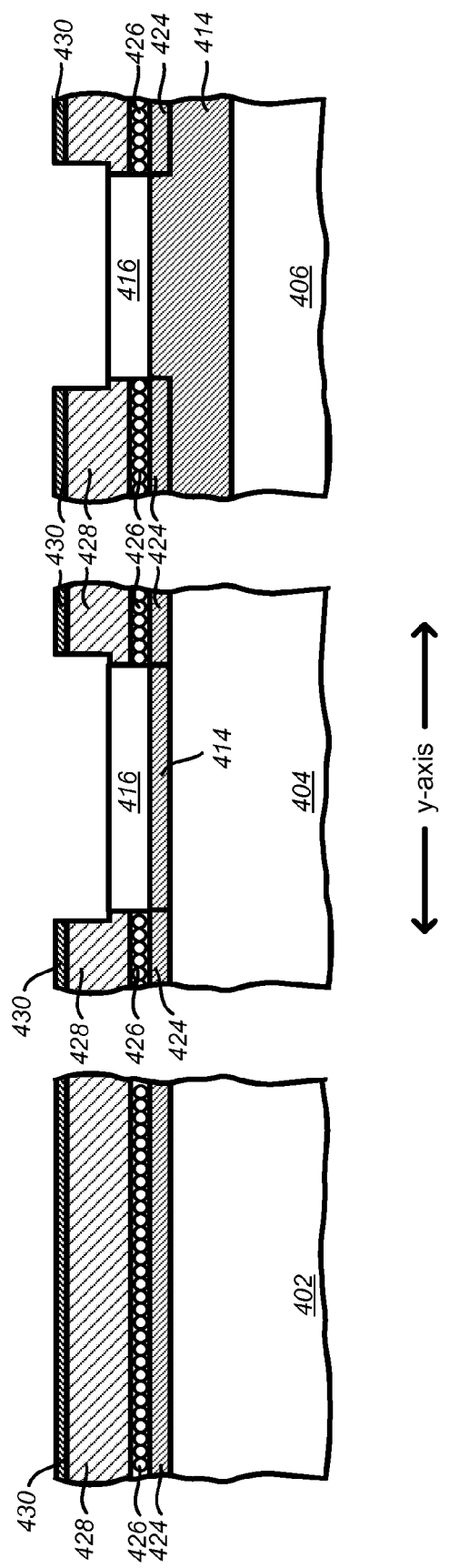

Using the mask, etching is performed as depicted in FIG. 8I. Etching continues until reaching the sacrificial layer 418. Etching removes the barrier metal layer 430, the third dielectric layer 428, and the nanostructure layer 426 at positions exposed by mask 432. Various etch chemistries can be applied to selectively remove the various layers of the layer stack. A wet etch process is then applied to strip the nitride sacrificial layer 418 from atop the gates formed from the first conductive layer 416 as shown in FIG. 8J.

Figure 8K:
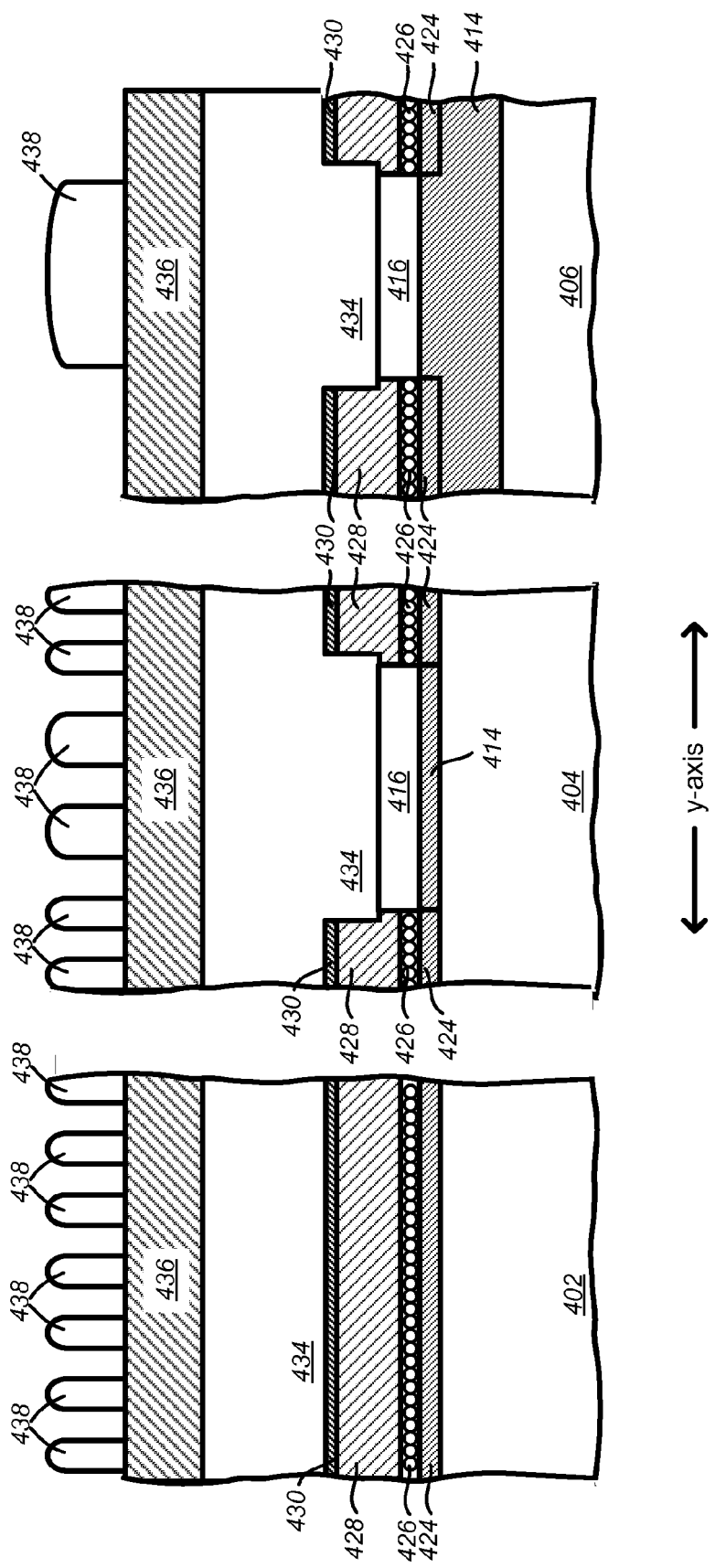

After etching, a second conductive layer 434 is formed over the entire wafer as shown in FIG. 8K. In one example, the second conductive layer is a layer of doped polysilicon deposited to a depth of about 300 nm. The second conductive layer fills the openings created by the previous etching at the select gate and peripheral transistors areas and overlies the barrier metal layer at the cell region 403, select gate region 405 and peripheral circuitry area 406. Chemical mechanical polishing or other suitable processes can be applied to create a substantially planer surface of the second conductive layer after formation.

After depositing the second conductive layer 434, a hard mask layer 436 is formed over the entire wafer. A third pattern 438 is then applied over the hard mask layer as shown. The third pattern 438 is applied for etching the individual storage elements, select gates and peripheral transistor gates. In one example, pattern 438 is formed of strips of photoresist extending in the direction of the x-axis. In another example, spacer assisted patterning can be used to create a pattern at less than the minimum resolvable feature size of the lithographic process being employed. For example, a layer of oxide can be applied over a nitride hard mask layer 436 in one example. After forming the oxide, it can be etched into sacrificial features elongated in the x-direction. A layer of conformal polysilicon can be deposited and etched back to form spacers along the substantially vertical side walls of the sacrificial features. After forming the spacers, the oxide can be removed by an etch process that is selective resulting in poly silicon spacers corresponding to pattern 438.

At the cell area, each patterning strip 438 has a dimension in the direction of the y-axis corresponding to a target gate length for the memory cells. At the select gate area, the patterning strips have a dimension in the direction of the y-axis corresponding to a target gate length for the select gate transistors. At the peripheral circuitry area, the strips have a dimension in the y-axis corresponding to a target gate length of the peripheral transistor gates. Note that at the select gate area 404, the first two pattern strips 438 on the left-hand side correspond to memory cells and the rightmost strips 438 also correspond to memory cells, whereas the middle two strips correspond to targeted select gates. Using the patterning strips 438 as a mask, etching is performed that results in the structure shown in FIG. 8L. Etching proceeds through the hard mask layer, the second conductive layer 434, the barrier metal layer 430, the third dielectric layer 428, the nanostructure layer 426 and the second dielectric layer 424 at the memory cell area 402. At the select gate area, etching proceeds through the hard mask layer 436, the second conductive layer 434, the first conductive layer 416 and the first dielectric layer 414. Similarly, at the peripheral transistor area, etching proceeds through the hard mask layer 436, second conductive layer 434, first conductive layer 416 and the first dielectric layer 414.

Figure 8L:
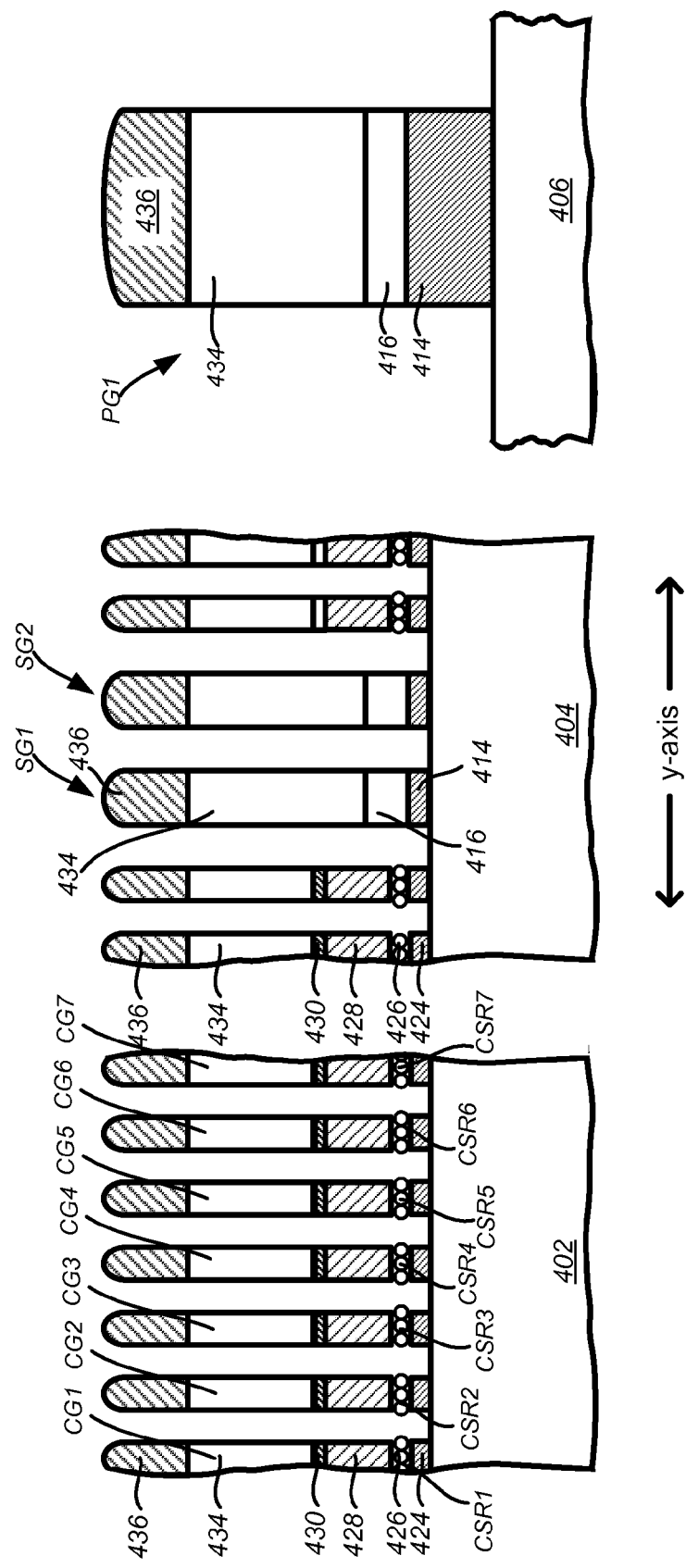

Using pattern 438 as a mask, etching proceeds as shown in FIG. 8L creating control gates CG1-CG7 at the cell area from layer 434 and individual nanostructure array charge storage regions CSR1-CSR7 from nanostructure coating 426. At the select gate region, a select gate SG1 is formed from second conductive layer 434 and first conductive layer 416. Similarly, at the peripheral circuitry area, a gate is formed from second and first conductive layers 434 and 416 for a transistor PG1 including the gate dielectric formed from the first dielectric layer 414.

FIGS. 9A-9G are cross-sectional views showing an alternate embodiment of the second example where gate level spacers are used to prevent or reduce oxide growth on the first conductive layer when forming the tunnel dielectric layer at the memory cell array area. The initial processing steps are the same as those described in FIGS. 8A-8E. A first dielectric layer is formed, followed by forming isolation trenches 419 and 421 in the substrate. A first conductive layer and first sacrificial layer are then formed, patterned and etched to form the structure shown in FIG. 8E.

Turning to FIG. 9A, a set of spacers are then formed at the select gate area 405 and peripheral circuitry area 406. In FIG. 9A, a second sacrificial layer 420 has been applied over the entire substrate. The sacrificial layer is formed over the exposed portions of the substrate at the cell area 403, select gate area 405 and peripheral circuitry area 406 and over sacrificial layer 418 at the select gate and peripheral circuitry areas. A conformal deposition process can be used such that layer 420 further extends along the vertical sidewalls of layers 418, 416 and 414 that result from the etching shown in FIGS. 8A-8E. In one example, the second sacrificial layer is a layer of high temperature oxide (HTO) deposited to a thickness of about 10 nm. After forming layer 420 as shown in FIG. 9A, the spacer material is etched back to remove layer 420 from any horizontal surfaces as shown in FIG. 9B. Etching completely removes the second protective layer from the cell area 403 as well as the horizontal portions exposed at select gate area 405 and peripheral circuitry area 405. Etching back material 420 forms spacers 422 at the select gate and peripheral circuitry areas. The spacers extend along the vertical side walls of the strips of sacrificial layer 418, conductive layer 416 and first dielectric layer 414. The spacers extend from the substrate surface to the upper surface of layer 418 and are elongated in the direction of the x-axis across the substrate surface.

Figure 9C:
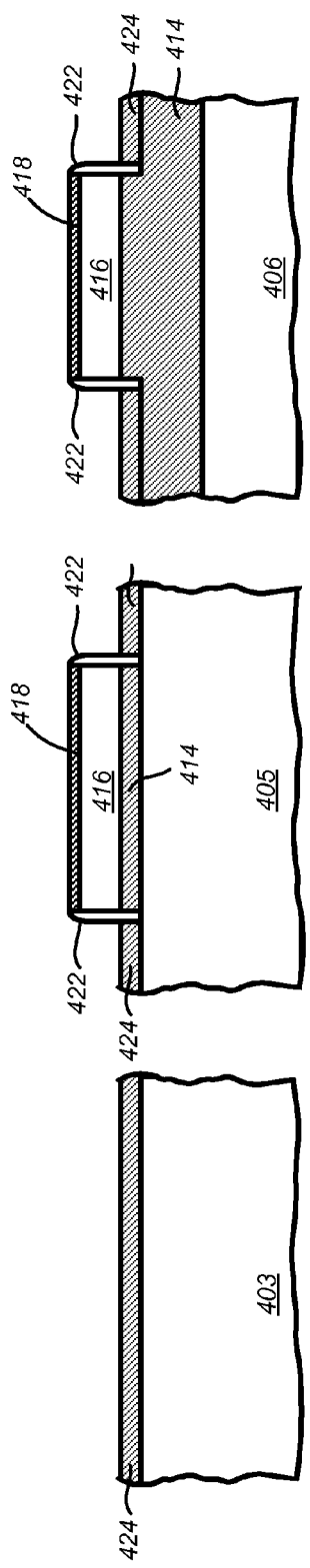
Figure 9D:
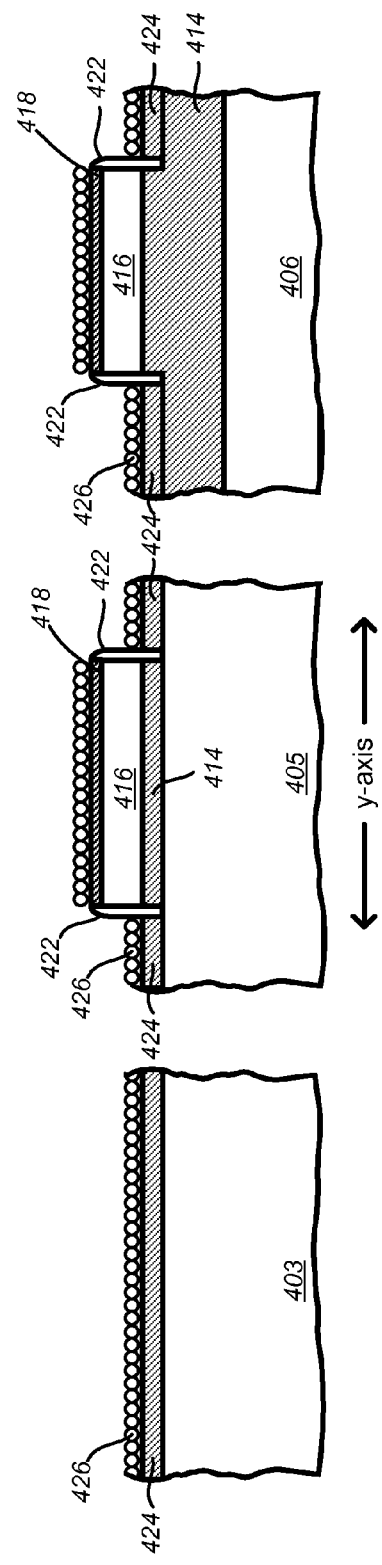
Figure 9E:
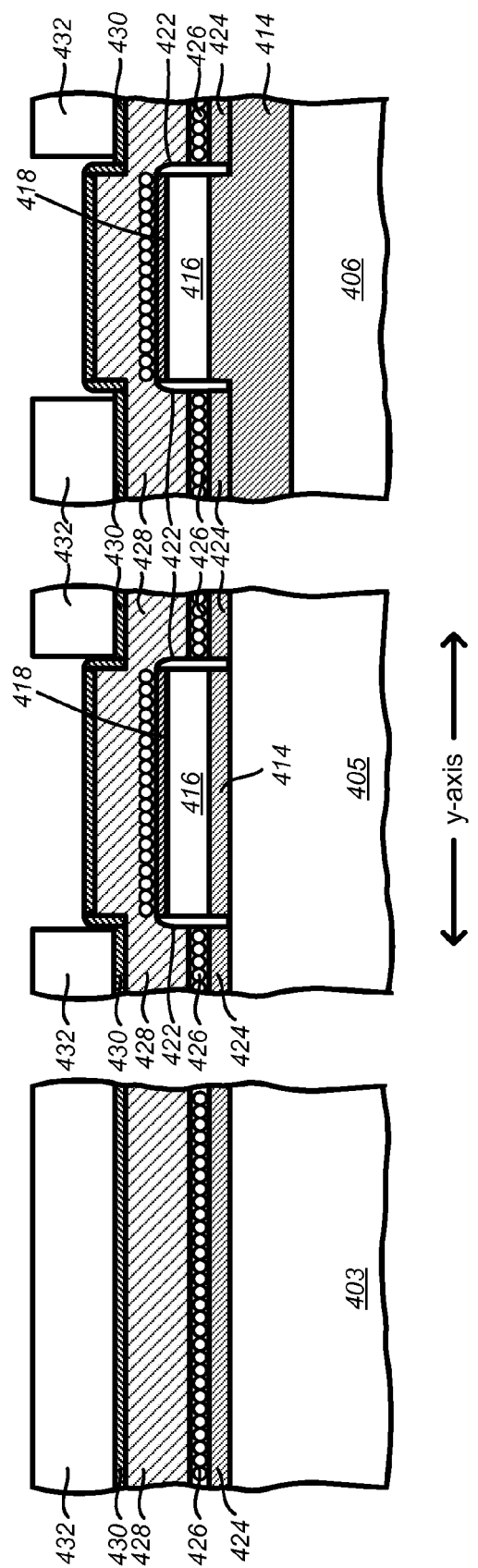
Figure 9F:
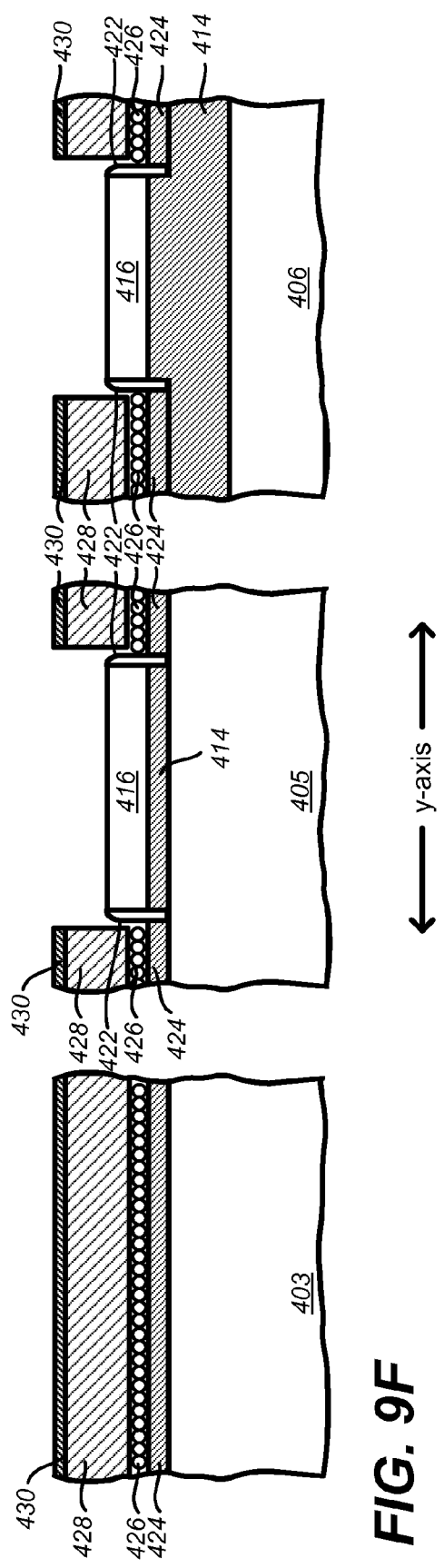
Figure 9G:
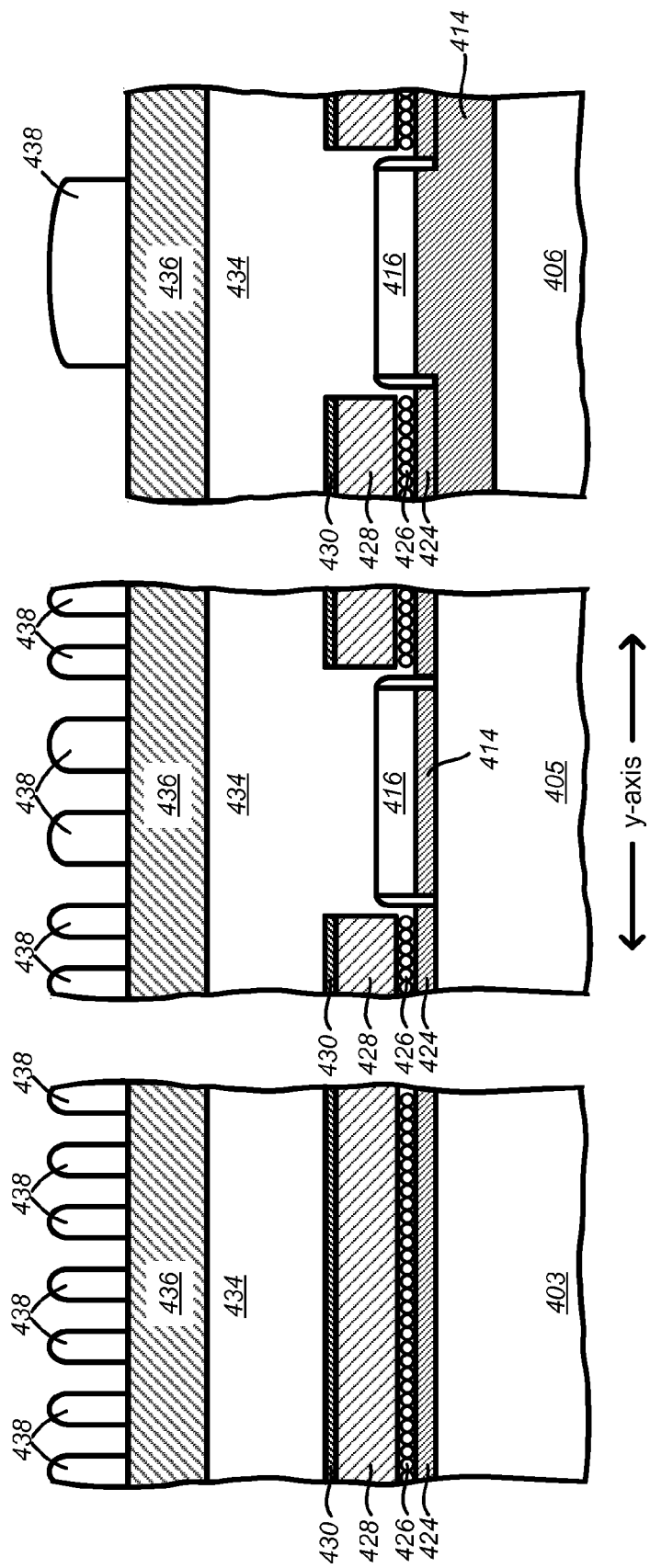
Figure 9H:
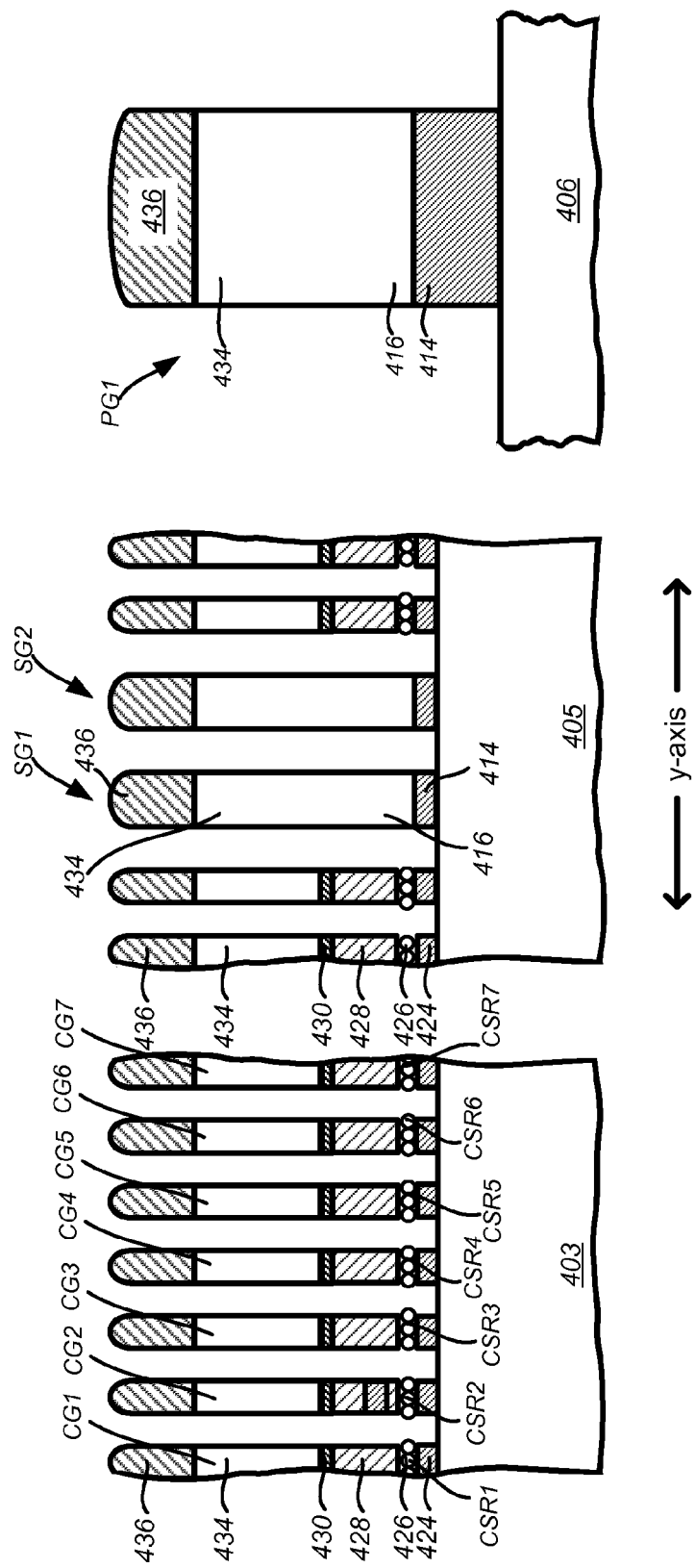

With spacers 422 protecting the sidewalls of the layer stack strips from oxidation, the second dielectric layer 424 is grown over the exposed portions of the substrate as depicted in FIG. 9C. The nanostructure layer 426 is then deposited as shown in FIG. 9D. Next, the third dielectric layer 428 and barrier metal layer 430 are formed as shown in FIG. 9E. Mask layer 432 is then formed and patterned to create a complete cover over the cell region 403 and patterned strips at the select gate region 405 and peripheral circuitry area 407 as earlier described. Using the mask layer, the layer stack is etched as shown in FIG. 9F, followed by stripping the sacrificial material 418 from atop the strips 416 of conductive material The second conductive layer 434, hard mask layer(s) 436 and pattern 438 are then formed as shown in FIG. 9G. The layer stack is then etched in accordance with the pattern to form the structure depicted in FIG. 9H.

In another example, etching is used to remove the nanostructure layer from any undesired areas of the substrate after a shallow trench isolation process. In the third example, the first conductive layer and first dielectric layer are formed before shallow trench isolation. The shallow trench isolation process self aligns the formation of the peripheral circuitry transistor gate lengths in the word line direction. After shallow trench isolation formation, the gate oxide is formed at the cell area followed by the nanostructure layer formation. The nanostructures are self-aligned in the regions between adjacent shallow trench isolation areas. A first etch process using a first mask is performed to remove the nanostructure array layer from the select gate regions. A second etch process using a second mask is performed to remove the nanostructure array layer from the peripheral circuitry area. The first mask and second mask both define patterns extending in the column direction. Additional conductive layers are formed over another dielectric layer to complete the formation of the control gates and select lines.

Figure 10I:
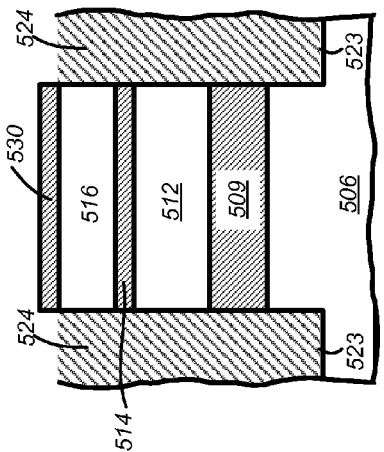
FIGS. 10A-10T are cross-sectional views through a portion of a non-volatile memory array depicting a fabrication process in accordance with one embodiment.
Figure 10I:
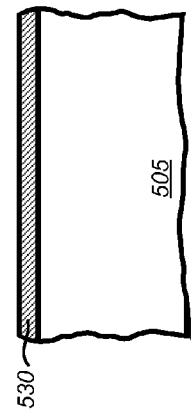
Figure 10I:
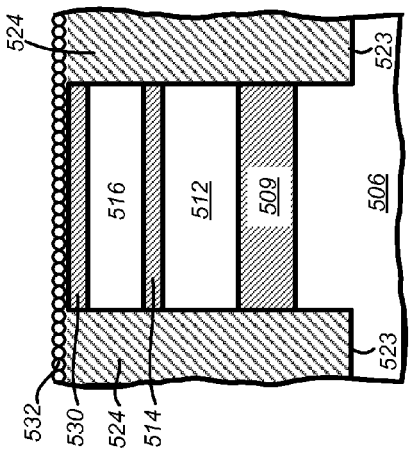
Figure 10I:
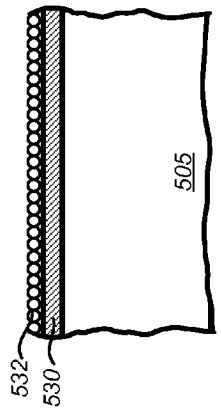
Figure 10I:
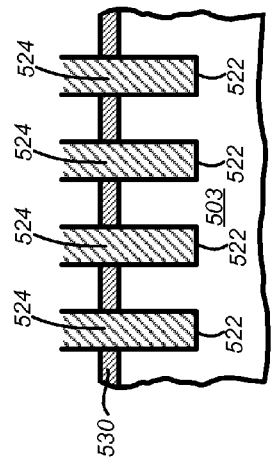
Figure 10J:
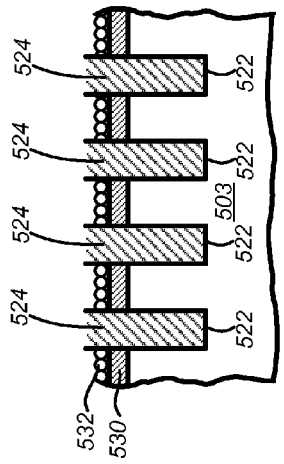
Figure 10K:
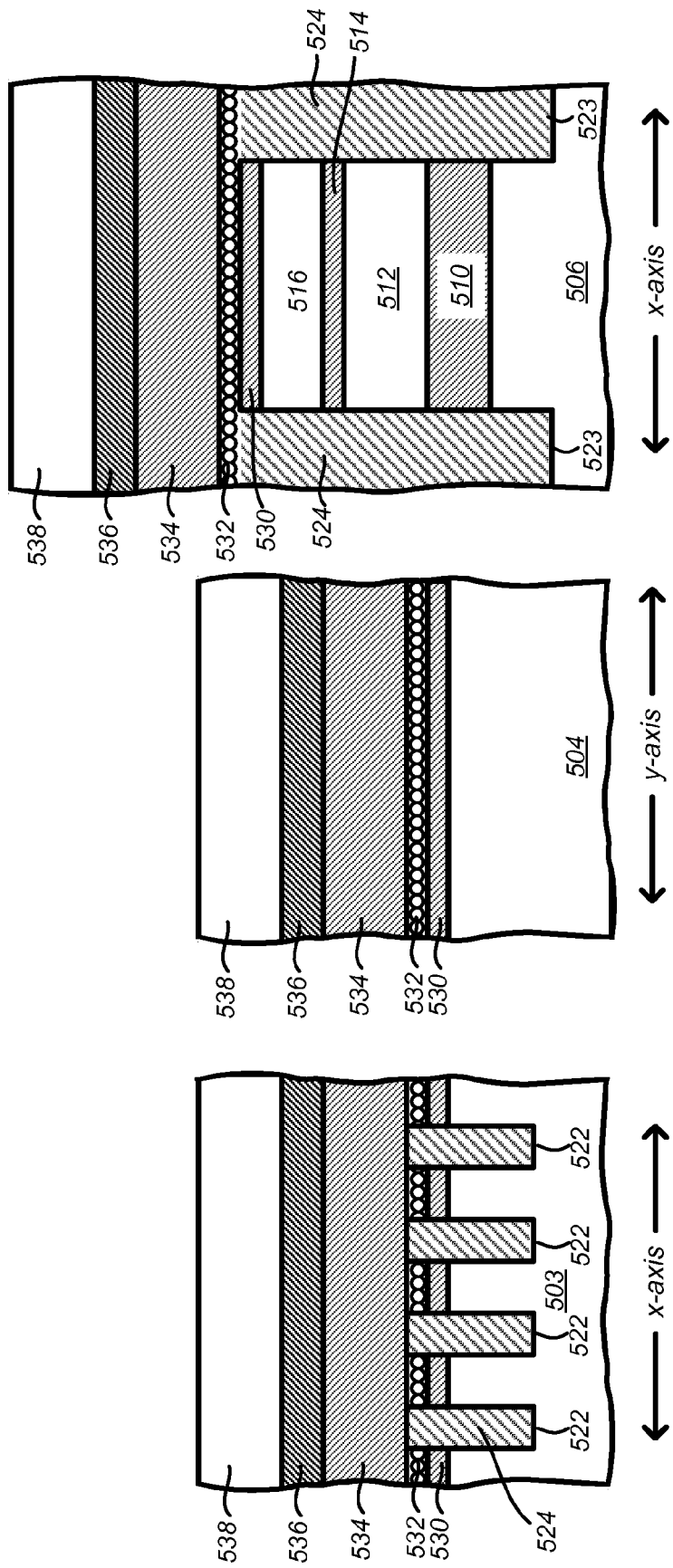
Figure 10L:
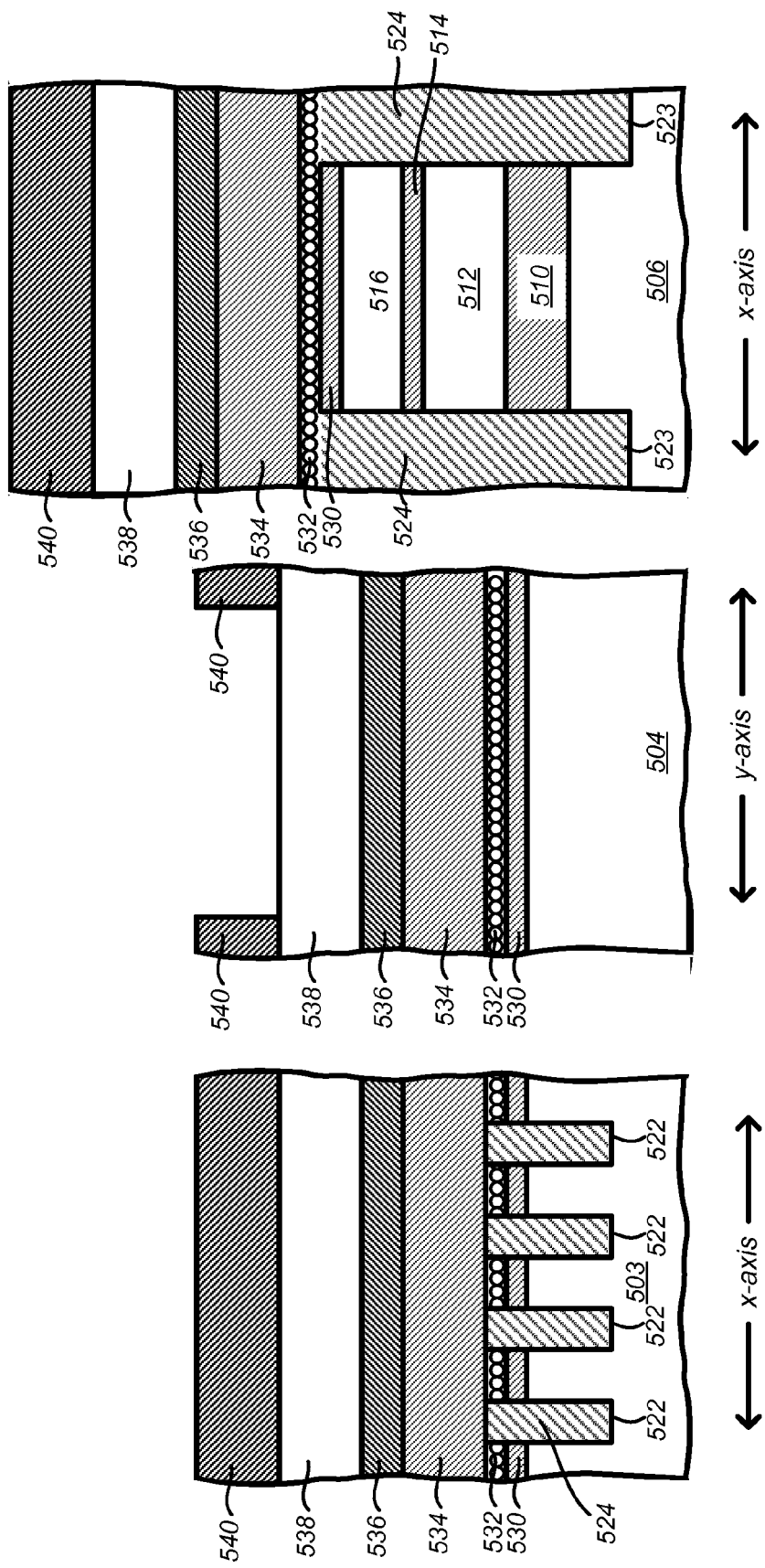
Figure 10M:
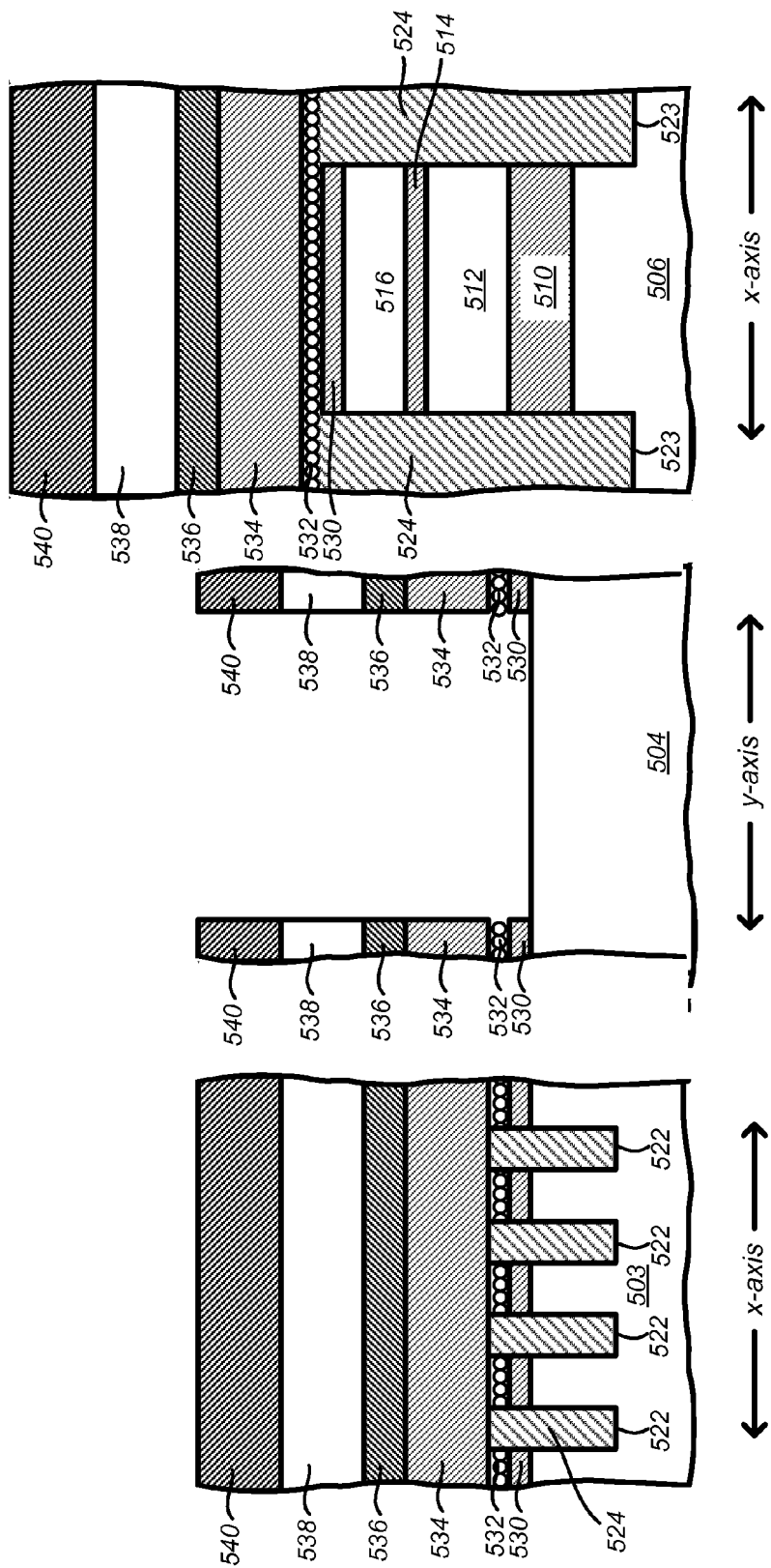
Figure 10N:
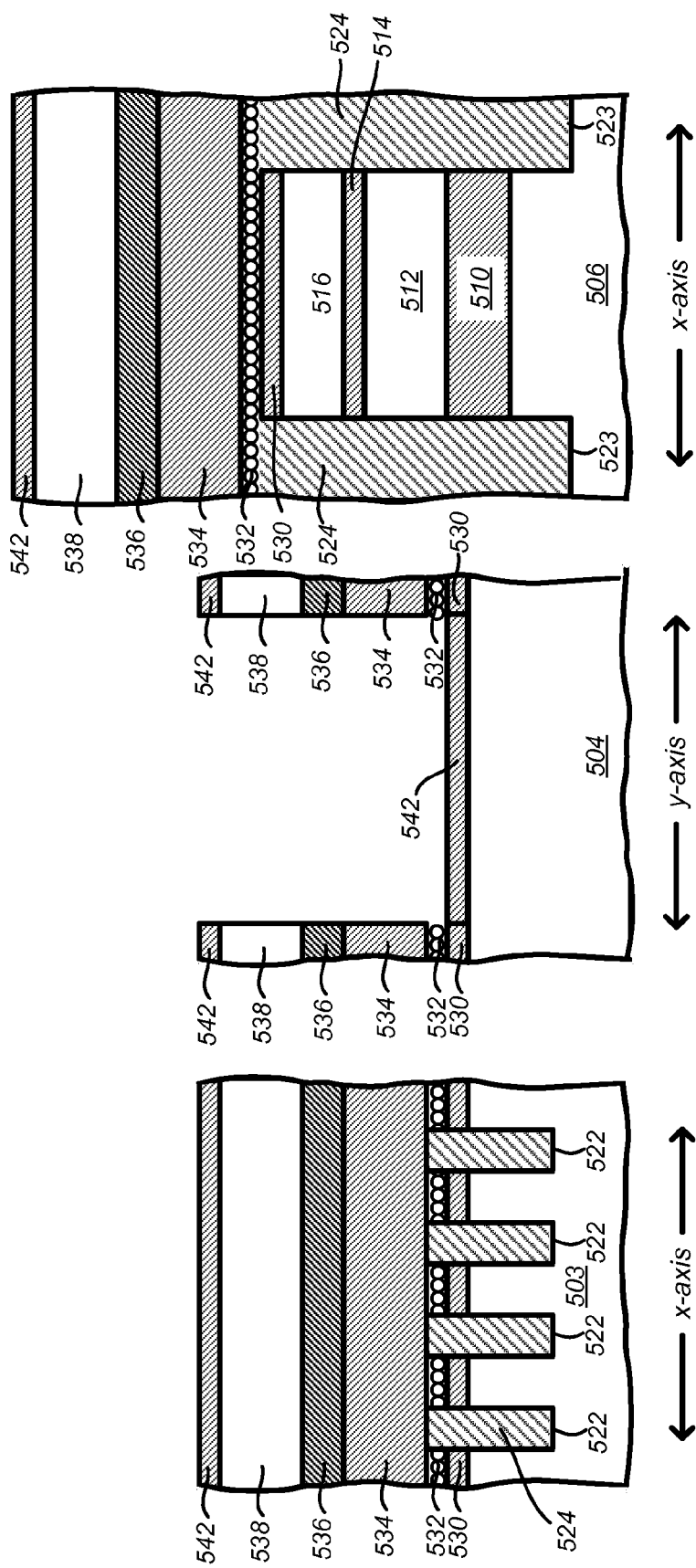
Figure 10O:
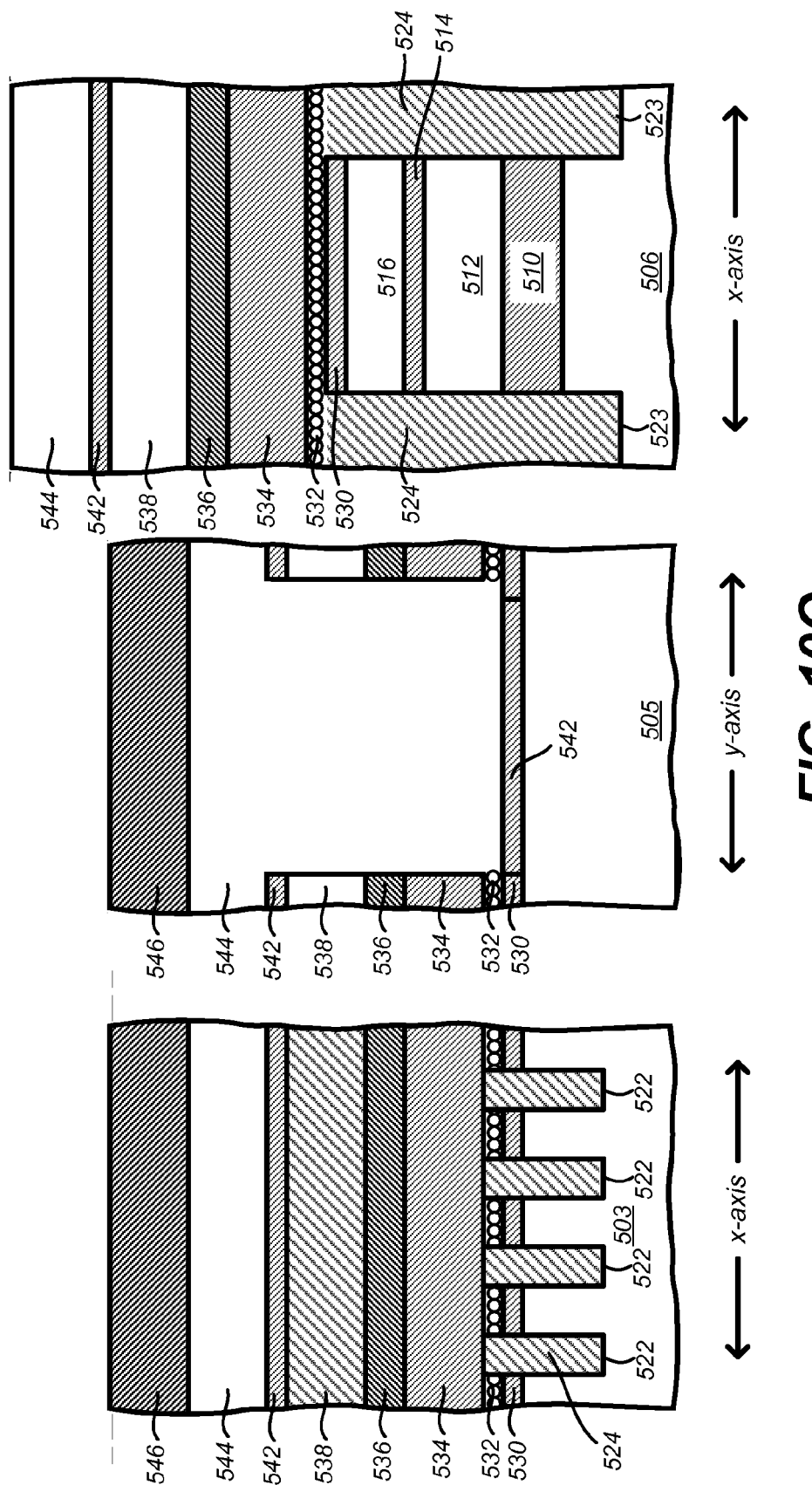
Figure 10P:
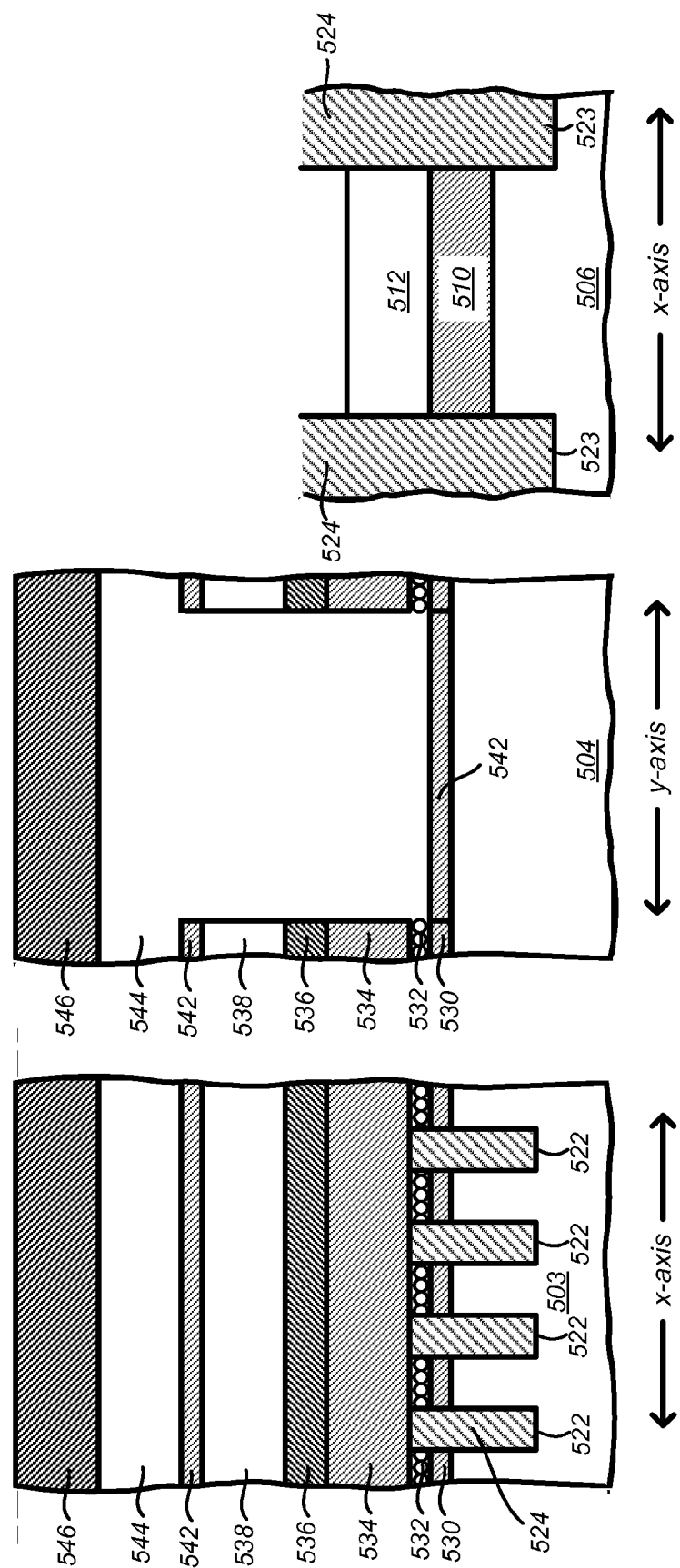
Figure 10Q:
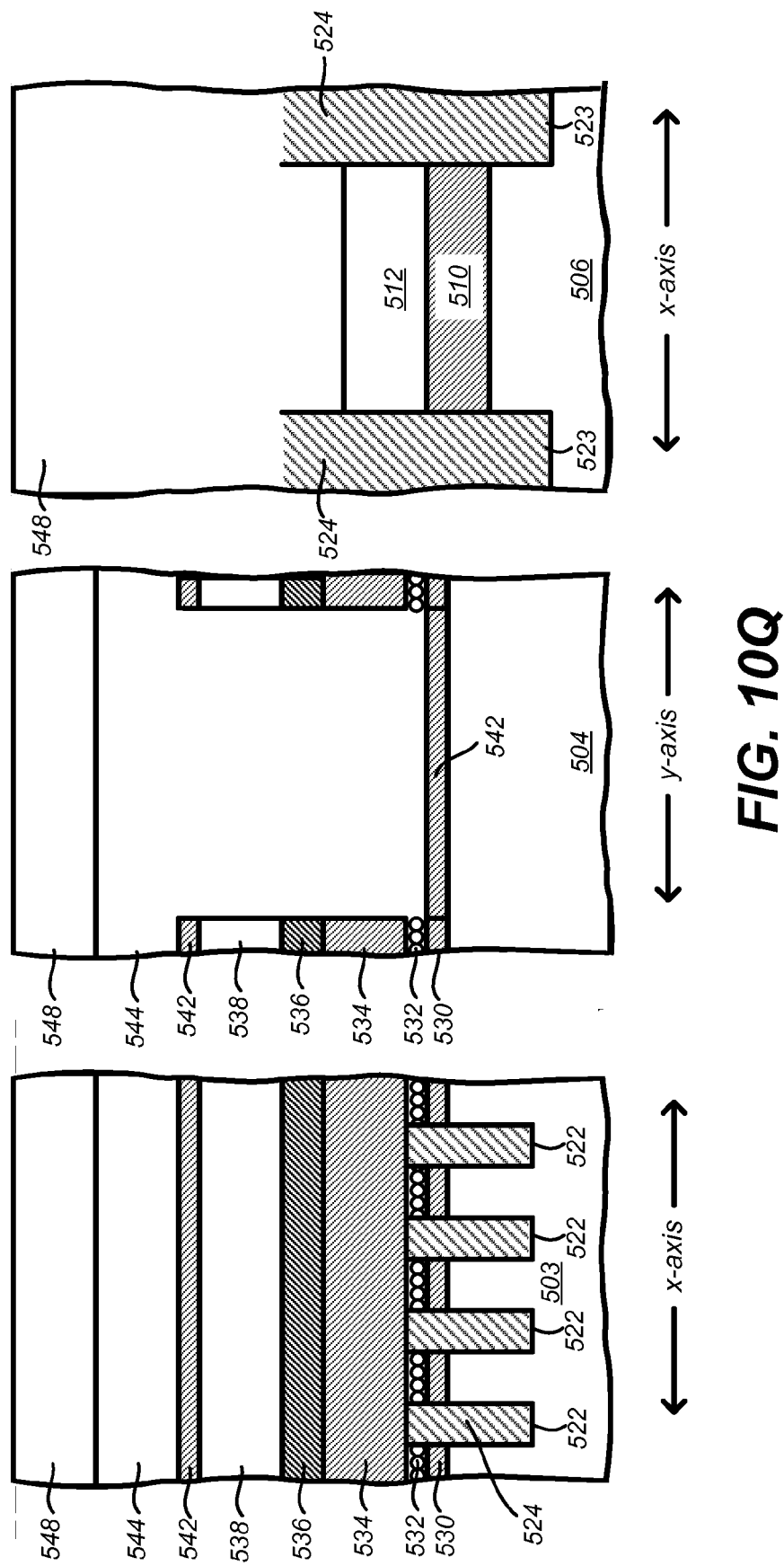
Figure 10R:
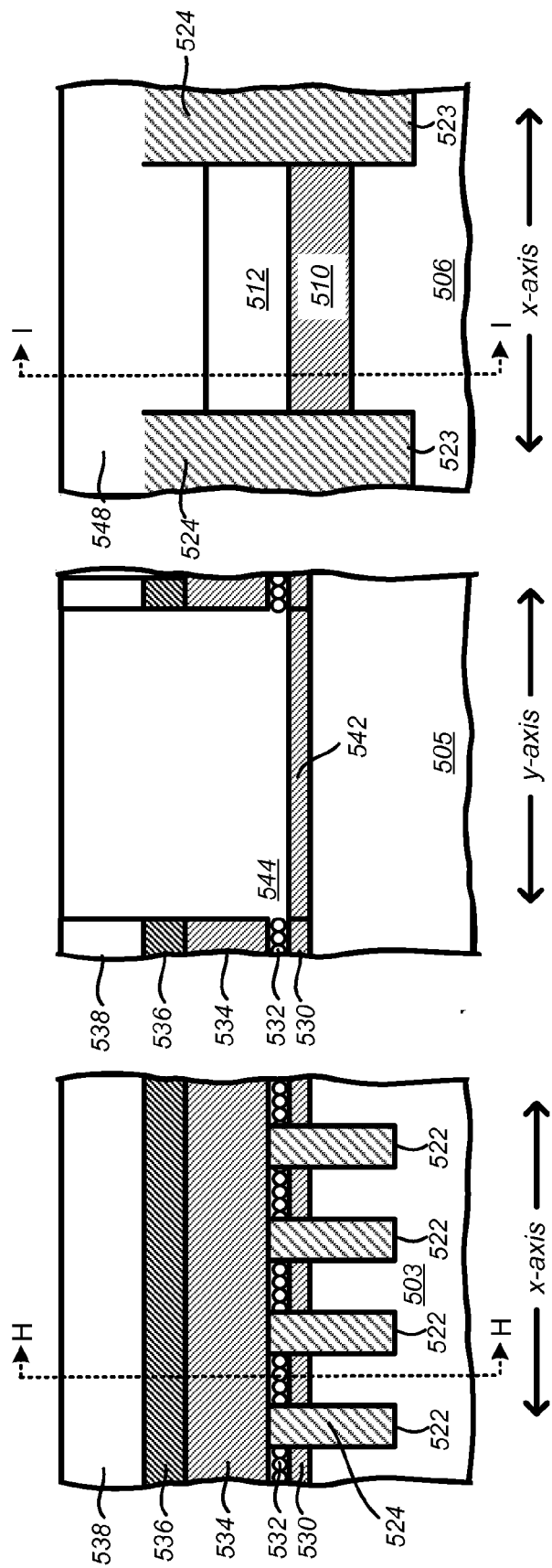
Figure 10S:
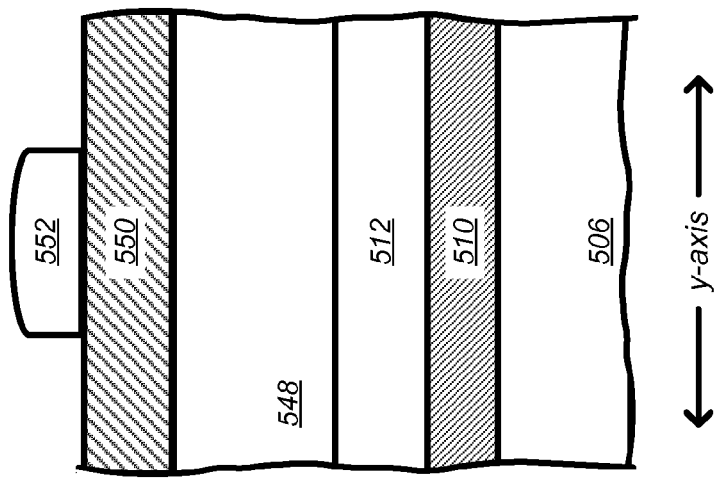
Figure 10S:
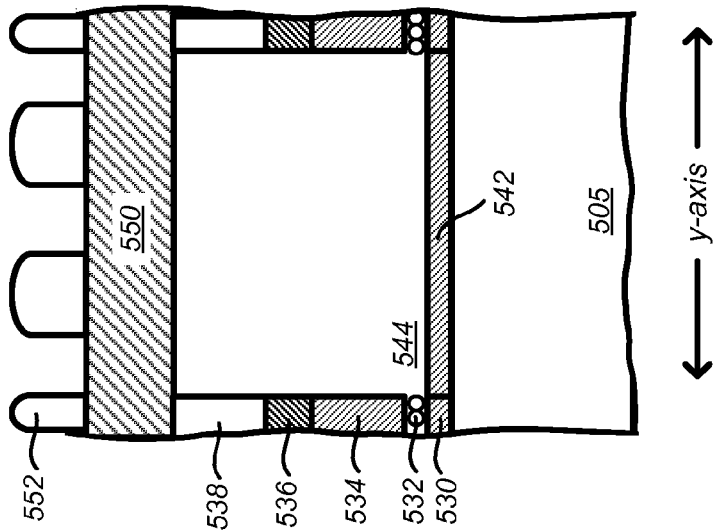
Figure 10S:
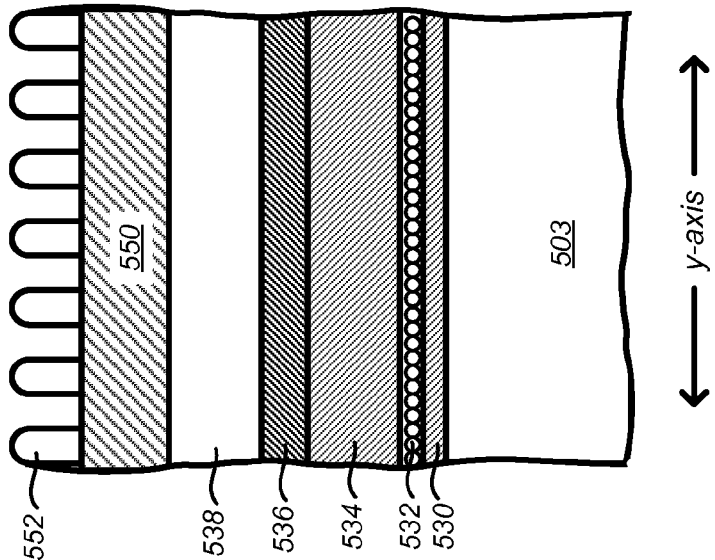
Figure 10T:
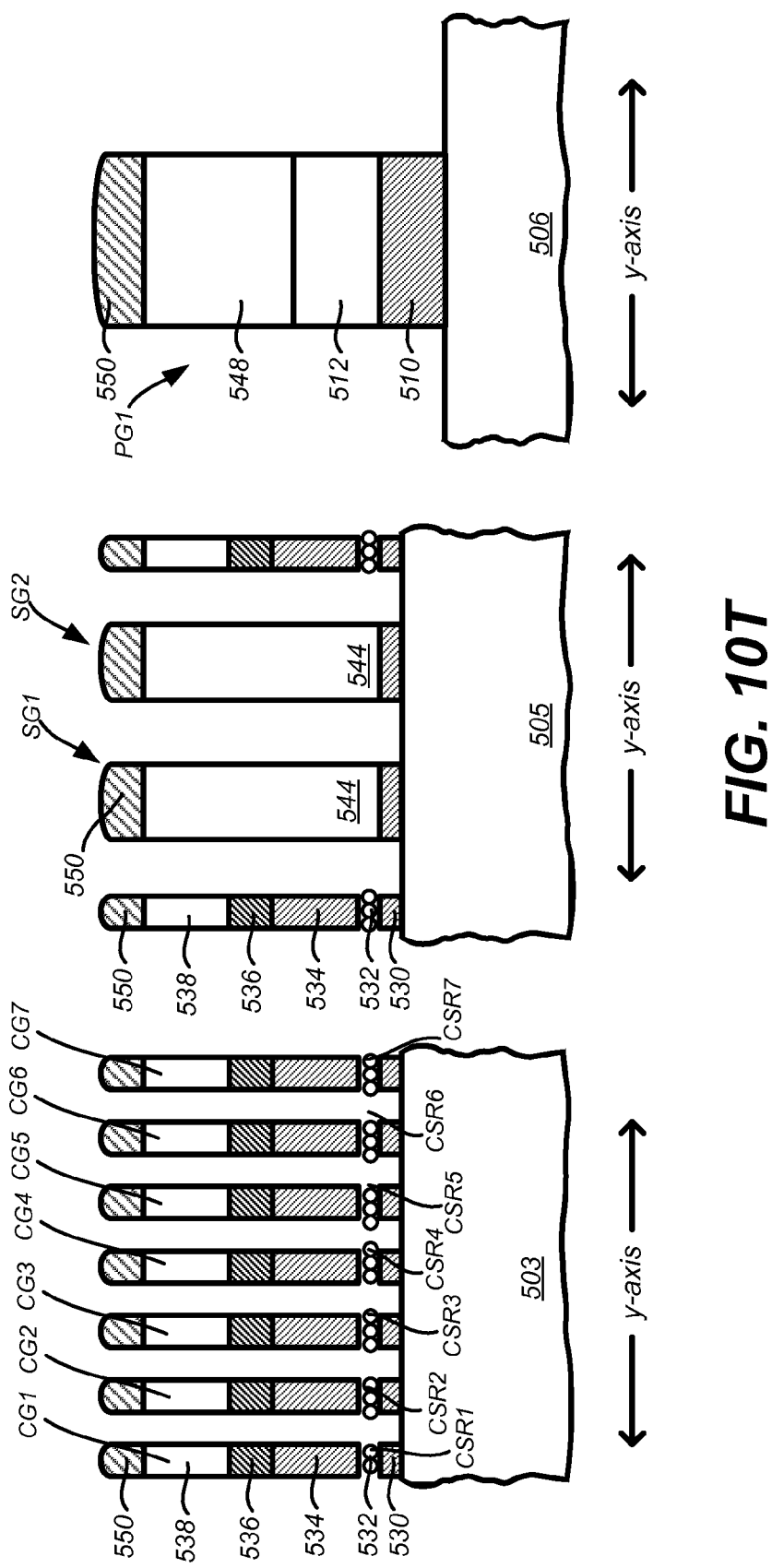

FIGS. 10A-10T are cross-sectional views depicting a fabrication process according to this example. FIG. 10A is a cross-sectional view along the x-axis in the word line direction. FIG. 10A depicts a memory array area 502 and a peripheral circuitry area 506 of the substrate. A high voltage dielectric region 509 is formed at the peripheral circuitry area 506, and a first dielectric layer 510 is formed at the memory array area 502. In one example, the high voltage dielectric region can be formed over the entire substrate, then be removed from the cell area, followed by forming the first dielectric layer over the entire substrate, as described in FIG. 6A. Other techniques can be used to form different thicknesses of the dielectrics overlying and contacting the substrate surface. The dielectrics layers can include any suitable dielectric, such as SiO2 formed by thermal oxidation, and be formed at various dimensions. In one example, the high voltage dielectric region is between 35 nm-40 nm and the first dielectric layer is between 7 nm-10 nm. It is noted that the first dielectric layer is later removed from the memory cell region such that it need not be device level quality.

Over the dielectrics 510 are then formed a first conductive layer 512 and a sacrificial dielectric layer 514. The first conductive layer is polysilicon in one example, but may also include other semiconductor or conductive materials such as metals. The sacrificial dielectric layer is a thermally grown oxide in one example, having a depth between 7 nm-10 nm.

Turning to FIG. 10B, one or more hard masking layers 516 (e.g., SiN, 40 nm) are formed over the second dielectric layer, followed by a pattern 520. Pattern 520 includes strips elongated in the direction of the y-axis with a spacing therebetween in the direction of the x-axis. The dimension of the strips along the x-axis (line size) corresponds to target active areas of the substrate, and the spacing therebetween corresponds to target isolation areas. The strips may be formed of photoresist by conventional photolithography, or be spacers formed by a spacer patterning technique as earlier described.

The layer stack and substrate are then etched using pattern 520 as shown in FIG. 10C. Etching divides the layer stack into strips elongated in the y-direction with spacing therebetween in the x-direction. Trenches 522 and 523 are formed in the substrate, defining active areas between trenches adjacent in the x-direction. The isolation trenches are filled with a suitable dielectric material 524 (e.g., oxide formed by deposition). CMP may be applied to create a planar surface for the subsequent process steps. As shown in FIG. 10D, a protective layer 526 is formed over the layer stack strips and isolation material 524 at the memory array and peripheral circuitry areas. In one example, the protective layer is a high temperature oxide (HTO) deposited to a thickness of about 20 nm.

Turning to FIG. 10E, a strip 528 of photoresist is formed over the peripheral circuitry area. With the photoresist protecting the peripheral circuitry area, the HTO protective layer is removed from the memory array area. After removing protective layer 526, the isolation dielectric 524 is recessed to below the upper surface of the strips of first conductive layer 512. Reactive ion etching may be used to etch protective layer 526 and to recess the isolation dielectric 524. Various amount of recess may be applied. In one example, the isolation dielectric is targeted for 20 nm remaining above the substrate surface after etching. A 90 nm reactive ion etch process can be used in this example. This may include a target etching of 20 nm for removing the protective layer 526, 40 nm to recess the isolation dielectric the thickness of sacrificial layer 516, 10 nm to recess the isolation dielectric the thickness of the second dielectric layer 514, and 20 nm for recessing the isolation dielectric below the upper surface of the first conductive layer 512.

Referring to FIG. 10F, the photoresist 528 is removed (e.g., by ashing), followed by a surface clean operation, such as a piranha clean including sulfuric acid and hydrogen peroxide. The sacrificial layer 516 is then removed from the cell area, while layer 526 protects the peripheral circuitry area. Wet etches can be used to remove the sacrificial layer 516 (e.g., hot phosphorous) and dielectric layer 514 (e.g., hydrofluoric acid).

Reactive ion etching is then performed to remove the first conductive layer 512 from the cell area as shown in FIG. 10G. An oxide etch is also applied to remove the protective layer 526 from the peripheral circuitry area and recess the isolation dielectric to a thickness of about 13 nm above the substrate surface (7 nm removal). The protective layer and isolation dielectric may be etched before or after removing the first conductive layer. A pre-clean is then applied, removing any remaining portions of first dielectric layer 510 as shown in FIG. 10H. The pre-clean operation may further remove some of the isolation dielectric. For example, the isolation dielectric may extend 5 nm-10 nm above the substrate surface following the pre-clean operation.

Turning to FIG. 10I, the memory array area 502 is depicted in more detail, illustrating a cell region 503 and select gate region 505 of the memory array. The select gate region is depicted in a cross-sectional view along a line in the word line or y-axis direction. A second dielectric layer 530 is grown as shown in FIG. 10I. The second dielectric layer covers the surface of the substrate between portions of the isolation dielectric 524 at the cell region. At the peripheral circuitry area, the second dielectric layer is grown over the sacrificial layer 516. The second dielectric layer is an oxide, formed with a thickness of 5 nm-8 nm in one example. At the cell region 503, the second dielectric layer 530 will form the tunnel dielectric layer.

A nanostructure layer 532 is formed over the substrate at the memory array and peripheral circuitry areas as shown in FIG. 10J. The nanostructure layer is applied using a self-assembly process in one embodiment as described in FIGS. 6A-6S. At the cell region, the self-assembly process enables the nanostructures to self-align between adjacent portions of isolation dielectric 524 that extend above the substrate surface and the upper surface if dielectric layer 530. In a self-assembly process, the nanostructures are initially formed over all horizontal surfaces. The nanostructures then naturally flow to lower levels. This removes the nanostructures from positions above the isolation dielectric 524. This naturally self-aligns the nanostructure layer between adjacent isolation dielectrics. The nanostructure layer overlies the second dielectric layer at the select gate area 505 and overlies the second dielectric layer 530 and isolation dielectric regions 524 at the peripheral circuitry area.

A third dielectric layer 534, barrier metal layer 536 and second conductive layer 538 are then applied over the substrate as shown in FIG. 10K. In one example, the third dielectric layer 534 is a layer of oxide deposited with a thickness of about 10 nm-15 nm. The third dielectric layer may include multiple layers such as oxides, nitrides and high-K materials. The third dielectric layer forms the intermediate or tunneling dielectric layer at the cell region. The barrier metal layer 536 may include materials such as TiN, TaN, TiSiN or other suitable metals, and have a thickness of about 8-15 nm in one example. The second conductive layer is a layer of doped poly silicon deposited with a thickness of about 40 nm in one example. The second conductive layer can include conductors such as metals or semiconductors such as polysilicon.

A photo lithographic etch process is used to form strips of photoresist 540 as shown in FIG. 10L. The photoresist completely covers the memory cell area 503 and the peripheral circuitry area 506. At the select gate area 505, photoresist 540 includes strips elongated in the direction of the x-axis, with spacing in the direction of the y-axis, so that a target area for the select gates is open. Using photoresist 540 as a mask, reactive ion etching is performed to etch through the second conductive layer 538, barrier metal layer 536, third dielectric layer 534, nanostructure layer 532 and fourth dielectric layer 530 as shown in FIG. 10M.

Turning to FIG. 10N, the photoresist is removed, followed by a gate oxidation preclean operation to prepare for a fourth dielectric layer to be formed at the select gate region 505. The fourth dielectric layer 542 is then formed, covering the substrate at the opened select gate area. The fourth dielectric layer is also formed over the second conductive layer at the cell area 503 and peripheral circuitry area 506. The fourth dielectric layer is a thermally grown oxide in one example, having a thickness of about 8 nm-10 nm. The fourth dielectric layer will form the gate dielectric at the select gate region.

A third conductive layer 544 and photoresist pattern 546 are then formed as shown in FIG. 10O. In one example, the third conductive layer is polysilicon with a thickness of about 40 nm. Layer 546 fills the open area created by etching at the select gate region, being separated from the surface of the substrate by the fourth dielectric layer. The photoresist pattern completely covers the cell region 503 and select gate region 505. The peripheral circuitry area is left exposed. The entire peripheral area is exposed, not just the target gate region. Etching (e.g., reactive ion) is then performed as shown in FIG. 10P. At the peripheral circuitry area, the third conductive layer 544, fourth dielectric layer 542, second conductive layer 538, barrier metal layer 536, third dielectric layer 534, nanostructure layer 532, second dielectric layer 530, sacrificial layer 516 and sacrificial dielectric layer 514 are etched and removed.

The photoresist is then removed, followed by a post-clean operation before forming a fourth conductive layer 548 as shown in FIG. 10Q. CMP or another suitable process is then used to remove the fourth dielectric layer at the cell region as shown in FIG. 10R. The process removes all of the fourth conductive layer from the select gate region and cell region and a portion of the fourth conductive layer at the peripheral circuitry area. CMP continues to also completely remove the third conductive layer and the fourth dielectric layer from the cell region. The continued CMP will remove a portion of the third conductive layer at the select gate region and additional portions of the fourth conductive layer at the peripheral circuitry area. Through the CMP process, a continuous conductive layer (layer 538) is established at the cell area. Thus, the control gates at the cell region will be formed from the second conductive layer 538. The gates of the select gates will be formed from the third conductive layer 544. The gates of the peripheral gate transistors will be formed from the fourth conductive layer 548 and the first conductive layer 512.

Referring to FIG. 10S, a series of steps for forming individual charge storage regions and defining a dimension of the select gate and peripheral transistors in the y-axis direction is depicted. The select gate area is depicted in the same cross-section as FIG. 10R. The cell area 503 and peripheral transistor area 506 are depicted in cross-sectional view in the y-axis direction as well now, taken along lines H-H and I-I of FIG. 10R, respectively.

One or more hard masking layers 550 are formed over the substrate, followed by a pattern 552. Pattern 552 may include strips of photoresist patterned with conventional photolithography techniques or spacers formed as earlier described in other embodiments. Other patterning and imprint technologies may be used. The pattern at the cell area is formed with a line size corresponding to the target charge storage region dimension in the y-axis direction. The pattern at the select gate area includes a line size corresponding to a target dimension of the select gates in the y-axis direction. The pattern at the peripheral circuitry area includes a line size corresponding to a target dimension or gate length of the peripheral gate transistors in the y-axis direction. Using the photoresist, the hard masking layer(s) is patterned, and the underlying etched as shown in FIG. 10T.

At the cell region 503, etching the second conductive layer 538 forms control gates CG1-CG7. Etching the nanostructure layer 532 forms individual charge storage regions CSR1-CSR7. At the select gate region 505, etching the third conductive layer 544 forms the gates for select gates SG1 and SG2. At the peripheral area 506, etching the fourth conductive layer 548 and the first conductive layer 512 forms the gate of peripheral transistor PG1.

Various backend processes can be performed to finalize fabrication of the array. For example, a passivation dielectric layer can be deposited, followed by forming metal conductive lines and vias to connect the lines with source and drain regions at the end of the memory cell strings, etc.

Figure 11:
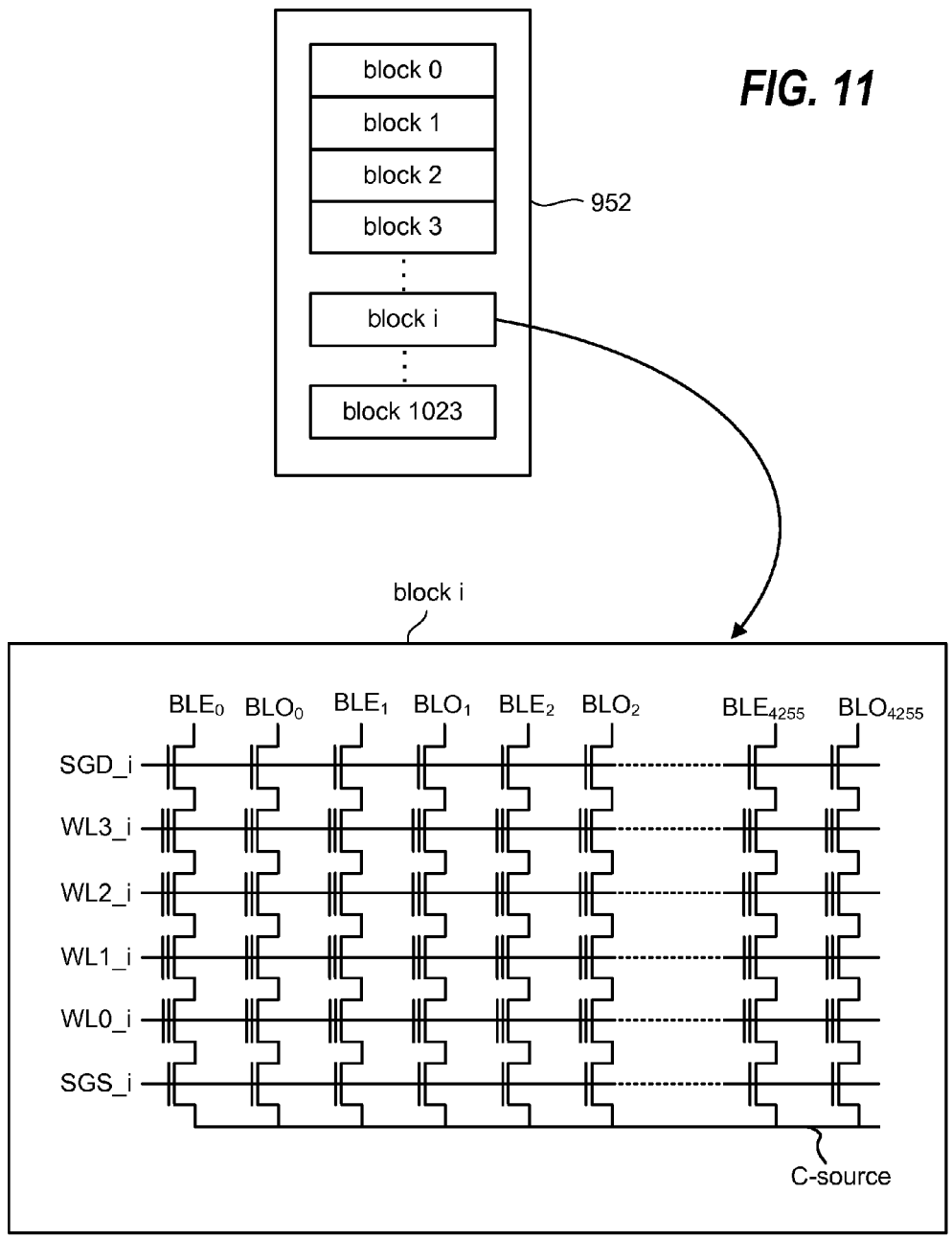
FIG. 11 depicts an example of the organization of a memory array in accordance with one embodiment.

FIG. 11 depicts an exemplary structure of a memory cell array 952 that can be fabricated using one or more embodiments of the disclosed technology. As one example, a NAND flash EEPROM is described that is partitioned into 1,024 blocks. The data stored in each block can be simultaneously erased. In one embodiment, the block is the minimum unit of cells that are simultaneously erased. In each block, in this example, there are 8,512 columns that are divided into even columns and odd columns. The bit lines are also divided into even bit lines (BLE) and odd bit lines (BLO). FIG. 11 shows four memory cells connected in series to form a NAND string. Although four cells are shown to be included in each NAND string, more or less than four can be used (e.g., 16, 32, or another number). One terminal of the NAND string is connected to a corresponding bit line via a first select transistor (also referred to as a select gate) SGD, and another terminal is connected to c-source via a second select transistor SGS.

During read and programming operations for memory cells of one embodiment, 4,256 memory cells are simultaneously selected. The memory cells selected have the same word line (e.g. WL2-$i$), and the same kind of bit line (e.g. even bit lines). Therefore, 532 bytes of data can be read or programmed simultaneously. These 532 bytes of data that are simultaneously read or programmed form a logical page. Therefore, in this example, one block can store at least eight pages. When each memory cell stores two bits of data (e.g. a multi-level cell), one block stores 16 pages. In another embodiment, a memory array is formed that utilizes an all bit-line architecture such that each bit line within a block is simultaneously selected, including those adjacent in the x-direction.

In other embodiments, the bit lines are not divided into odd and even bit lines. Such architectures are commonly referred to as all bit line architectures. In an all bit line architecture, all the bit lines of a block are simultaneously selected during read and program operations. Memory cells along a common word line and connected to any bit line are programmed at the same time. In other embodiments, the bit lines or block can be broken up into other groupings (e.g., left and right, more than two groupings, etc.).

Figure 12:
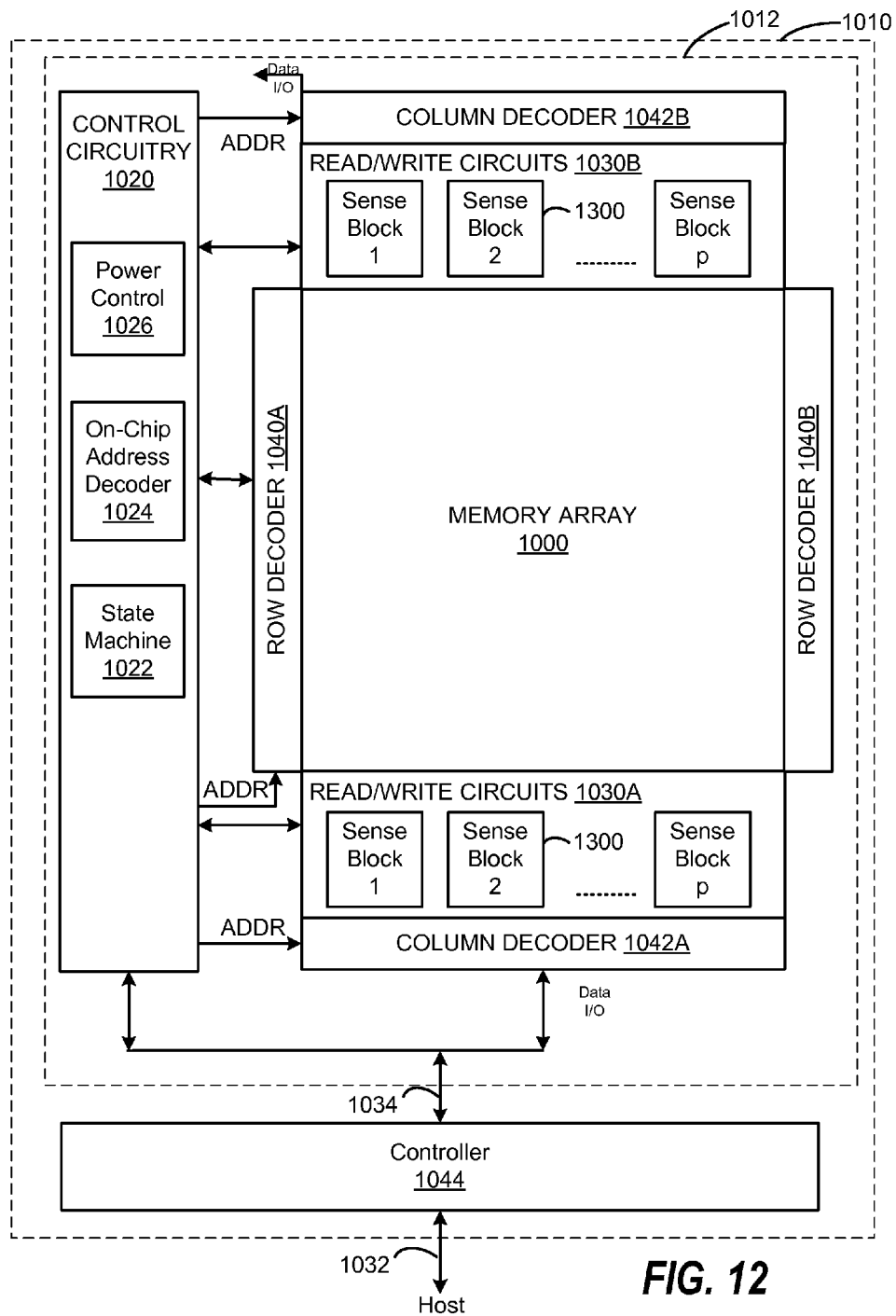
FIG. 12 is a block diagram depicting an example of a memory system that can be fabricated or used to implement embodiments of the disclosed technology.

FIG. 12 illustrates a non-volatile storage device 1010 that may include one or more memory die or chips 1012. Memory die 1012 includes an array (two-dimensional or three dimensional) of memory cells 1000, control circuitry 1020, and read/write circuits 1030A and 1030B. In one embodiment, access to the memory array 1000 by the various peripheral circuits is implemented in a symmetric fashion, on opposite sides of the array, so that the densities of access lines and circuitry on each side are reduced by half. The read/write circuits 1030A and 1030B include multiple sense blocks 1300 which allow a page of memory cells to be read or programmed in parallel. The memory array 1000 is addressable by word lines via row decoders 1040A and 1040B and by bit lines via column decoders 1042A and 1042B. In a typical embodiment, a controller 1044 is included in the same memory device 1010 (e.g., a removable storage card or package) as the one or more memory die 1012. Commands and data are transferred between the host and controller 1044 via lines 1032 and between the controller and the one or more memory die 1012 via lines 1034. One implementation can include multiple chips 1012.

Control circuitry 1020 cooperates with the read/write circuits 1030A and 1030B to perform memory operations on the memory array 1000. The control circuitry 1020 includes a state machine 1022, an on-chip address decoder 1024 and a power control module 1026. The state machine 1022 provides chip-level control of memory operations. The on-chip address decoder 1024 provides an address interface to convert between the address that is used by the host or a memory controller to the hardware address used by the decoders 1040A, 1040B, 1042A, and 1042B. The power control module 1026 controls the power and voltages supplied to the word lines and bit lines during memory operations. In one embodiment, power control module 1026 includes one or more charge pumps that can create voltages larger than the supply voltage.

In one embodiment, one or any combination of control circuitry 1020, power control circuit 1026, decoder circuit 1024, state machine circuit 1022, decoder circuit 1042A, decoder circuit 1042B, decoder circuit 1040A, decoder circuit 1040B, read/write circuits 1030A, read/write circuits 1030B, and/or controller 1044 can be referred to as one or more managing circuits.

Figure 13:
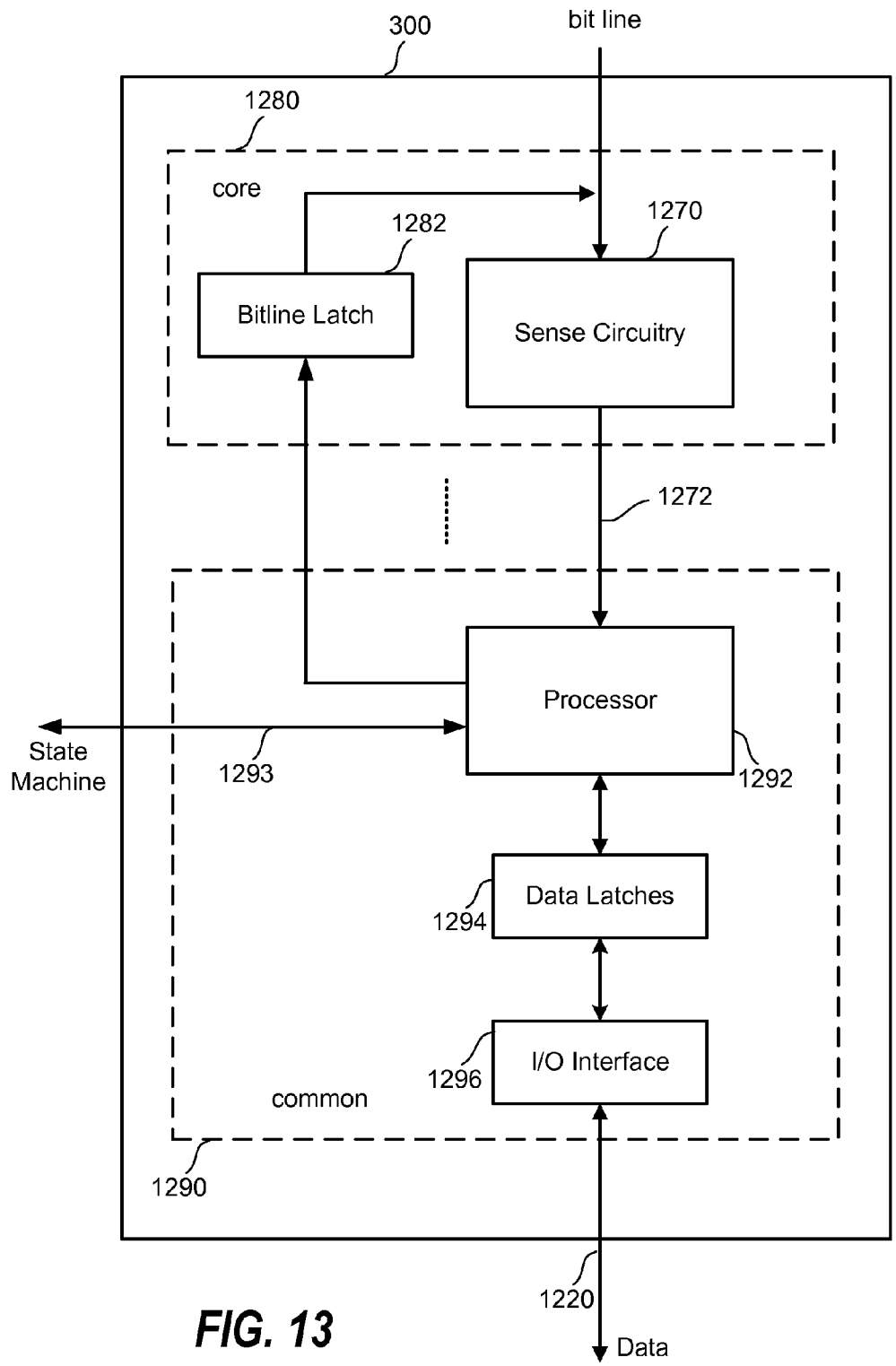
FIG. 13 is a block diagram depicting one embodiment of a sense block.

FIG. 13 is a block diagram of an individual sense block 1300 partitioned into a core portion, referred to as a sense module 1280, and a common portion 1290. In one embodiment, there will be a separate sense module 1280 for each bit line and one common portion 1290 for a set of multiple sense modules 1280. In one example, a sense block will include one common portion 1290 and eight sense modules 1280. Each of the sense modules in a group will communicate with the associated common portion via a data bus 1272. For further details, refer to U.S. Patent Application Publication 2006/0140007, which is incorporated herein by reference in its entirety.

Sense module 1280 comprises sense circuitry 1270 that determines whether a conduction current in a connected bit line is above or below a predetermined threshold level. In some embodiments, sense module 1280 includes a circuit commonly referred to as a sense amplifier. Sense module 1280 also includes a bit line latch 1282 that is used to set a voltage condition on the connected bit line. For example, a predetermined state latched in bit line latch 1282 will result in the connected bit line being pulled to a state designating program inhibit (e.g., Vdd).

Common portion 1290 comprises a processor 1292, a set of data latches 1294 and an I/O Interface 1296 coupled between the set of data latches 1294 and data bus 1220. Processor 1292 performs computations. For example, one of its functions is to determine the data stored in the sensed memory cell and store the determined data in the set of data latches. The set of data latches 1294 is used to store data bits determined by processor 1292 during a read operation. It is also used to store data bits imported from the data bus 1220 during a program operation. The imported data bits represent write data meant to be programmed into the memory. I/O interface 1296 provides an interface between data latches 1294 and the data bus 1220.

During read or sensing, the operation of the system is under the control of state machine 1022 that controls the supply of different control gate voltages to the addressed cell. As it steps through the various predefined control gate voltages corresponding to the various memory states supported by the memory, the sense module 1280 may trip at one of these voltages and an output will be provided from sense module 1280 to processor 1292 via bus 1272. At that point, processor 1292 determines the resultant memory state by consideration of the tripping event(s) of the sense module and the information about the applied control gate voltage from the state machine via input lines 1293. It then computes a binary encoding for the memory state and stores the resultant data bits into data latches 1294. In another embodiment of the core portion, bit line latch 1282 serves double duty, both as a latch for latching the output of the sense module 1280 and also as a bit line latch as described above.

It is anticipated that some implementations will include multiple processors 1292. In one embodiment, each processor 1292 will include an output line (not depicted in FIG. 12) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 1292 to accumulate the results of the associated bit lines such that the state machine need only read the wired-OR line one time.

During program or verify, the data to be programmed is stored in the set of data latches 1294 from the data bus 1220. The program operation, under the control of the state machine, comprises a series of programming voltage pulses (with increasing magnitudes) applied to the control gates of the addressed memory cells. Each programming pulse is followed by a verify process to determine if the memory cell has been programmed to the desired state. Processor 1292 monitors the verified memory state relative to the desired memory state. When the two are in agreement, processor 1292 sets the bit line latch 1282 so as to cause the bit line to be pulled to a state designating program inhibit. This inhibits the cell coupled to the bit line from further programming even if it is subjected to programming pulses on its control gate. In other embodiments the processor initially loads the bit line latch 1282 and the sense circuitry sets it to an inhibit value during the verify process.

Data latch stack 1294 contains a stack of data latches corresponding to the sense module. In one embodiment, there are 3-5 (or another number) data latches per sense module 1280. In one embodiment, the latches are each one bit. In some implementations (but not required), the data latches are implemented as a shift register so that the parallel data stored therein is converted to serial data for data bus 1220, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the read operations and sense amplifiers can be found in (1) U.S. Pat. No. 7,196,931, "Non-Volatile Memory And Method With Reduced Source Line Bias Errors,"; (2) U.S. Pat. No. 7,023,736, "Non-Volatile Memory And Method with Improved Sensing,"; (3) U.S. Patent Application Pub. No. 2005/0169082; (4) U.S. Pat. No. 7,196,928, "Compensating for Coupling During Read Operations of Non-Volatile Memory," and (5) United States Patent Application Pub. No. 2006/0158947, "Reference Sense Amplifier For Non-Volatile Memory," published on Jul. 20, 2006. All five of the immediately above-listed patent documents are incorporated herein by reference in their entirety.

There has therefore been described one embodiment which includes a method of fabricating non-volatile memory that includes forming a plurality of isolation trenches in a substrate. The isolation trenches are elongated in a first direction (e.g., column) with a spacing between isolation trenches adjacent in a second direction (e.g., row) perpendicular to the first direction. The isolation trenches are filled with an isolation material. The isolation material in each trench includes a portion extending above a surface of the substrate. The method further includes forming a tunnel dielectric layer over a surface of the substrate, self-aligning a nanostructure coating over a surface of the substrate between adjacent portions of the isolation material extending from each isolation trench, forming an intermediate dielectric layer over the nanostructure coating, forming a control gate layer over the intermediate dielectric layer, forming a pattern including a plurality of strips elongated in the second direction with spacing therebetween in the first direction. Etching is then performed including etching the control gate layer, the intermediate dielectric layer, and the nanostructure coating according to the pattern. Etching the control gate layer forms a plurality of word lines elongated in the second direction and etching the nanostructure coating forms a plurality of columns of charge storage regions.

One embodiment includes a method of fabricating non-volatile memory using a substrate having a targeted memory array area and a targeted peripheral area. The method includes forming a tunnel dielectric layer over a surface of the substrate at the memory array area. The memory array area including a cell region and a select gate region. The method further includes forming a nanostructure coating over the substrate where the nanostructure coating at the memory array area is self-aligned over the tunnel dielectric layer between adjacent protrusions of an isolation material extending from a plurality of isolation trenches. The isolation trenches and isolation material extend in a column direction. The method further includes removing the nanostructure coating from the select gate region and the peripheral area, forming an intermediate dielectric layer over the nanostructure coating at the cell region, and forming at least one conductive layer at the memory array area and the peripheral area. The at least one conductive layer includes a plurality of word lines elongated in a row direction. The method further includes etching the nanostructure coating to form a plurality of columns of charge storage regions.

One embodiment includes a method of fabricating non-volatile memory with nanostructure charge storage regions that includes forming a tunnel dielectric layer over a memory array area of a substrate, forming a nanostructure coating over the tunnel dielectric layer at the memory array area, removing the nanostructure coating from a select gate region of the memory array area by selectively curing the nanostructure coating at a cell region of the memory array area, forming an intermediate dielectric layer over the nanostructure coating at the memory array area, forming a conductive layer over the intermediate dielectric layer, etching the conductive layer to form a plurality of word lines at the cell region, etching the conductive layer to form a plurality of select gates at the select gate region, and etching the nanostructure coating to form a plurality of charge storage regions underlying each word line at the cell region.

One embodiment includes a method of forming non-volatile storage including nanostructure charge storage regions that includes forming at least one peripheral transistor including a gate structure formed from a first conductive layer and a second conductive layer separated from a substrate by a first dielectric layer. The method further includes forming a plurality of storage elements including charge storage structures formed from a nanostructure layer separated from the substrate by a second dielectric layer. The charge storage structures have control gates formed from the second conductive layer and the second conductive layer is separated from the nanostructure layer by a third dielectric layer. The method further includes forming at least one select gate transistor for the plurality of storage elements including a gate structure formed from the second conductive layer.

One embodiment includes a method of fabricating non-volatile memory with nanostructure charge storage regions that includes forming a first dielectric layer and a first conductive layer over a substrate at a peripheral area, etching at the memory array area to form a plurality of active areas in the substrate that are separated by isolation trenches and etching the first conductive layer and the first dielectric layer at the peripheral area to form a first dimension for a plurality of peripheral transistors, growing a second dielectric layer over the active areas at the memory array area, forming a nanostructure coating at the memory array area and the peripheral area, removing the nanostructure coating from a select gate region of the memory array area by selectively curing the nanostructure coating at a cell region of the memory array area, forming a third dielectric layer at the memory array area and the peripheral area, etching to remove the third dielectric layer and nanostructure coating at the peripheral area, etching to remove the third dielectric layer at the select gate region, forming a second conductive layer at the memory array area and the peripheral area, etching the second conductive layer to form a plurality of word lines and a plurality of select gates at the memory array area, and etching the nanostructure coating at the cell region to form a plurality of charge storage regions underlying each word line.

One embodiment includes a method of forming non-volatile storage including nanostructure charge storage regions that includes forming at least one peripheral transistor including a gate structure formed from a first conductive layer and a second conductive layer separated from a substrate by a first dielectric layer. The method further includes forming a plurality of storage elements including charge storage structures formed from a nanostructure layer separated from the substrate by a second dielectric layer. The charge storage structures have control gates formed from the second conductive layer which is separated from the nanostructure layer by a third dielectric layer. The method further includes forming at least one select gate transistor for the plurality of storage elements including a gate structure formed from the first conductive layer and the second conductive layer. The first conductive layer is separated from the substrate by the first dielectric layer.

One embodiment includes a method of fabricating non-volatile memory with nanostructure charge storage regions that includes forming a first dielectric layer over a substrate at a memory array area and a peripheral area, forming a plurality of active areas in the substrate at the memory array area where the active areas are separated by isolation trenches, forming a first conductive layer over the first dielectric layer at the memory array area and the peripheral area after forming the plurality of active areas, and etching to remove the first dielectric layer and the first conductive layer at a cell region of the memory array area, to form a plurality of gates from the first conductive layer at a select gate region of the memory array area, and to form a plurality of gates from the first conductive layer at the peripheral area. The method further includes forming a second dielectric layer at the cell area and the peripheral area after etching, forming a nanostructure layer at the memory array area and the peripheral area, etching to remove the nanostructure layer at a portion of the select gate region and a portion of the peripheral area, forming a second conductive layer at the memory array area and the peripheral area, etching at the cell region to define from the second conductive layer a plurality of word lines and to define from the nanostructure layer a plurality of charge storage regions, etching at the select region to define at least one select gate line from the second conductive layer, and etching at the peripheral area to define at least one peripheral select line from the second conductive layer.

One embodiment includes a method of forming non-volatile storage including nanostructure charge storage regions that includes forming at least one peripheral transistor including a gate structure formed from a first conductive layer and a fourth conductive layer where the first conductive layer being separated from a substrate by a first dielectric layer. The method further includes forming a plurality of storage elements including charge storage structures formed from a nanostructure layer separated from the substrate by a second dielectric layer. The charge storage structures have control gates formed from a second conductive layer separated from the nanostructure layer by a third dielectric layer. The method further includes forming at least one select gate for the plurality of storage elements including a gate structure formed from the third conductive layer. The third conductive layer is separated from the substrate by a fourth dielectric layer.

One embodiment includes a method of fabricating non-volatile memory with nanostructure charge storage regions that includes forming a first dielectric layer and a first conductive layer over a substrate at a memory array area and a peripheral area, etching the substrate to form a plurality of active areas separated by isolation regions at the memory array area after forming the first dielectric layer and the first conductive layer, etching the first conductive layer to form a width for a gate of a plurality of transistors at the peripheral area, removing the first dielectric layer and the first conductive layer at the memory array area after forming the plurality of active areas and the width for the gate of the plurality of transistors, forming a second dielectric layer over the active areas of the substrate after removing the first dielectric layer and the first conductive layer, forming, at the memory array area and the peripheral area, a nanostructure coating, a third dielectric layer over the nanostructure coating and a second conductive layer over the third dielectric layer, etching to remove the second conductive layer, the third dielectric layer, the nanostructure layer and the second dielectric layer at a select gate region of the memory array area, forming at the memory array area and the peripheral area, a fourth dielectric layer and a third conductive layer over the fourth dielectric layer, etching to remove the third conductive layer, the fourth dielectric layer, the second conductive layer, the third dielectric layer, the nanostructure layer, and the second dielectric layer at the peripheral area, thereby exposing the first conductive layer at the peripheral area, forming a fourth conductive layer at the memory array area and the peripheral area after exposing the first conductive layer at the peripheral area, etching until the second conductive layer is exposed at the cell region, thereby removing the fourth dielectric layer from the cell region, etching the fourth conductive layer and the first conductive layer at the peripheral area to define a length for the gate of the plurality of transistors, etching the third conductive layer at the select gate region to define a length for a gate of a plurality of select gates, and etching the second conductive layer and the nanostructure layer at the cell area. Etching the second conductive layer forms a plurality of word lines and etching the nanostructure layer forms a plurality of charge storage regions.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of fabricating non-volatile memory, comprising:
   forming a plurality of isolation trenches in a substrate, the isolation trenches elongated in a first direction with a spacing between isolation trenches adjacent in a second direction perpendicular to the first direction, the isolation trenches being filled with an isolation material, the isolation material in each trench including a portion extending above a surface of the substrate;
   forming a tunnel dielectric layer over a surface of the substrate;
   self-aligning a nanostructure coating over the tunnel dielectric layer between adjacent portions of the isolation material extending from each isolation trench;
   forming an intermediate dielectric layer over the nanostructure coating;
   forming a control gate layer over the intermediate dielectric layer;
   forming a pattern including a plurality of strips elongated in the second direction with spacing therebetween in the first direction; and
   etching the control gate layer, the intermediate dielectric layer, and the nanostructure coating according to the pattern, wherein etching the control gate layer forms a plurality of word lines elongated in the second direction and etching the nanostructure coating forms a plurality of columns of charge storage regions.

2. A method according to claim 1, wherein:
   forming the tunnel dielectric layer is performed prior to forming the plurality of isolation trenches in the substrate;
   forming the plurality of isolation trenches defines active areas in the substrate between isolation trenches adjacent in the second direction; and
   forming the plurality of isolation trenches includes etching the tunnel dielectric layer into strips elongated in the first direction and self-aligned over the active areas of the substrate between adjacent isolation trenches.

3. A method according to claim 1, wherein:
   forming the tunnel dielectric layer is performed after forming the plurality of isolation trenches.

4. A method according to claim 1, wherein:
   self-aligning the nanostructure coating between adjacent isolation trenches does not include etching the nanostructure coating.

5. A method according to claim 1, wherein:
   the isolation material extending from each isolation trench above the surface of the substrate creates a protrusion;
   the nanostructure coating includes a plurality of nanostructures;
   an upper surface of the isolating material is a greater distance above the surface of the substrate than an upper surface of the tunnel dielectric layer; and
   self-aligning the nanostructure coating includes depositing the nanostructure coating in a self-assembly process to coat the surface of the substrate such that upon deposition the plurality of nanostructures overlie the isolation material and the tunnel dielectric layer between adjacent isolation trenches, wherein a majority of the nanostructures overlying the isolation material move to positions overlying the tunnel dielectric layer after deposition, thus forming a plurality of nanostructure lines aligned between adjacent protrusions of the isolation material.

6. A method according to claim 1, further comprising:
forming a coupling layer over the tunnel dielectric layer.

7. A method according to claim 1, wherein the nanostructure coating is formed at a cell area of the substrate and a select gate area of the substrate, the method further comprising:
covering the select gate area of the substrate after forming the nanostructure coating;
light curing the nanostructure coating at the cell area while the select gate area is covered;
uncovering the select gate area after light curing; and
rinsing the nanostructure coating from the select gate area after uncovering the select gate area.

8. A method according to claim 1, wherein the nanostructure coating is formed at a memory array area of the substrate and a peripheral area of the substrate, the method further comprising:
covering at least a portion of the memory array area after forming the intermediate dielectric layer; and
etching to remove the intermediate dielectric layer and the nanostructure coating from a target area of the substrate for a gate of a transistor in the peripheral area.

9. A method according to claim 8, wherein the memory array area of the substrate includes a cell region and a select gate region, the method further comprising:
etching to remove the intermediate dielectric layer and the nanostructure coating from a target area of the substrate for a gate of a select gate in the select gate region.

10. A method according to claim 9, wherein:
etching to remove the intermediate dielectric layer and the nanostructure coating at the select gate region is performed simultaneously while etching to remove the intermediate dielectric layer and the nanostructure coating at the peripheral area.

11. A method according to claim 9, further comprising:
forming a first pattern exposing the target area for the gate of the select gate and covering the target area for the gate of the transistor in the peripheral area, wherein etching to remove the intermediate dielectric layer and the nanostructure coating at the select gate region is performed using the first pattern;
subsequent to etching to remove the intermediate dielectric layer and the nanostructure coating at the select gate region, forming a second pattern exposing the target area for the gate of the transistor in the peripheral area and covering the target area for the gate of the select gate; and
wherein etching to remove the intermediate dielectric layer and the nanostructure coating at the peripheral area is performed using the second pattern.

12. A method according to claim 1, wherein the nanostructure coating includes metallic nanodots.

13. A method according to claim 12, wherein:
the portion of the isolation material in each trench extends above the substrate by a first amount; and
a combined thickness of the nanodots and the tunnel dielectric layer is less than the first amount.

14. A method according to claim 1, wherein the nanostructure coating includes silicon nanodots.

15. A method according to claim 14, wherein the silicon nanodots include a nitride coating.

16. A method of fabricating non-volatile memory using a substrate having a targeted memory array area and a targeted peripheral area, the method comprising:
forming a tunnel dielectric layer over a surface of the substrate at the memory array area, the memory array area including a cell region and a select gate region;
forming a nanostructure coating over the substrate, wherein forming the nanostructure coating at the memory array area includes self-aligning the nanostructure coating over the tunnel dielectric layer between adjacent protrusions of an isolation material extending from a plurality of isolation trenches, the isolation trenches and isolation material extending in a column direction;
removing the nanostructure coating from the select gate region and the peripheral area;
forming an intermediate dielectric layer over the nanostructure coating at the cell region;
forming at least one conductive layer at the memory array area and the peripheral area, the at least one conductive layer including a plurality of word lines elongated in a row direction; and
etching the nanostructure coating to form a plurality of columns of charge storage regions.

17. A method according to claim 16, further comprising:
forming the plurality of isolation trenches in the substrate;
wherein forming the tunnel dielectric layer is performed after forming the plurality of isolation trenches.

18. A method according to claim 16, wherein removing the nanostructure coating from the select gate region includes:
covering the select gate region;
curing the nanostructure coating at the cell region while the select gate region is covered;
uncovering the select gate region after curing; and
rinsing the nanostructure coating from the select gate region.

19. A method according to claim 16, wherein removing the nanostructure coating from the select gate region includes:
covering the cell region with a first pattern; and
etching to remove the nanostructure coating from the select gate region while the cell region is covered with the first pattern.

20. A method according to claim 19, wherein etching to remove the nanostructure coating from the select gate region includes etching to remove the nanostructure coating from the peripheral area while the cell region is covered with the first pattern.

21. A method according to claim 19, further comprising:
removing the first pattern from the cell region after etching to remove the nanostructure coating from the select gate region;
covering the cell region and the select gate region with a second pattern; and
etching to remove the nanostructure coating from the peripheral area while the cell region and the select gate region are covered with the second pattern.

22. A method according to claim 16, wherein the at least one conductive layer includes a first conductive layer and a second conductive layer, the method further comprising:
forming a first dielectric layer and the first conductive layer at the memory array area and the peripheral area prior to forming the tunnel dielectric layer;
removing the first dielectric layer and the first conductive layer from the memory array area prior to forming the plurality of isolation trenches;
etching the first conductive layer at the peripheral area to define a gate width for a plurality of peripheral transistors;
forming the second conductive layer after forming the intermediate dielectric layer;

etching the second conductive layer at the cell region to form the plurality of word lines;

etching the second conductive layer at the select gate region to form a plurality of select gates; and etching the second conductive layer and the first conductive layer at the peripheral area to define to a gate length for the plurality of peripheral transistors, the second conductive layer contacting the first conductive layer at the peripheral area, the first conductive layer being separated from the substrate surface by the first dielectric layer.

23. A method according to claim 22, wherein forming the intermediate dielectric layer includes forming the intermediate dielectric layer at the select gate region, the method further comprising;

removing the intermediate dielectric layer from the select gate region; and forming a third dielectric layer over the substrate at the select gate region, the second conductive layer being separated from the surface of the substrate by the third dielectric layer at the select gate region.

24. A method according to claim 22, wherein:

the second conductive layer is separated from the surface of the substrate by the tunnel dielectric layer at the select gate region.

25. A method according to claim 16, wherein the at least one conductive layer includes a first conductive layer and a second conductive layer, the method further comprising;

forming a first dielectric layer over the surface of the substrate at the memory array area and the peripheral area;

forming the first conductive layer over the memory array area and the peripheral area after forming the plurality of isolation trenches;

etching to remove the first dielectric layer and the first conductive layer from the cell region prior to forming the intermediate dielectric layer;

forming the second conductive layer after forming the intermediate dielectric layer;

etching the second conductive layer at the cell region to form the plurality of word lines;

etching the second conductive layer and the first conductive layer at the select gate region to define gates for a plurality of select gates, the second conductive layer contacting the first conductive layer at the select gate region, the first conductive layer being separated from the surface of the substrate by the first dielectric layer; and etching the second conductive layer and the first conductive layer at the peripheral area to define gates for the plurality of peripheral transistors, the second conductive layer contacting the first conductive layer at the peripheral area, the first conductive layer being separated from the substrate surface by the first dielectric layer.

26. A method according to claim 16, wherein the at least one conductive layer includes a first conductive layer, a second conductive layer, a third conductive layer and a fourth conductive layer, the method further comprising:

forming the first conductive layer and a first dielectric layer at the memory array area and the peripheral area prior to forming the plurality of isolation trenches;

removing the first conductive layer and the first dielectric layer from the memory array area after forming the plurality of isolation trenches and prior to forming the tunnel dielectric layer;

forming a second dielectric layer over the surface of the substrate after removing the nanostructure coating from the select gate region;

forming a third conductive layer after forming the second dielectric layer;

forming a fourth conductive layer after removing the nanostructure coating from the peripheral area;

etching the second conductive layer at the cell region to form the plurality of word lines;

etching the fourth conductive layer and the first conductive layer at the peripheral area to form gates for a plurality of peripheral transistors, the peripheral transistors separated from the surface of the substrate by the first dielectric layer; and etching the third conductive layer at the select gate region to form gates for a plurality of select gates, the select gates separated from the surface of the substrate by the second dielectric layer.

27. A method of fabricating non-volatile memory with nanostructure charge storage regions, comprising:

forming a tunnel dielectric layer over a memory array area of a substrate;

forming a nanostructure coating over the tunnel dielectric layer at the memory array area;

removing the nanostructure coating from a select gate region of the memory array area by selectively curing the nanostructure coating at a cell region of the memory array area;

forming an intermediate dielectric layer over the nanostructure coating at the memory array area;

forming a conductive layer over the intermediate dielectric layer;

etching the conductive layer to form a plurality of word lines at the cell region;

etching the conductive layer to form a plurality of select gates at the select gate region; and etching the nanostructure coating to form a plurality of charge storage regions underlying each word line at the cell region.

28. A method according to claim 27, wherein:

forming the nanostructure coating over the tunnel dielectric layer at the memory array area further includes forming the nanostructure coating at a peripheral area of the substrate; and the method further comprises etching to remove the nanostructure coating from the peripheral area of the substrate.

29. A method according to claim 28, further comprising:

forming a first dielectric layer and a first conductive layer at the peripheral area prior to forming the tunnel dielectric layer; and etching at the memory array area to form a plurality of active areas in the substrate that are separated by isolation trenches and etching the first conductive layer and the first dielectric layer at the peripheral area to form a first dimension for a plurality of peripheral transistors, the isolation trenches being filled with an isolation material, the isolation material in each trench including a portion extending above a surface of the substrate;

wherein forming the nanostructure coating includes self-aligning the nanostructure coating over a surface of the substrate between adjacent portions of the isolation material extending from each isolation trench.

30. A method of forming non-volatile storage including nanostructure charge storage regions, comprising:

forming at least one peripheral transistor including a gate structure formed from a first conductive layer and a second conductive layer separated from a substrate by a first dielectric layer;

forming a plurality of storage elements including charge storage structures formed from a nanostructure layer separated from the substrate by a second dielectric layer, the charge storage structures having control gates formed from the second conductive layer, the second conductive layer being separated from the nanostructure layer by a third dielectric layer; and forming at least one select gate transistor for the plurality of storage elements including a gate structure formed from the second conductive layer.

31. A method according to claim 30, wherein the gate structure of the at least one select gate transistor is separated from the substrate by the second dielectric layer.

32. A method according to claim 30, wherein the gate structure of the at least one select gate transistor is separated from the substrate by a fourth dielectric layer.

33. A method according to claim 30, further comprising:
forming the first dielectric layer at a peripheral area of the substrate and a memory array area of the substrate, the memory array area including a select gate region;
removing the first dielectric layer from the memory array area while leaving the first dielectric layer at the peripheral area; and
etching the substrate at the memory array area after removing the first dielectric layer to form a plurality of active areas with a plurality of shallow trench isolation regions therebetween.

34. A method according to claim 33, further comprising:
forming the second dielectric layer at the memory array area after forming the plurality of active areas and the plurality of shallow trench isolation regions;
forming the nanostructure layer at the memory array area and the peripheral area after forming the second dielectric layer;
curing the nanostructure layer at a cell region of the memory array area; and
removing the nanostructure layer from the select gate region of the memory array area.

35. A method according to claim 34, wherein curing the nanostructure layer at the cell region includes exposing the nanostructure layer at the cell region to ultraviolet light while not exposing the nanostructure layer at the select gate region to ultraviolet light.

36. A method according to claim 33, further comprising:
forming the first conductive layer at the memory array area and the peripheral area after forming the first dielectric layer and before the etching of the substrate;
removing the first conductive layer from the memory array area prior to removing the first dielectric layer from the memory array area; and
etching the first conductive layer and the first dielectric layer at the peripheral area as part of etching the substrate at the memory array area, wherein etching the first conductive layer defines a first dimension of the peripheral transistor gate structure extending in a word line direction.

37. A method of fabricating non-volatile memory with nanostructure charge storage regions, comprising:
forming a first dielectric layer and a first conductive layer over a substrate at a peripheral area;
etching at a memory array area of the substrate to form a plurality of active areas in the substrate that are separated by isolation trenches and etching the first conductive layer and the first dielectric layer at the peripheral area to form a first dimension for a plurality of peripheral transistors;
growing a second dielectric layer over the active areas at the memory array area;
forming a nanostructure coating at the memory array area and the peripheral area;
removing the nanostructure coating from a select gate region of the memory array area by selectively curing the nanostructure coating at a cell region of the memory array area;
forming a third dielectric layer at the memory array area and the peripheral area;
etching to remove the third dielectric layer and nanostructure coating at the peripheral area;
etching to remove the third dielectric layer at the select gate region;
forming a second conductive layer at the memory array area and the peripheral area;
etching the second conductive layer to form a plurality of word lines and a plurality of select gates at the memory array area; and
etching the nanostructure coating at the cell region to form a plurality of charge storage regions underlying each word line.

38. A method according to claim 37, wherein:
etching at the memory array area to form a plurality of active areas and etching the first conductive layer and the first dielectric layer at the peripheral area are performed in a first direction;
etching to remove the third dielectric layer and nanostructure coating at the peripheral area and etching to remove the third dielectric layer at the select gate region of the memory array area are performed in the first direction; and
etching the second conductive layer to form a plurality of word lines and a plurality of select gate lines at the memory array area and etching the nanostructure coating at the cell region to form a plurality of charge storage regions underlying each word line are performed in a second direction, the second direction is orthogonal to the first direction.

39. A method according to claim 37, further comprising:
removing the first dielectric layer and the first conductive layer at the memory array area prior to etching at the memory array area to form the plurality of active areas.

40. A method of forming non-volatile storage including nanostructure charge storage regions, comprising:
forming at least one peripheral transistor including a gate structure formed from a first conductive layer and a second conductive layer separated from a substrate by a first dielectric layer;
forming a plurality of storage elements including charge storage structures formed from a nanostructure layer separated from the substrate by a second dielectric layer, the charge storage structures having control gates formed from the second conductive layer separated from the nanostructure layer by a third dielectric layer; and
forming at least one select gate transistor for the plurality of storage elements including a gate structure formed from the first conductive layer and the second conductive layer, the first conductive layer being separated from the substrate by the first dielectric layer.

41. A method according to claim 40, further comprising:
forming the first dielectric layer at a memory array area and a peripheral circuitry area of the substrate;
etching the substrate at the memory array area to form a plurality of active areas with a plurality of shallow trench isolation regions therebetween; and forming the first conductive layer over the first dielectric layer at the memory array area and the select gate region after the etching of the substrate;

after forming the first conductive layer:
etching to remove the first conductive layer and the first dielectric layer at a cell region of the memory array area, etching the first conductive layer and the first dielectric layer at a select gate region of the memory array area to define a dimension of the select gate transistor gate structure extending in a bit line direction, etching the first conductive layer and the first dielectric layer at the peripheral area to define a dimension of the peripheral transistor gate structure extending in the bit line direction.

42. A method of fabricating non-volatile memory with nanostructure charge storage regions, comprising:
forming a first dielectric layer over a substrate at a memory array area and a peripheral area;
forming a plurality of active areas in the substrate at the memory array area, the active areas being separated by isolation trenches;
forming a first conductive layer over the first dielectric layer at the memory array area and the peripheral area after forming the plurality of active areas;
etching to remove the first dielectric layer and the first conductive layer at a cell region of the memory array area, to form a plurality of gates from the first conductive layer at a select gate region of the memory array area, and to form a plurality of gates from the first conductive layer at the peripheral area;
forming a second dielectric layer at the cell region and the peripheral area after etching;
forming a nanostructure layer at the memory array area and the peripheral area;
etching to remove the nanostructure layer at a portion of the select gate region and a portion of the peripheral area;
forming a second conductive layer at the memory array area and the peripheral area;
etching at the cell region to define from the second conductive layer a plurality of word lines and to define from the nanostructure layer a plurality of charge storage regions;
etching at the select region to define at least one select gate line from the second conductive layer; and
etching at the peripheral area to define at least one peripheral select line from the second conductive layer.

43. A method according to claim 42, wherein:
the gates at the select gate region include two vertical sidewalls;
the method further comprising, prior to forming the second dielectric layer, forming sidewall spacers along the two vertical sidewalls of the gates at the select gate region.

44. A method according to claim 42, wherein:
the plurality of active areas are formed before forming the first dielectric layer.

45. A method of forming non-volatile storage including nanostructure charge storage regions, comprising:
forming at least one peripheral transistor including a gate structure formed from a first conductive layer and a fourth conductive layer, the first conductive layer being separated from a substrate by a first dielectric layer;
forming a plurality of storage elements including charge storage structures formed from a nanostructure layer separated from the substrate by a second dielectric layer, the charge storage structures having control gates formed from a second conductive layer separated from the nanostructure layer by a third dielectric layer; and
forming at least one select gate for the plurality of storage elements including a gate structure formed from a third conductive layer, the third conductive layer being separated from the substrate by a fourth dielectric layer.

46. A method according to claim 45, wherein:
the first conductive layer and the fourth conductive layer are in direct contact.

47. A method of fabricating non-volatile memory with nanostructure charge storage regions, comprising:
forming a first dielectric layer and a first conductive layer over a substrate at a memory array area and a peripheral area;
etching the substrate to form a plurality of active areas separated by isolation regions at the memory array area after forming the first dielectric layer and the first conductive layer;
etching the first conductive layer to form a width for a gate of a plurality of transistors at the peripheral area;
removing the first dielectric layer and the first conductive layer at the memory array area after forming the plurality of active areas and the width for the gate of the plurality of transistors;
forming a second dielectric layer over the active areas of the substrate after removing the first dielectric layer and the first conductive layer;
forming, at the memory array area and the peripheral area, a nanostructure coating, a third dielectric layer over the nanostructure coating and a second conductive layer over the third dielectric layer;
etching to remove the second conductive layer, the third dielectric layer, the nanostructure coating and the second dielectric layer at a select gate region of the memory array area;
forming at the memory array area and the peripheral area, a fourth dielectric layer and a third conductive layer over the fourth dielectric layer;
etching to remove the third conductive layer, the fourth dielectric layer, the second conductive layer, the third dielectric layer, the nanostructure, and the second dielectric layer at the peripheral area, thereby exposing the first conductive layer at the peripheral area;
forming a fourth conductive layer at the memory array area and the peripheral area after exposing the first conductive layer at the peripheral area;
etching until the second conductive layer is exposed at the cell region, thereby removing the fourth dielectric layer from the cell region;
etching the fourth conductive layer and the first conductive layer at the peripheral area to define a length for the gate of the plurality of transistors;
etching the third conductive layer at the select gate region to define a length for a gate of a plurality of select gates; and
etching the second conductive layer and the nanostructure coating at the cell area, wherein etching the second conductive layer forms a plurality of word lines and etching the nanostructure coating forms a plurality of charge storage regions.

* * * * *